United States Patent
Kimura et al.

(10) Patent No.: US 9,753,323 B2
(45) Date of Patent: Sep. 5, 2017

(54) COLOR FILTER SUBSTRATE, LIQUID CRYSTAL DISPLAY DEVICE, AND METHOD FOR MANUFACTURING COLOR FILTER SUBSTRATE

(71) Applicant: Toppan Printing Co., Ltd., Taito-ku (JP)

(72) Inventors: Yukihiro Kimura, Taito-ku (JP); Kenzo Fukuyoshi, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 9 days.

(21) Appl. No.: 14/808,232

(22) Filed: Jul. 24, 2015

(65) Prior Publication Data
US 2015/0331279 A1    Nov. 19, 2015

Related U.S. Application Data

(63) Continuation of application No. PCT/JP2013/074536, filed on Sep. 11, 2013.

(30) Foreign Application Priority Data

Jan. 25, 2013    (JP) .................................. 2013-012006

(51) Int. Cl.
*G02F 1/1335*    (2006.01)
*G02B 5/20*    (2006.01)
(Continued)

(52) U.S. Cl.
CPC ....... *G02F 1/133514* (2013.01); *G02B 5/201* (2013.01); *G02F 1/1336* (2013.01);
(Continued)

(58) Field of Classification Search
None
See application file for complete search history.

(56) References Cited

U.S. PATENT DOCUMENTS 5,368,991 A * 11/1994 Uchikawa ............. G03F 7/0007
349/106
6,100,987 A    8/2000 Kawakubo
(Continued)

FOREIGN PATENT DOCUMENTS

JP    4010564 B    1/1992
JP    4-62503 A    2/1992
(Continued)

OTHER PUBLICATIONS

Extended European Search Report issued Jan. 5, 2017 in Patent Application No. 13872461.2.
(Continued)

*Primary Examiner* — Ryan Crockett
(74) *Attorney, Agent, or Firm* — Oblon, McClelland, Maier & Neustadt, L.L.P.

(57) ABSTRACT

A color filter substrate includes a transparent substrate having an effective display region and a frame region enclosing the effective display region, color filters including a first color filter, a second color filter and a third color filter having different colors, the color filters being formed in linear patterns on the transparent substrate such that adjacent two of the first, second, and third color filters are formed without a gap therebetween, and a light-shielding layer formed on the first color filter, the second color filter and the third color filter. The first color filter has a line width which is substantially ½ of a line width of the second color filter and a line width of the third color filter. The first color filter, the second color filter and the third color filter have no projection formed by an overlap of at least two color filters of different colors.

14 Claims, 28 Drawing Sheets

(51) Int. Cl.
*G03F 7/00* (2006.01)
*G02F 1/1362* (2006.01)

(52) U.S. Cl.
CPC .. *G02F 1/133512* (2013.01); *G02F 1/133516* (2013.01); *G03F 7/0007* (2013.01); *G02F 1/13624* (2013.01)

(56) References Cited

U.S. PATENT DOCUMENTS

| | | | |
|---|---|---|---|
| 2001/0012079 A1 | 8/2001 | Yamamoto et al. | |
| 2005/0073625 A1 | 4/2005 | Daiku et al. | |
| 2006/0066777 A1* | 3/2006 | Kim | G02B 5/201 349/106 |
| 2006/0244693 A1 | 11/2006 | Yamaguchi et al. | |
| 2007/0206303 A1* | 9/2007 | Sumino | G02B 5/201 359/885 |
| 2008/0088780 A1* | 4/2008 | Nakatsugawa | G02F 1/13363 349/118 |
| 2009/0015768 A1* | 1/2009 | Igeta | G02F 1/133512 349/106 |
| 2009/0033845 A1* | 2/2009 | Tanno | G02F 1/134363 349/106 |
| 2010/0085518 A1* | 4/2010 | Choi | G03F 7/032 349/110 |
| 2010/0091227 A1* | 4/2010 | Chen | G02B 27/2214 349/122 |
| 2011/0043486 A1 | 2/2011 | Hagiwara et al. | |
| 2012/0175607 A1 | 7/2012 | Shu et al. | |
| 2013/0135547 A1 | 5/2013 | Hibayashi et al. | |
| 2014/0211135 A1* | 7/2014 | Jung | G02F 1/133788 349/106 |

FOREIGN PATENT DOCUMENTS

| | | |
|---|---|---|
| JP | 4213226 B | 8/1992 |
| JP | 10-171599 A | 6/1998 |
| JP | 2001-202033 A | 7/2001 |
| JP | 2002-335454 A | 11/2002 |
| JP | 2004-354662 A | 12/2004 |
| JP | 2005-301284 A | 10/2005 |
| JP | 2006-139058 A | 6/2006 |
| JP | 2006-267352 A | 10/2006 |
| JP | 2006-301864 A | 11/2006 |
| JP | 2007-018458 A | 1/2007 |
| JP | 2009-020232 A | 1/2009 |
| JP | 2009-036795 A | 2/2009 |
| JP | 2009-151039 A | 7/2009 |
| JP | 2010-186997 A | 8/2010 |
| JP | 2010-210982 A | 9/2010 |
| JP | 2011-028058 A | 2/2011 |
| JP | 2011-107473 A | 6/2011 |
| JP | 4857569 B | 11/2011 |
| JP | 4919030 B2 | 4/2012 |
| JP | 2013-222145 A | 10/2013 |
| TW | 200915256 A | 4/2009 |
| TW | 201219911 A1 | 5/2012 |
| TW | I376400 B | 11/2012 |
| WO | WO 2005/088360 A1 | 9/2005 |
| WO | WO 2007/148519 A1 | 12/2007 |
| WO | WO 2012/014751 A1 | 2/2012 |
| WO | WO 2013/008679 A1 | 1/2013 |

OTHER PUBLICATIONS

Combined Office Action and Search Report issued Sep. 1, 2015 in Taiwanese Patent Application No. 102133087 (with English language translation and English Translation of Category of Cited Documents).

International Search Report issued Dec. 17, 2013 in PCT/JP2013/074536, filed Sep. 11, 2013.

Supplementary Partial European Search Report issued Sep. 22, 2016 in Patent Application No. 13872461.2.

Office Action dated Feb. 23, 2017, in Chinese Patent Application No. 201380071319.7, filed Sep. 11, 2013 (with English-language Translation).

\* cited by examiner

COLOR FILTER SUBSTRATE, LIQUID CRYSTAL DISPLAY DEVICE, AND METHOD FOR MANUFACTURING COLOR FILTER SUBSTRATE

CROSS-REFERENCE TO RELATED APPLICATIONS

The present application is a continuation of International Application No. PCT/JP2013/074536, filed Sep. 11, 2013, which is based upon and claims the benefits of priority to Japanese Application No. 2013-012006, filed Jan. 25, 2013. The entire contents of these applications are incorporated herein by reference.

BACKGROUND OF THE INVENTION

Field of the Invention

The present invention relates to a color filter substrate, a liquid crystal display device, and a method for manufacturing a color filter substrate.

This application is based on and claims priority from earlier Japanese Patent Application No. 2013-012006 filed Jan. 25, 2013, the description of which is incorporated herein by reference.

Discussion of the Background

Liquid crystal panels provided to generally used liquid crystal display devices have a configuration in which a liquid crystal layer is sandwiched between two substrates. For example, the two substrates each include a transparent substrate made such as of glass. Such a liquid crystal panel has a front side and a back side each of which is provided with a polarizing plate, or a polarizing plate and a retardation plate.

An organic electroluminescence display device (hereinafter referred to as organic EL display device) includes a white light-emitting organic EL in place of liquid crystal. The organic EL display device includes a color filter that includes a red filter, a green filter and a blue filter to enable color display. The organic EL display device is used as a high-definition display.

Patent Literature 1 (JP-A-2006-139058) and Patent Literature 2 (WO2007/148519) each disclose a color filter that includes a red filter, a green filter and a blue filter, in which the green filter is smaller than the red filter and the blue filter. However, neither of Patent Literatures 1 and 2 discloses a technique of configuring the green filter of a ½ pixel width with twice the number of lines of that of the red or blue filter (twice the number of picture elements when a ½ pixel is a picture element) so as to isolate the red filter from the blue filter. In Patent Literature 2, display of a green filter can be covered by the blue filter and a yellow filter, and thus, from a viewpoint of white balance, the red filter is required to have a relatively larger area. Neither of Patent Literatures 1 and 2 discloses color separation using stereoscopic image display, touch sensing, and an optical sensor.

Being able to perform three-dimensional display (stereoscopic display) or being able to control viewing angle, a liquid crystal display device displays an image using a backlight unit or an external light source. Being able to perform three-dimensional display or being able to control viewing angle, a liquid crystal display device controls the angle of light emitted from a surface of the liquid crystal panel toward an observer (to the outside) according to the purpose of display.

A liquid crystal display device or a display unit, which is able to perform three-dimensional display, uses various display methods. For example, three-dimensional displays include a method of using eye glasses and a method of not using eye glasses. The method of using eye glasses includes, for example, an anaglyph method that utilizes a color difference, or a polarized glasses method that utilizes polarization. In the method of using eye glasses, an observer is required to wear eye glasses dedicated to the three-dimensional display, which is annoying. Therefore, for three-dimensional display in recent years, there is an increasing need for a method that does not involve use of eye glasses.

In a technique under development, a light control element is set up on the front or back surface of a liquid crystal panel to adjust an angle of light emitted from the liquid crystal panel to a single observer (hereinafter may also referred to as a "binocular method") or a plurality of observers (hereinafter may also referred to as "multilocular method"). The light control element may be used in a liquid crystal display device for a method of not using eye glasses.

As an example of the light control element, there is one that uses a lenticular lens in which optical lenses are two-dimensionally arrayed to realize regular refraction. Such a lenticular lens is formed by processing a transparent resin into a sheet shape, and may be used by being stuck onto the front or back surface of a liquid crystal display device.

Patent Literature 3 (JP-B-4010564) or Patent Literature 4 (JP-B-4213226) discloses a technique of three-dimensional display using a lenticular lens or a lenticular screen.

Patent Literature 5 (JP-A-2010-210982) discloses a parallax barrier for glasses-free three-dimensional display. Patent Literature 5 discloses in paragraphs [0016] and [0060] that a translucent film is provided between a parallax barrier and a color filter to keep a distance between the parallax barrier necessary for three-dimensional display and the color filter. However, the parallax barrier disclosed in Patent Literature 5 is chiefly electrically conductive, and there is no mention of increasing an aperture ratio using a relationship between a black matrix normally formed in the color filter and the parallax barrier. For example, Patent Literature 5 illustrates in FIG. 9 that the parallax barrier is arranged at a position overlapping with a portion of the color filter (blue filter, green filter and red filter), which may lower the transmittance. Patent Literature 5 shows in FIG. 10 what is estimated to be a cross-section structure of a pixel. Patent Literature 5 shows in FIG. 10 a black matrix. However, in FIG. 10 of Patent Literature 5, the parallax barrier is formed traversing the color filter. In this case, the transmittance is considered to be lowered. Further, when a parallax barrier is electrically conductive as in Patent Literature 5, it is difficult to apply touch sensing of electrostatic capacity type that is based on an in-cell method, because of the influence of the electrical conductivity of the parallax barrier.

A direct input method applied to a liquid crystal display screen includes an on-cell method in which a touch panel having a sensing function is set up on the front surface of a liquid crystal panel to have the touch panel receive input, and an in-cell method in which a sensing function, as a sensor with a matrix array, is formed in an array substrate or a color filter substrate of a liquid crystal display device so as to be internally provided in a liquid crystal cell.

Patent Literature 6 (JP-A-H10-171599) discloses a technique used for the on-cell method, that is, a touch panel based on a resistive film method, an electromagnetic induction method, an electrostatic capacity type method, and an optical method. In the on-cell method in which a touch panel is arranged on a surface of a liquid crystal panel, the thickness and weight of the touch panel are added to the thickness and weight of the liquid crystal display device, thereby increasing the thickness and weight of the device as a whole. Further, in the on-cell method, the quality of the liquid crystal display may be lowered due to the light reflection on the front surface of the touch panel and the internal surface of the touch panel.

In contrast, the in-cell method, in which a sensor is internally set up in the liquid crystal cell, is favorable because it is able to suppress the increase in the thickness of the liquid crystal display device and the lowering in the quality of liquid crystal display. An optical sensor as a sensor having a sensing function is under development.

Liquid crystal display devices used for information machine are increasingly used for three-dimensional display. For example, there are increasing technical needs such as of realizing a clicking feeling relative to a three-dimensionally displayed button, or preventing erroneous operation through finger input. For the detection of finger input, the on-cell method as mentioned above is used, for example, in which a touch panel is externally provided to a surface of a liquid crystal display. Alternatively, for the detection of finger input, the in-cell method as mentioned above may be used, in which an optical sensor is integrated into a liquid crystal panel. The liquid crystal display device integrating an optical sensor may require compensation of an optical sensor to prevent the occurrence of erroneous operation in relation to finger input, due to being influenced by temperature and a backlight light source.

A silicon photodiode may be used as an optical sensor, which includes a channel layer formed of polysilicon or amorphous silicon. In such a case, dark current may be caused due to the variation of environmental temperature or the like, and hence noise other than observation light may be applied to observation data.

Patent Literature 7 (JP-A-2002-335454) and Patent Literature 8 (JP-A-2007-018458) each disclose that dark current is subjected to operation/correction using a photodiode. These Patent Literatures 7 and 8 disclose a technique for dark current correction by using an imaging device.

Patent Literature 9 (JP-A-2009-151039) discloses that an S/N ratio of detection signals is improved by performing an operation based on the detection signals of a first light-receiving element and a second light-receiving element. However, Patent Literature 9 discloses no technique of performing color separation of visual light with good accuracy. In addition, according to claim 1 of Patent Literature 9, the first light-receiving element is provided thereon with an optical filter that absorbs light in the visible range, and a light-shielding member that absorbs and shields incident light. Thus, claim 1 of Patent Literature 9 seems to give no consideration to color separation of blue light, green light and red light. Furthermore, Patent Literature 9 does not disclose an alignment method used for manufacturing a color filter substrate. As described above, the technique disclosed in Patent Literature 9 relates to touch sensing for cancelling noise components.

Patent Literature 10 (JP-A-2010-186997) discloses a technique for an optical sensor (light-receiving element) that uses an oxide semiconductor. Patent Literature 10 chiefly discloses a technique for an optical sensor applied to a display that uses an organic material as a light-emitting layer.

Patent Literature 11 (JP-B-4857569) discloses that dry etching is applied to an image sensor, and to coloring of a first color. In Patent Literature 11, the pixel array is a Bayer array, but there is no mention of forming linear patterns with different line widths. A Bayer array may impair reproducibility in the corner portions of a green pixel. For example, in a liquid crystal display device or an organic EL display device, a Bayer array may vary the area ratios of colors, impair color balance, and cause color unevenness in display. A Bayer array, in which the area ratio of green pixels is twice of the area ratio of the blue pixels, is difficult to apply to a liquid crystal display device or an organic EL display device which places importance on white balance. In a liquid crystal display device or an organic EL display device having a Bayer array, it may be difficult to ensure reproducibility in displaying text (textual information) or consistency in stereoscopic display. Patent Literature 11 does not disclose contamination by using halogen and metal contained in organic pigments which are used in dry-etching a color filter layer. Patent Literature 11 does not disclose that, in coloring a second and the subsequent colors, fluidity at the time of heat curing is not utilized.

Patent Literature 12 (JP-A-2004-354662) discloses that a filter is overlapped with another filter. The overlapped portion of the two filters is projected compared to other portions and thus impair planarity of the color filter substrate. In general, a color filter has a thickness ranging from about 1.5 µm to 3 µm. Therefore, the overlapped portion of the two filters forms a projection of at least 1 µm which may cause alignment irregularity of the liquid crystal or deterioration in the quality of a liquid crystal image.

Patent Literature 1: JP-A-2006-139058
Patent Literature 2: WO2007/148519
Patent Literature 3: JP-B-4010564
Patent Literature 4: JP-B-4213226
Patent Literature 5: JP-A-2010-210982
Patent Literature 6: JP-A-H10-171599
Patent Literature 7: JP-A-2002-335454
Patent Literature 8: JP-A-2007-018458
Patent Literature 9: JP-A-2009-151039
Patent Literature 10: JP-A-2010-186997
Patent Literature 11: JP-B-4857569
Patent Literature 12: JP-A-2004-354662

SUMMARY OF THE INVENTION

According to one aspect of the present invention, a color filter substrate includes a transparent substrate having an effective display region and a frame region enclosing the effective display region, color filters including a first color filter, a second color filter and a third color filter having different colors, the color filters being formed in linear patterns on the transparent substrate such that adjacent two of the first, second, and third color filters are formed without a gap therebetween, and a light-shielding layer formed on the first color filter, the second color filter and the third color filter. The light-shielding layer includes an organic pigment as a main material of a light-shielding color material and is capable of shielding a visible light and transmitting an infrared light. The first color filter is positioned such that the second color filter is separated from the third color filter. The first color filter has a line width which is substantially ½ of a line width of the second color filter and a line width of the third color filter. The first color filter, the second color filter and the third color filter have no projection formed by an overlap of at least two color filters of different colors.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
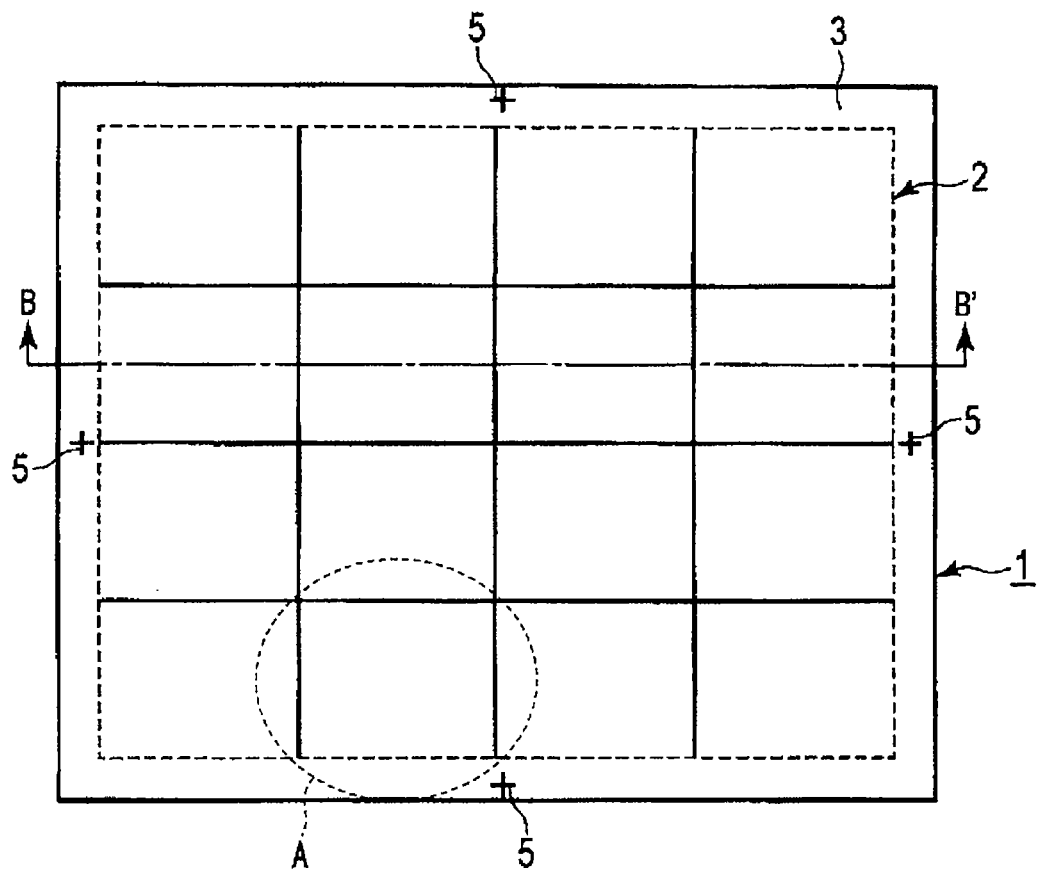
FIG. 1A is a plan view illustrating an example of a color filter substrate according to a first embodiment.

Hereinafter, with reference to the drawings, embodiments of the thin film transistor array will now be described. In the respective drawings to be referenced, portions having identical configuration in the respective drawings described below are labeled with the same symbols.

With reference to the drawings, hereinafter are described embodiments of the present invention. It should be noted that in the following description, components identical or substantially identical with each other are given the same reference signs for the sake of omitting explanation, or otherwise explanation is given only when necessary.

In the embodiments, only characteristic portions are described, while omitting description in respect of those portions which have no difference from the components of a normal liquid crystal display device.

In the embodiments, description is given in respect of the case where a display unit of a liquid crystal display device is one pixel (or picture element). However, a display element may be one sub-pixel, or a display element may be configured by a plurality of pixels, or a display element may be configured by an optionally defined pixel or a picture element. A pixel is a polygon having at least two sides parallel to each other.

In a plan view, the lateral direction of a pixel is parallel to a direction along which the right and left eyes of an observer lie side by side.

In a plan view, a direction perpendicular to the lateral direction of a pixel is a longitudinal direction of the pixel.

A plurality of pixels may include pixels each having a width in a lateral direction (hereinafter referred to as lateral width), which is ½ compared to other pixels. A pixel with a ½ lateral width is in a shape that is long in a longitudinal direction. However, in place of the shape that is long in a longitudinal direction, the plurality of pixels may include pixels each having a width in a longitudinal direction (hereinafter referred to as longitudinal width), which is ½ compared to other pixels. In this case, a pixel of a ½ longitudinal width is in a shape that is long in a lateral direction.

In the embodiments, a pixel has a longitudinal width which is substantially equal to the longitudinal width of an opening of the pixel. Each pixel has a lateral width which is substantially equal to the lateral width of an opening of the pixel.

In the embodiments, various liquid crystal drive methods may be used. For example, liquid crystal orientation methods or liquid crystal drive methods that can be used include: an IPS method (horizontal electric field method using horizontally oriented liquid crystal molecules); VA (Vertical Alignment: vertical electric field method using vertically oriented liquid crystal molecules); HAN (Hybrid-aligned Nematic); TN (Twisted Nematic); OCB (Optically Compensated Bend); and CPA (Continuous Pinwheel Alignment). A liquid crystal layer may contain liquid crystal molecules having positive dielectric anisotropy, or may contain liquid crystal molecules having negative dielectric anisotropy.

The liquid crystal molecules, when applied with a liquid crystal drive voltage, may have a rotating direction (operating direction) which is parallel to a surface of a substrate, or which vertically rises from the plane of a substrate. The direction of the liquid crystal drive voltage applied to the liquid crystal molecules may be a horizontal direction, or may be a two- or three-dimensionally oblique direction, or may be a vertical direction.

First Embodiment

The present embodiment describes a color filter substrate and a manufacturing method therefor. The present embodiment describes a color filter substrate in which, in a plan view, a light-shielding layer (black matrix) is formed on neither of the longitudinal sides of each color filter. Thus, by forming no light-shielding layer (which is used synonymously with a black matrix herein and thus hereinafter may sometimes be referred to as black matrix) on either side of each color filter in a longitudinal direction, each pixel can have an opening, with the lateral width being increased by an amount corresponding to a line width of the light-shielding layer. A pixel having a large opening width with no black matrix can significantly facilitate a post-process, that is, cell formation, of a liquid crystal display device, i.e. facilitate alignment (alignment in a cell-forming process) with an array substrate described above. When there is a black matrix, it is necessary to accurately align the end portions of a metal line relative to respective two line width ends of a pattern line width of the black matrix, the metal line being electrically connected to a thin-film transistor on an array substrate. In the absence of the black matrix, the metal line on the array substrate only has to be aligned with a boundary relative to an adjacent color filter and thus the margin of alignment is broadened.

A color filter substrate includes a first linear pattern formed of a first color filter, a second linear pattern formed of the first color filter, and a third linear pattern formed of a third color filter dividing the first pattern from the second linear pattern. In the present embodiment, the adjacently located first, second and third color filters with no gap therebetween have no formation of projections in a film thickness direction, the projections being ascribed to at least two color filters of different colors overlapped with each other in a thickness direction of the color filter substrate. In other words, the first, second and third color filters are formed such that no projections are formed in the film thickness direction, the projections being ascribed to at least two color filters of different colors overlapped with each other. Further, in other words, in the first, second and third color filters, two color filters are in contact with each other only via their side faces.

The color filters adjacent to each other in this way are formed in a heat treatment process (reflow processing) of a manufacturing process, by having one color filter material melted and contacted with a side face of another color filter that have been firstly formed on the substrate. The heat treatment processing is performed so that the melted color filter material does not flow toward the upper surface of the firstly fixed and formed color filter.

Further, in order to realize a structure in which the mutually adjacent color filters do not overlap in the thickness direction, it is preferable that the color filter firstly formed on the substrate has a cross sectional in a rectangular shape. The color filter having a rectangular cross section has a side face that is vertical to the substrate, and thus the subsequently formed color filter is arranged so as to be in contact with the vertical side face. Thus, the mutually adjacent color filters are arranged sandwiching their vertical side faces, thereby realizing the structure of the present invention in which no projection is formed.

It should be noted that the projection herein has a height that is equal to or more than a wavelength of light (e.g., 550 nm) that is liable to influence liquid crystal display. In the present embodiment, in arranging the first, second and third color filters with no gap therebetween, a very small degree of alignment error and bleeding may be tolerated. For example, quite a small degree of alignment error equal to or more than ½ of the wavelength of light which is liable to influence liquid crystal display, may be construed as corresponding to "no projection is formed" of the present embodiment. For example, in the event that a very small uplift is caused in a color filter due such as to bleeding of a color, this may be construed as corresponding to "no projection is formed" of the present embodiment. Further, in the heat treatment processing, in the event that the melted color filter is formed slightly covering a corner portion formed between the upper surface and the side face of the firstly formed color filter, this may be construed as corresponding to "no projection is formed" of the present embodiment.

The present embodiment is described by way of an example in which a color filter substrate is provided to a liquid crystal display device, but the color filter substrate may be provided to an organic EL display device.

Figure 1B:
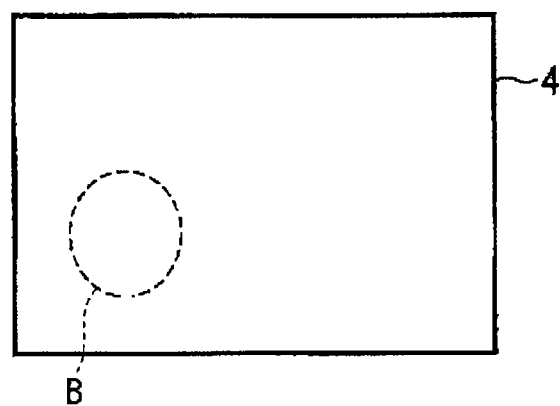
FIG. 1B is a plan view illustrating an example of a color filter substrate according to the first embodiment, that is, an enlarged view illustrating a part indicated by a reference sign A.
Figure 1C:
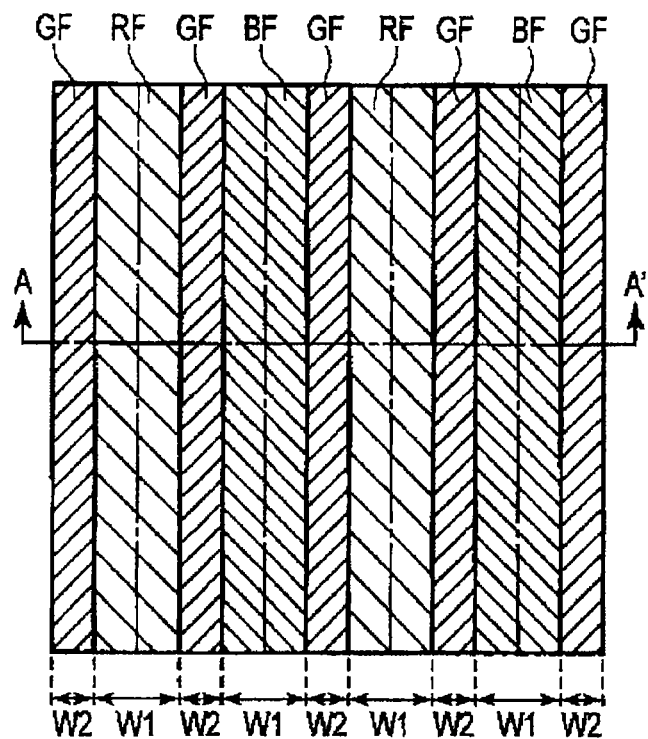
FIG. 1C is a plan view illustrating an example of a color filter substrate according to the first embodiment, that is, an enlarged view illustrating a part indicated by a reference sign B.

FIGS. 1A to 1C are plan views illustrating an example of a color filter substrate 1 according to the present embodiment.

The color filter substrate 1 includes, in plan view, an effective display region 2 and a frame region 3. The frame region 3 encloses the effective display region 2. The effective display region 2 includes a plurality of areas 4. In FIGS. 1A to 1C, the effective display region 2 includes a total of sixteen areas 4, i.e. four in a longitudinal direction and four in a lateral direction. The number of the areas 4 included in the effective display region 2 can be changed according to the screen size of the liquid crystal display.

The color filter substrate 1 includes, in a plan view, two or more alignment marks 5 in the frame region 3. The alignment marks 5 are used in the process of manufacturing the color filter substrate 1. For example, the alignment marks 5 may be formed together with a firstly formed filter, with a color material of the firstly formed filter.

As a color filter CF, the color filter substrate 1 includes red filters RF, green filters GF and blue filters BF.

The red filters RF are each in a linear pattern which is long in a longitudinal direction.

The blue filters GF are also each in a linear pattern which is long in a longitudinal direction.

The green filters BF are each in a linear pattern which is long in a longitudinal direction and are each located between a red filter RF and a blue filter BF to isolate the red filter RF from the blue filter BF.

In the present embodiment, the lateral width of each red filter RF and the lateral width of each blue filter BF are W1. The lateral width of each green filter GF is W2. The width W2 is substantially ½ of the lateral width W1.

The numerical value of substantially ½ as a ratio of the lateral width W2 to the lateral width W1 is specified so as to obtain a desired color balance and chromaticity of the red filters RF, the green filters GF and the blue filters BF. In order to obtain a desired color balance and chromaticity, the ratio of the lateral width W2 relative to the lateral width W1 may be slightly different from the numerical value ½.

Such red filters RF, the blue filters BF and the green filters GF are arranged in a stripe.

Figure 2:
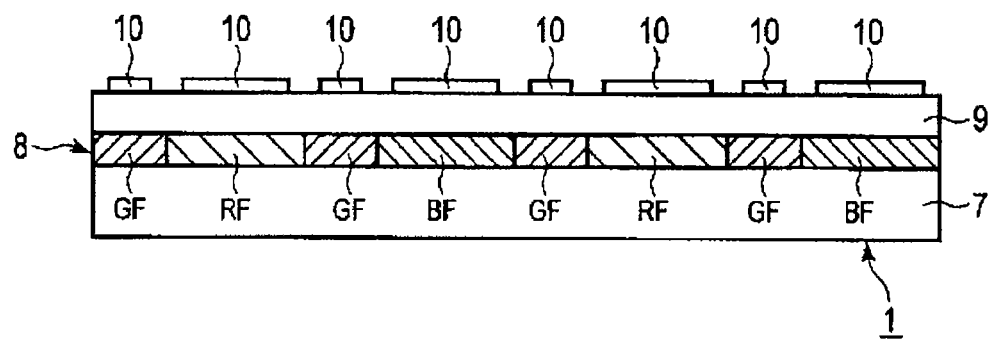
FIG. 2 is a cross-sectional view illustrating an example of a color filter substrate according to the first embodiment.

FIG. 2 is a cross-sectional view illustrating an example of the color filter substrate 1. FIG. 2 corresponds to a cross section taken along A-A' of FIG. 1C.

Figure 3:
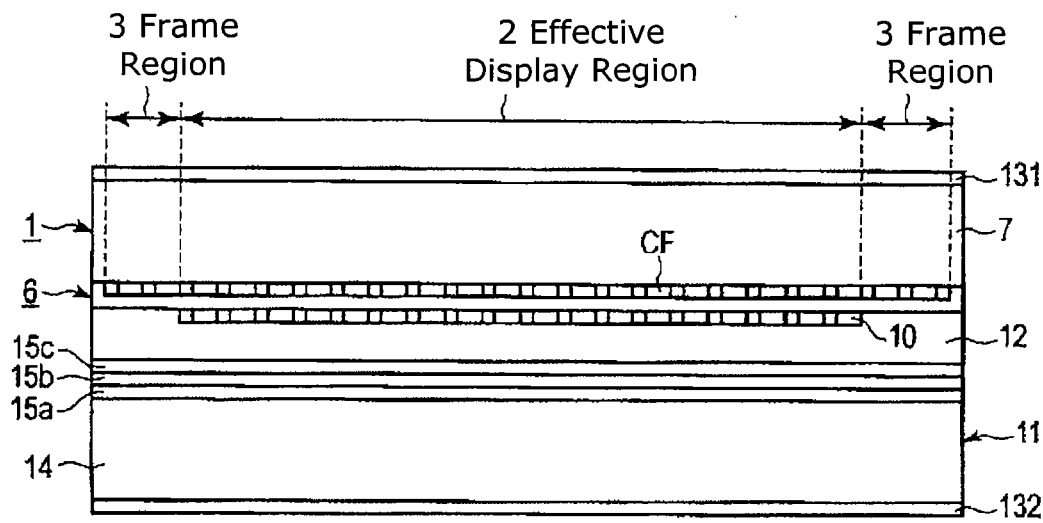
FIG. 3 is a cross-sectional view illustrating an example of a liquid crystal panel that includes a color filter substrate according to the first embodiment.

Further, FIG. 3 is a cross-sectional view illustrating an example of a liquid crystal panel 6 including the color filter substrate 1. FIG. 3 corresponds to a cross section taken along B-B' of FIG. 1A.

The color filter 1 includes a transparent substrate 7, a color filter layer 8, a transparent resin layer 9 and counter electrodes 10. The counter electrodes 10 may be omitted.

As the transparent substrate 7, glass is used, for example. The transparent substrate 7 has a first plane on which the color filter layer 8 is formed.

In the present embodiment, the color filter layer 8 includes the color filter CF, but may additionally include a light-shielding layer. The color filter CF includes the red filters RF, the blue filters BF and the green filters GF.

In the present embodiment, the color filter CF is formed over the effective display region 2 and the frame region 3. In the color filter layer 8, the thickness of the color filter CF in the effective display region 2 is substantially the same as the thickness of the color filter CF in the frame region 3.

The transparent resin layer 9 is formed on the color filter layer 8.

The counter electrodes 10 are formed on the transparent resin.

The counter electrodes 10 each have a linear pattern which is long in a longitudinal direction, and are formed along the respective red filters RF, the blue filters BF and the green filters GF.

The counter electrodes 10 may be formed, for example, into comb-shaped, band-shaped, linear or striped patterns.

The counter electrodes 10 may contain an electrically conductive metal oxide. As the electrically conductive metal oxide, for example, a transparent electrically conductive film such as Indium-Tin-Oxide (ITO) can be used.

In the present embodiment, the counter electrodes 10 overlap with the respective red, blue and green filters RF, BF and GR in a thickness direction.

In the present embodiment, the red, blue and green filters RF, BF and GR adjacent to each other with no gap therebetween do not substantially overlap with each other in a thickness direction even when an adjacent portion includes an irregularity of not more than ½ of the wavelength of light.

The liquid crystal panel 6 includes an array substrate 11, a color filter substrate 1 and a liquid crystal layer 12. The liquid crystal panel 6 has a front side (observer side or a surface of the color filter substrate 1) which is provided with a polarizing plate 131. The liquid crystal panel 6 has a back side (inner side of the liquid crystal display device or a surface of the array substrate 11) which is provided with a polarizing plate 132. The liquid crystal display device includes a light control element and a backlight unit under the liquid crystal panel 6 shown in FIG. 3. The liquid crystal display device provided with the liquid crystal panel 6 is in black state of display when no liquid crystal drive voltage is applied. Unlike the liquid crystal orientation method with initial horizontal orientation called IPS (horizontal electric field method using horizontally oriented liquid crystal molecules) or ECB (Electrically Controlled Birefringence), no deviation is caused between the orientation direction of the liquid crystal molecules and the optical axes of the polarizing plates 131 and 132, and thus a pitch black display (deep black display) can be obtained.

The array substrate 11 and the color filter substrate 1 face with each other. The liquid crystal layer 12 is sandwiched between the array substrate 11 and the color filter substrate 1.

The liquid crystal layer 12 is arranged so as to face the counter electrodes 10 of the color filter substrate 1. The transparent substrate 7 of the color filter substrate 1 has a second plane that is a display surface of the liquid crystal panel 6, or a surface that an observer observes.

The array substrate 11 includes a transparent substrate 14, insulating layers 15a to 15c, a common electrode, a pixel electrode and a liquid crystal drive element (active element). The common electrode and the pixel electrode however are omitted from FIG. 3. For example, the liquid crystal drive elements that can be used may be thin-film transistors.

For example, a glass plate can be used as the transparent substrate 14.

The transparent substrate 14 has a first plane on which the insulating layers 15a and 15b are formed. The common electrode is formed on the insulating layer 15b. The insulating layer 15c is formed on the insulating layer 15b on which the common electrode is formed. The pixel electrode is formed on the insulating layer 15c. As the insulating layers 15a to 15c, a mixture that contains, for example, SiN, SiO₂, or SiN and SiO₂ may be used. The pixel electrode and the common electrode, not shown, may contain electrically conductive metal oxide. For example, a transparent electrically conductive film that contains ITO or the like as the electrically conductive metal oxide can be used.

The liquid crystal layer 12 is arranged so as to face the pixel electrode of the array substrate 11. The transparent substrate 14 of the array substrate 11 has a second plane which is located inside the liquid crystal display device.

The polarizing plate 131 is provided to the second plane (display surface of the liquid crystal panel 6) of the transparent substrate 7. The polarizing plate 132 is provided to the second plane (inside the device of the liquid crystal panel 6).

In the present embodiment, the alignment marks 5 may be formed of a first color of the color filter CF. The alignment marks 5 are formed at least at two positions on the transparent substrate 7. The alignment marks 5 are used for alignment in an exposure processing that follows the formation of a coating film of a photoresist that is a material of the color filter CF.

Hereinafter is described a method for manufacturing the color filter substrate 1 according to the present embodiment.

FIGS. 4A to 4G are state-transition diagrams illustrating an example of a method for manufacturing the color filter substrate 1.

Apparatus used for manufacturing the color filter substrate 1 includes, for example, a resist coater, a dryer, an exposure apparatus, a developing apparatus and a film curing apparatus. Typical dryers and film curing devices that can be used include a clean oven, a hot plate, and the like.

Figure 4A:
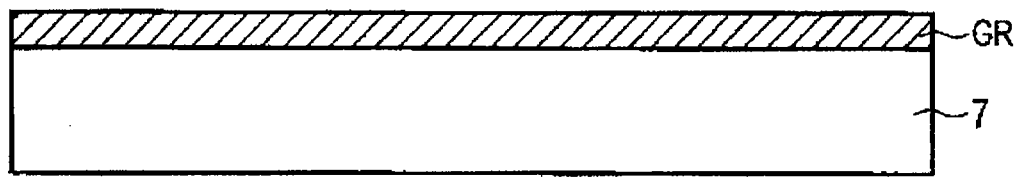
FIG. 4A is a state-transition diagram illustrating an example of a method for manufacturing a color filter substrate according to the first embodiment.
Figure 4B:
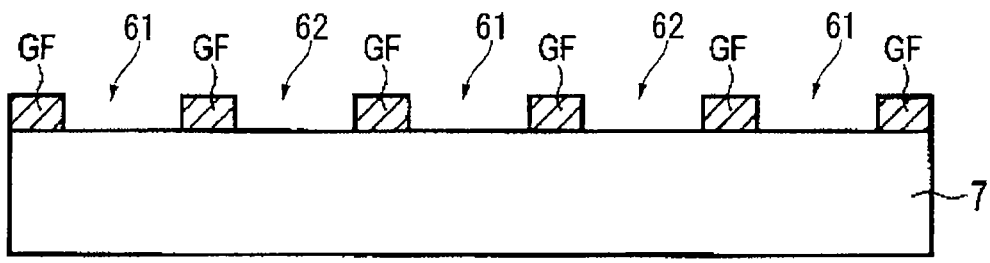
FIG. 4B is a state-transition diagram illustrating an example of a method for manufacturing a color filter substrate according to the first embodiment.

As shown in FIG. 4A, a green resist GR (coloring composition, first resist layer) is formed on the transparent substrate 7. For example, the green resist GR is coated onto the entire surface of the transparent substrate 7 with a dry coating thickness of 2.5 μm. Then, the substrate as an object to be processed is prebaked in a clean oven at 70° C. for 20 minutes, followed by cooling at room temperature. Then, an ultraviolet exposure is performed relative to the substrate via a photomask by means of an ultrahigh pressure mercury lamp. In this case, the alignment marks 5, each having a cross shape, are formed by using the green resist GR with reference, for example, to an end face of the substrate. After that, a spray development is produced (patterning) with respect to the substrate, using aqueous sodium hydrate of 23° C., followed by cleaning with ion-exchanged water, and air-drying. After that, the substrate is subjected to heat treatment at 220° C. and film-curing to thereby form, as shown in FIG. 4B, the green filters GF (first color filter), first filter openings 61 and second filter openings 62, each enclosed by the green filters GF. It should be noted that the first filter openings 61 are used for arranging therein the red filters RF that will be formed in processing performed later. Further, the second filter openings 62 are used for arranging therein the blue filters BF that will be formed in processing performed later.

It should be noted that the green filters GF may be formed with high definition by means of a well-known dry etching method, instead of the photolithography method described above.

Figure 4C:
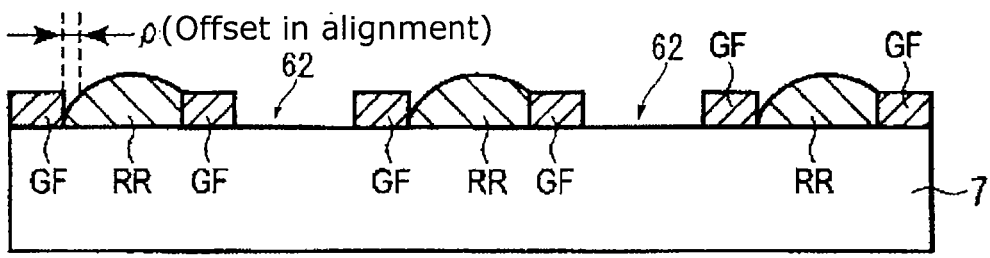
FIG. 4C is a state-transition diagram illustrating an example of a method for manufacturing a color filter substrate according to the first embodiment.
Figure 4D:
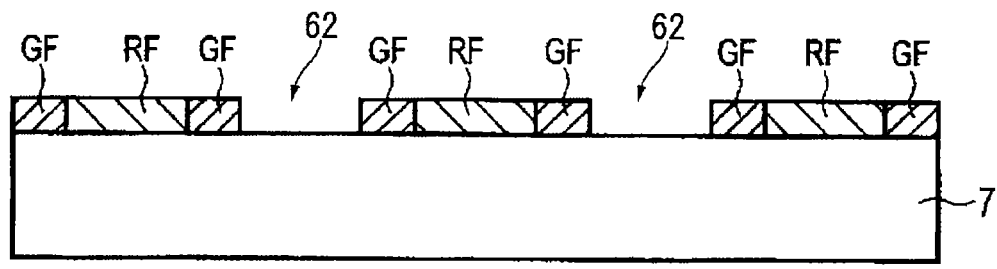
FIG. 4D is a state-transition diagram illustrating an example of a method for manufacturing a color filter substrate according to the first embodiment.

Subsequently, as shown in FIG. 4C, a red resist RR (second resist layer) is formed on the substrate as an object to be processed so as to cover the green filters GR, the first filter openings 61 and the second filter openings 62. For example, the red resist RR is coated so as to have a dry thickness of 2.5 μm. Then, the substrate is subjected to alignment using the alignment marks 5, followed by exposure by means of the exposure apparatus, and development (patterning) by means of the developing apparatus to thereby form, as shown in FIG. 4D, the red resist RR (red filters RF) in each first filter opening 61 which is located between two green filters GF. Further, the red resist RR formed on the green filters GR and in the second filter openings 62 is removed.

Then, heat treatment processing is performed to impart the red resist RR with thermal fluidity (fluidity caused by heat treatment) so that the red resist RR can flow in each of the first filter openings 61. With film curing through the heat treatment, the red filters RF (second color filter) are formed from the red resist RR. Thus, as shown in FIGS. 4C and 4D, an alignment displacement p, i.e. an alignment error, can be absorbed, enabling formation of smooth red filters RF. The red filters RF are formed in this way, being adjacent to the green filters GF with no gap therebetween. In this case, no projection is formed, which is attributed to the overlap of the green filters GF with the red filters RF.

The development and film-curing processing for forming the red filters RF are similar to those for forming the green filters GF.

Figure 4E:
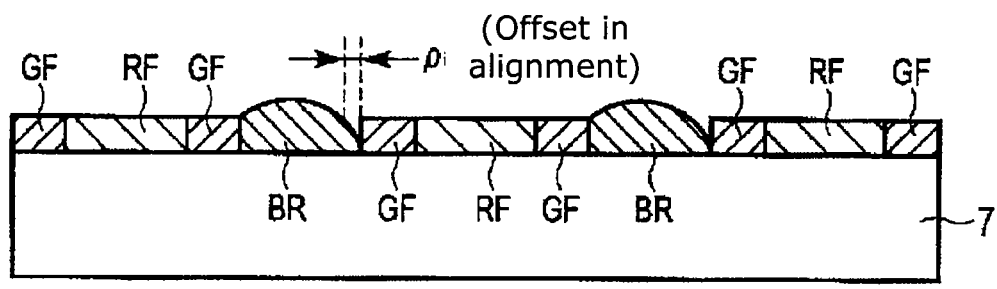
FIG. 4E is a state-transition diagram illustrating an example of a method for manufacturing a color filter substrate according to the first embodiment.
Figure 4F:
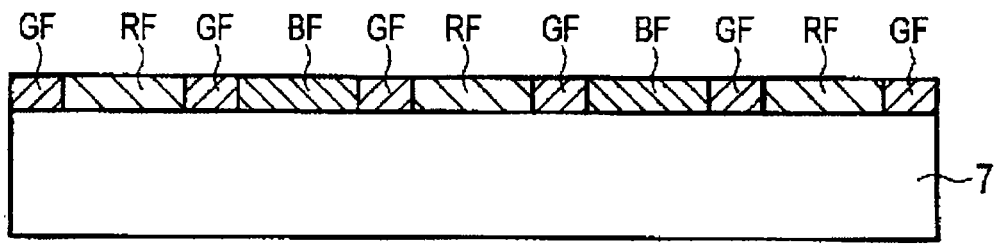
FIG. 4F is a state-transition diagram illustrating an example of a method for manufacturing a color filter substrate according to the first embodiment.

Subsequently, as shown in FIG. 4E, a blue resist BR (third resist layer) is formed on the substrate as an object to be processed so as to cover the green filters GF, the red filters RF and the second filter openings 62. For example, the blue resist BR is coated with a dry thickness of 2.5 Then, the substrate is dried with the drier, followed by alignment using the alignment marks 5, exposure by means of the exposure apparatus, and development by means of the developing apparatus (patterning) to thereby form, as shown in FIG. 4F, the blue resist BR (blue filter BF) in each second filter opening 62 located between two green filters GF. Further, the blue resist BR formed on the green filters GF and the red filters RF is removed.

Then, heat treatment processing is performed to impart the blue resist BR with thermal fluidity so that the blue resist BR can flow in each of the second filter openings 62. With film curing through the heat treatment, the blue filters BF (third color filter) are formed from the blue resist BR. Thus, as shown in FIGS. 4E and 4F, an alignment displacement p, i.e. an alignment error, can be absorbed, enabling formation of smooth blue filters BF. The blue filters BF are formed in this way, being adjacent to the green filters GF and the red filters RF with no gap therebetween. In this case, no projection is formed, being attributed to the overlap of the green filters GF with the blue filters BF, or being attributed to the overlap of the red filters RF with the blue filters BF. The development and film-curing processing for forming the blue filters BF are similar to those for forming the green filters GF.

In the manufacturing process described above, the green resist GR is used to firstly form the alignment marks 5 having a cross shape on the transparent substrate 7. The alignment marks 5 of the present invention are not limited to the ones set forth above.

For example, when a light-shielding layer (first light-shielding layer) that contains carbon as a main material of the light-shielding color materials is formed on the frame region, alignment marks may be formed using the same material as the light-shielding layer. Further, after forming a light-shielding layer (second light-shielding layer) that contains organic pigments, infrared light may be radiated to alignment marks formed of a material that contains carbon as mentioned above. Detecting (recognizing) the positions of the alignment marks by radiating the infrared light, a photomask used for patterning can be aligned with the transparent substrate.

Figure 4G:
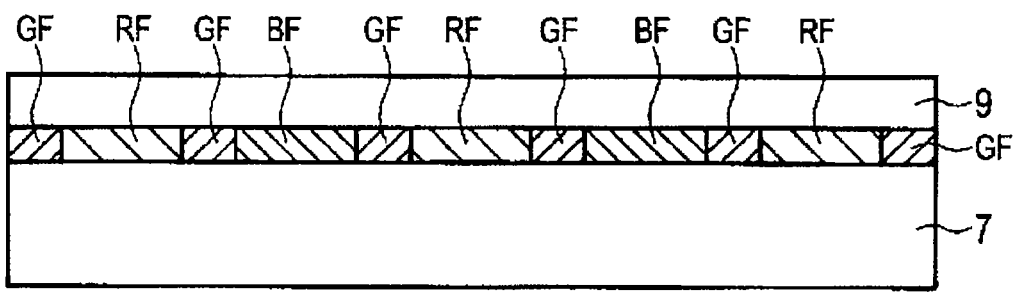
FIG. 4G is a state-transition diagram illustrating an example of a method for manufacturing a color filter substrate according to the first embodiment.

Then, as shown in FIG. 4G, the transparent resin layer 9 is formed on the green filters GF, the red filters RF and the blue filters BF. The transparent resin layer 9 is able to prevent smearing of the organic pigments contained in the green, red and blue filters GF, RF and BF and further improve the smoothness of the color filter substrate 1.

In the present embodiment, for example, the counter electrodes 10 may be formed on the transparent resin layer 9. The counter electrodes 10 may each be formed, for example, of a thin film of electrically conductive metal oxide, or more specifically may be formed, for example, of ITO. Thus, the color filter substrate 1 shown in FIG. 2 is formed.

When the color filter substrate 1 according to the present embodiment is applied to a liquid crystal display device, an oriented film may be formed on the transparent resin layer 9 or the counter electrodes 10.

Figure 5:
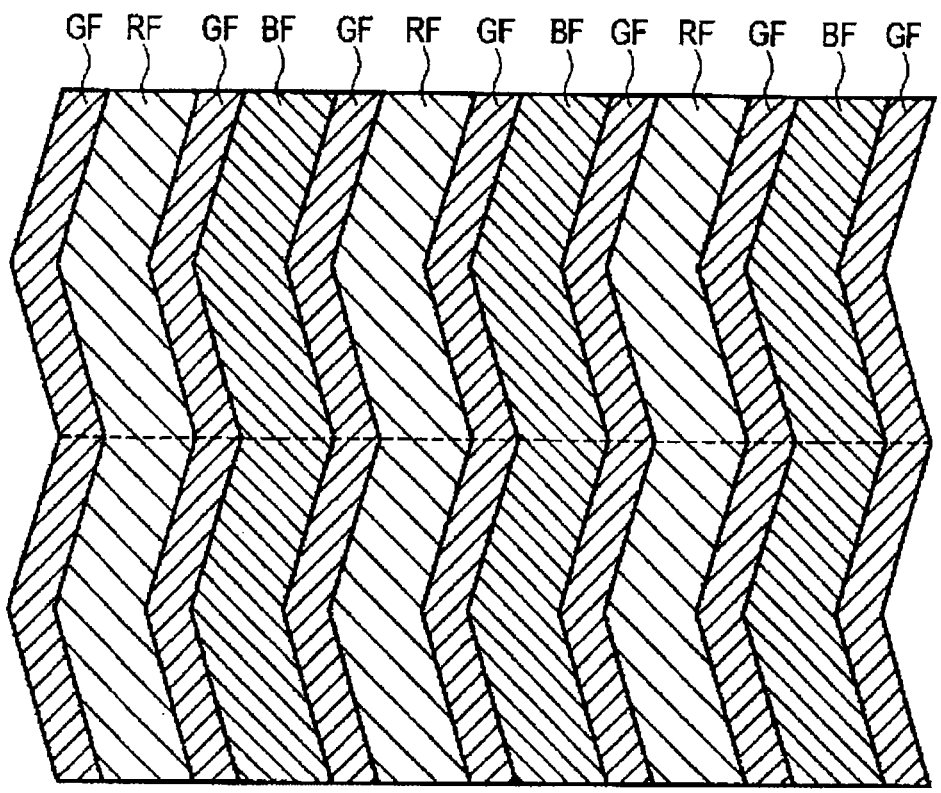
FIG. 5 is a plan view illustrating a modification of a pixel shape in a color filter substrate according to the first embodiment.

Although each pixel in the present embodiment is in a rectangular shape, the pixel may be, for example, in a V shape (doglegged shape) as shown in FIG. 5. In this case, the green, red and blue filters GF, RF and BF each have a linear pattern in which V shapes are connected in series in a longitudinal direction. Using such V-shaped patterns, the viewing angle of the liquid crystal display device can be broadened.

In the present embodiment described so far, the linear patterns of the red filters RF and the linear patterns of the blue filters BF are each sandwiched between the linear patterns of the green filters GF without forming any gap.

In the present embodiment, of the green, red and blue filters GF, RF and BF, the green filters GF are formed first.

The green resist GR used for forming the green filters GF has a high pigment ratio. When the green filters GF are formed by means of a photolithography method as described above, the green filters GF each have a good cross-sectional shape. In addition, the green filters GF have a high human visibility. Accordingly, formation of the green filters GF with a good shape can realize uniform display with no unevenness.

In the present embodiment, the mutually adjacent green, red and blue filters GF, RF and BF do not overlap each other in a thickness direction. Further, in the present embodiment, of the green, red and blue filters GF, RF and BF, the blue filters BF having high thermal fluidity are formed last. Furthermore, in the color filter layer 8 of the present embodiment, the color filter CF has a thickness that is substantially the same as that of light-shielding layers BLK1 and BLK2 as combined. Thus, the precision and smoothness of the color filter substrate 1 can be improved.

Referring to FIGS. 6 to 9, the effects obtained from the present embodiment are described.

Figure 6:
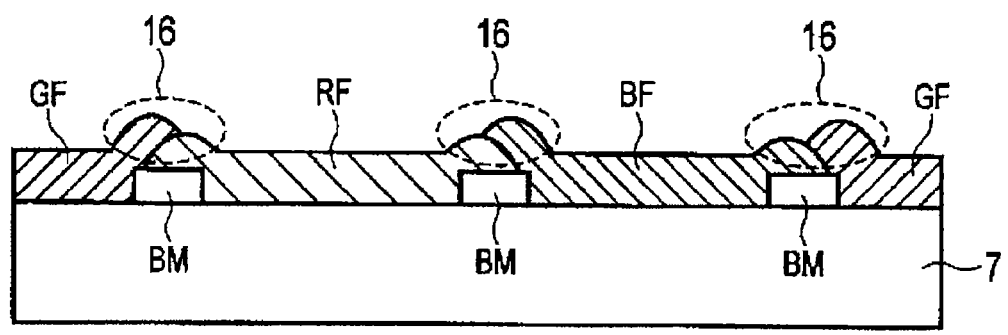
FIG. 6 is a cross-sectional view illustrating an example of a color filter substrate based on conventional art.

FIG. 6 is a cross-sectional view illustrating an example of a color filter substrate based on conventional art, in which a black matrix BM as a light-shielding layer is formed on the transparent substrate 7, with the red, blue and green filters RF, BF and GF are further formed on the black matrix BM.

When the red, blue and green filters RF, BF and GF are formed using a normal photolithography method, two of the red, blue and green filters RF, BF and GF overlap with each other on the black matrix BM to form convex portions 16. Such convex portions 16 impair smoothness of the color filter substrate. However, in the color filter substrate 1 according to the present embodiment, the mutually adjacent red, blue and green filters RF, BF and GF do not overlap each other in a thickness direction.

In the color filter substrate of conventional art shown in FIG. 6, the overlap of the black matrix BM with the red, blue and green filters RF, BF and GF causes the convex portions 16 (projections) which in turn may cause light leakage that impairs contrast. However, the color filter substrate 1 according to the present embodiment has no black matrix MB in the effective display region 2, and thus can greatly enhance the smoothness and suppress the contrast from being impaired.

Figure 7:
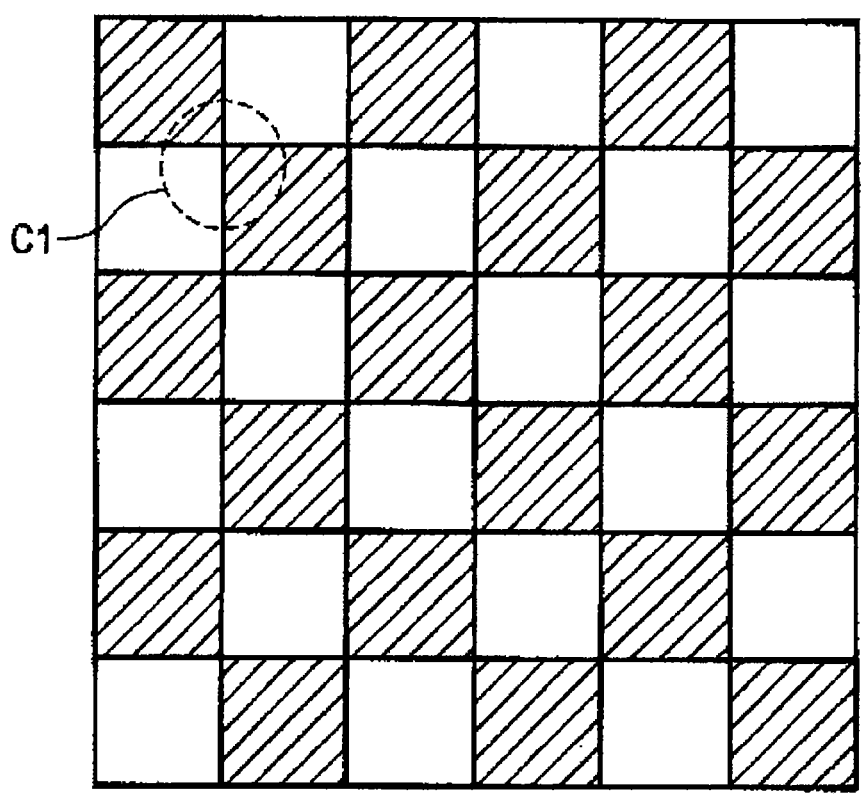
FIG. 7 is a plan view illustrating an example of a color filter substrate having a Bayer array.

FIG. 7 is a plan illustrating an example of a photomask for forming the green filters GF in a known Bayer array, as an imaging device. Such a photomask is used in Patent Literature 11, for example. Opening areas in white (areas where no color filter is formed) in FIG. 7 are normally formed when the green filters GF are formed. It is difficult to perform pattern control in exposure at a cornered portion C1 in the area where each green filter GF is formed.

Figure 8:
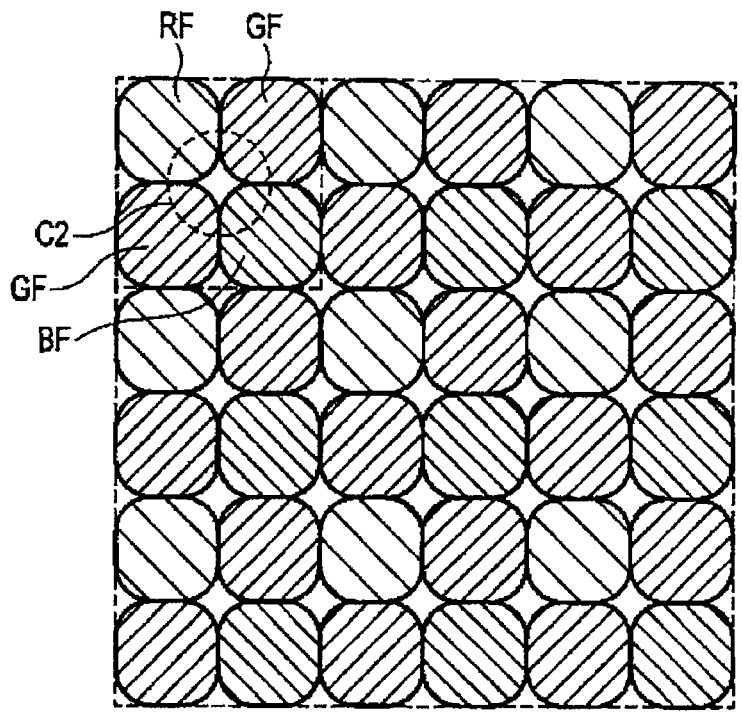
FIG. 8 is a plan view illustrating an example of white spots C2 of a red filter RF, a blue filter BF and a green filter GF.

FIG. 8 is a plan view illustrating an example of white spots C2 of the red, blue and green filters RF, BF and GF. When the photomask openings have the same size between the patterns of the red, blue and green filters RF, BF and GF, the red, blue and green filters RF, BF and GF are formed with the same size, resulting in possible formation of the white spots C2 where no filter is formed.

Figure 9:
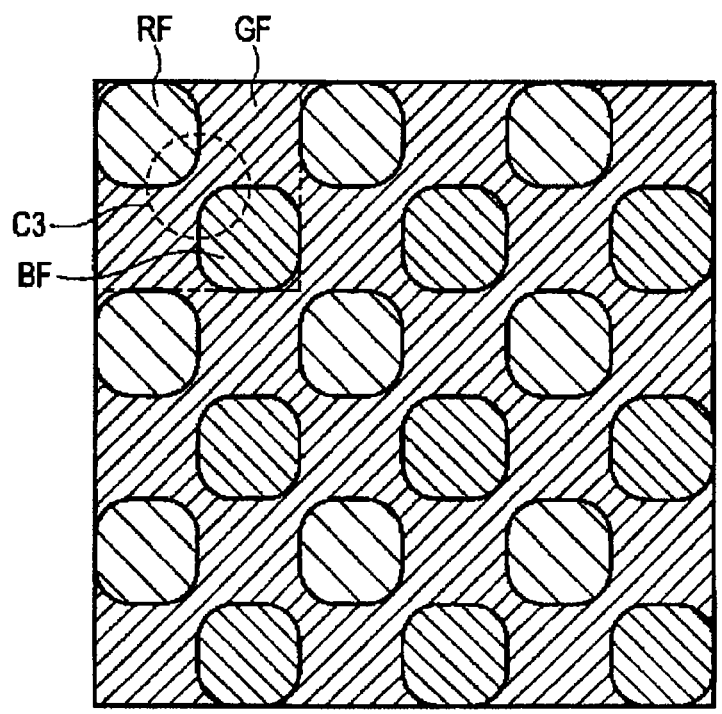
FIG. 9 is a plan view illustrating an example of connecting portions C3 of a green filter GF.

FIG. 9 is a plan view illustrating an example of connecting portions C3 of the green filters GF which are produced with excessive exposure. For example, as in Patent Literature 11, the photodiodes included in a solid-state image sensing element are each smaller than a pixel opening. Accordingly, the influence from the white spots C2 and the connecting portions C3 mentioned above is small.

However, in a liquid crystal display device which is provided with a backlight unit on the back surface, the white spots C2 cause light leakage. Further, the connecting portions C3 produced with excessive exposure increase the area ratio of the green filters GF and break the color balance of red, green and blue. The liquid crystal display device according to the present embodiment can avoid the breakage of color balance and the white spots.

The color filter substrate 1 according to the present embodiment has linear patterns including band-shaped, striped or V-shaped linear patterns in which the same colors are arranged. Therefore, by preventing formation of the white spots C2 and the connecting portions C3 of a Bayer array, the color filter substrate 1 can be formed with high precision without forming any gap.

The color filter substrate 1 according to the present embodiment and a display device including the color filter substrate 1 are suitable, for example, for a high-definition display of 250 ppi or with a pixel width of not more than 25 μm.

In the present embodiment, the color filter CF is extended to the frame region 3 of the color filter substrate 1, that is, the color filter CF is formed in the effective display region 2 and the frame region 3. The thickness of the color filter CF in the effective display region 2 is substantially the same as the thickness of the color filter CF in the frame region 3. Such a configuration of the color filter substrate 1 can prevent formation of convex portions in the color filter substrate 1, which are the cause of impairing contrast. Further, since no light-shielding layer is formed in the frame region 3 in the color filter substrate 1, the processing for forming the light-shielding layer can be omitted.

Figure 10:
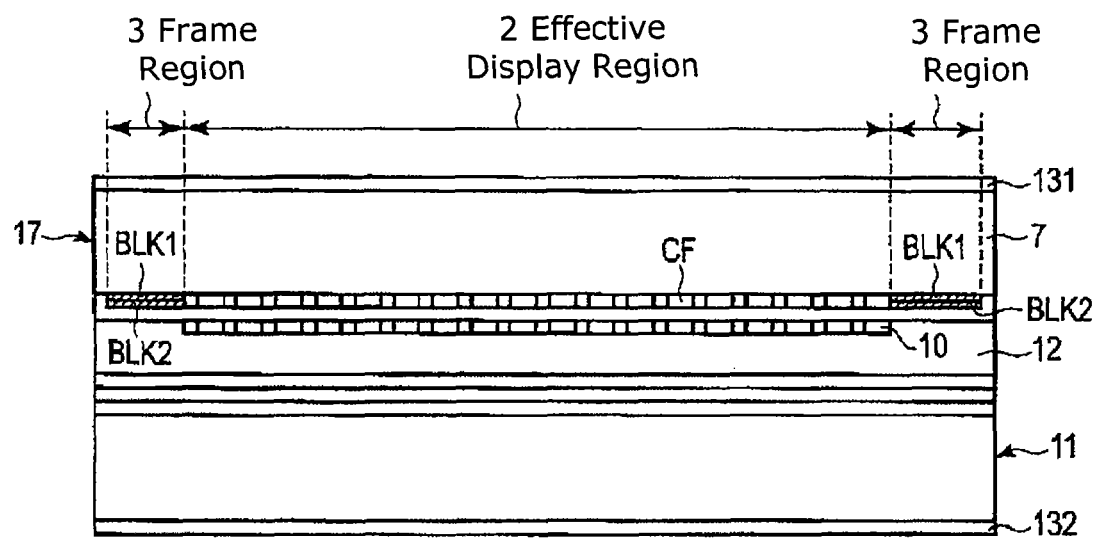
FIG. 10 is a cross-sectional view illustrating a modification of a color filter substrate according to the first embodiment.

However, for example, as shown in FIG. 10, a color filter substrate 17 may include the color filter CF in the effective display region 2 and may include the light-shielding layers BLK1 and BLK2 in the frame region 3.

In the present embodiment, the color filter layer 8 of the color filter substrate 17 includes the color filter CF in the effective display region 2 and includes the light-shielding layers BLK1 and BLK2 in the frame region 3. The light-shielding layers BLK1 and BLK2 are overlapped with each other in a thickness direction of the color filter substrate 17 (direction perpendicular to the liquid crystal display surface). In the color filter substrate 17, the thickness of the color filter CF in the effective display region 2 is substantially the same with the thickness of the light-shielding layers BLK1 and BLK2 as combined in the frame region 3. Such a configuration of the color filter substrate 17 can prevent formation of convex portions (projections) in the color filter substrate 17, which are the cause of impairing contrast.

Second Embodiment

The present embodiment is a modification of the first embodiment described above. In the present embodiment, a modification of a method for forming the green filters GF is described.

FIGS. 11A to 11D are cross-sectional views each illustrating an example of an intermediate product in each of the processing related to the method for forming the green filters GF according to the present embodiment.

Figure 11A:
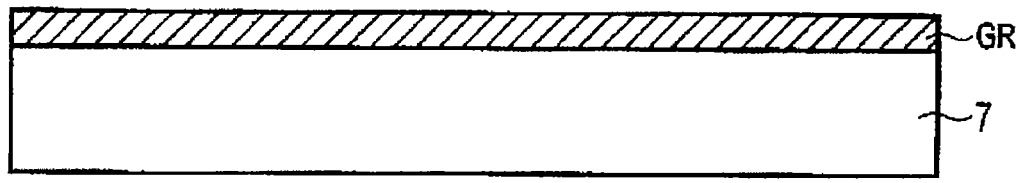
FIG. 11A is a cross-sectional view illustrating an example of an intermediate product formed in a process related to a method of forming a green filter GF according to the second embodiment.

As shown in FIG. 11A, the green resist GR is formed on the transparent substrate 7. For example, the green resist GR is coated onto the entire surface of the transparent substrate 7 so as to have a dry coating thickness of 2.5 μm, followed by drying and film curing.

Figure 11B:
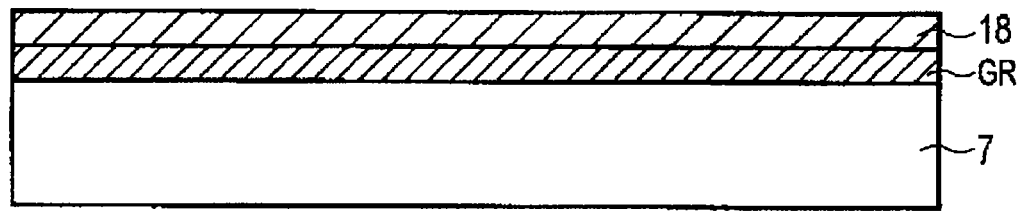
FIG. 11B is a cross-sectional view illustrating an example of an intermediate product formed in a process related to a method of forming a green filter GF according to the second embodiment.

Then, as shown in FIG. 11B, a positive photosensitive resist layer 18 is formed on the green resist GR.

Figure 11C:
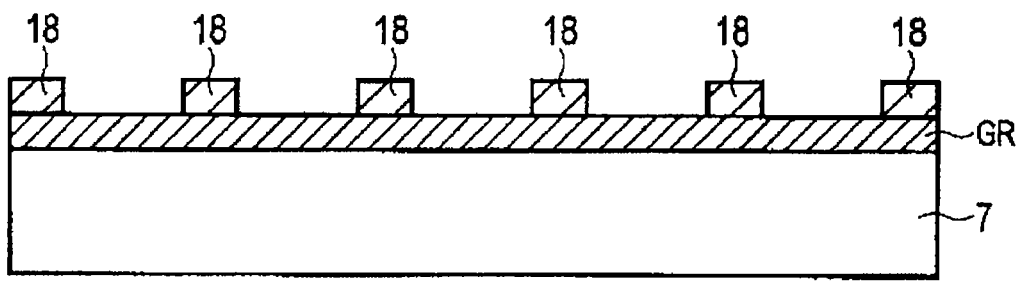
FIG. 11C is a cross-sectional view illustrating an example of an intermediate product formed in a process related to a method of forming a green filter GF according to the second embodiment.

Then, as shown in FIG. 11C, the positive photosensitive resist layer 18 is formed into linear patterns. The linear patterns are the same as the linear patterns of the green filters GF. For example, the linear patterns are formed using a known photolithography method.

Figure 11D:
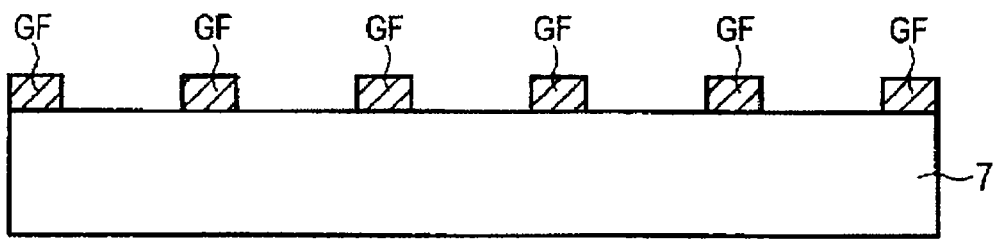
FIG. 11D is a cross-sectional view illustrating an example of an intermediate product formed in a process related to a method of forming a green filter GF according to the second embodiment.

Then, as shown in FIG. 11D, the green resist GR is dry-etched together with the linear patterns of the positive photosensitive resist layer 18. Thus, the linear patterns of the green filters GF are formed.

The linear patterns of the positive photosensitive resist layer 18 are removed at the time of the etching. However, the linear patterns of the positive photosensitive resist layer 18 may be partially left, or the linear patterns of the positive photosensitive resist layer 18 may be removed using a resist remover.

The endpoint of the etching can be determined by detecting the components, such as Si (silicon), of the transparent substrate 7 which is formed of glass. In order that the cross-sectional shape of each green filter GF is approximately vertical, it is preferable that the etching is anisotropic etching with which etching is performed in a vertical direction. The cross-sectional shape of each green filter GF can be controlled by the composition of a gas introduced to the etching apparatus, an etching rate, or a magnetic field condition.

As described in the first embodiment, the red and blue filters RF and BF are formed by means such as of a photolithography method.

It should be noted that dry etching is performed by using an etching apparatus, such as a reactive ion etching apparatus, or using Freon gas, oxygen, or a halogen compound gas, or the like. For example, etching is performed using $CF_4$ gas, $C_3F_8$ gas, or a mixed gas, such as a halogen compound gas. After that, the gas in the etching apparatus may be replaced by oxygen to perform slight etching. Thus, wettability can be improved in the substrate surface after formation of the green filters GF, fluidity can be improved in heat-curing the subsequently formed red and blue filters RF and BF, and the alignment error between the filters can be easily absorbed. In general, the blue resist BR tends to flow at the time of heat-curing. Therefore, it is preferable that the blue filters BF are formed secondly or thereafter in forming the color filter.

Third Embodiment

The present embodiment describes a modification of the color filter substrate and the manufacturing method therefor according to the first and second embodiments described above.

Figure 12A:
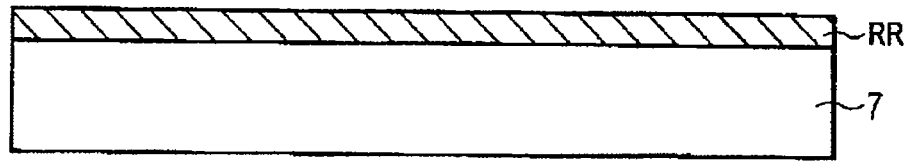
FIG. 12A is a cross-sectional view illustrating an example of an intermediate product formed in a process related to a method for manufacturing a color filter substrate according to a third embodiment.
Figure 12B:
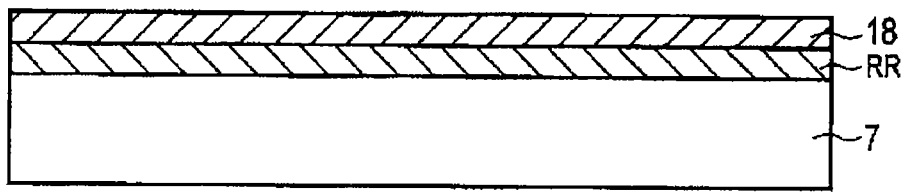
FIG. 12B is a cross-sectional view illustrating an example of an intermediate product formed in a process related to a method for manufacturing a color filter substrate according to a third embodiment.

FIGS. 12A and 12B are cross-sectional views each illustrating an intermediate product in each of the processing according to a method for manufacturing a color filter substrate 17 of the present embodiment.

In the color filter substrate 17 according to the present embodiment, in a plan view, each red filter RF is arranged between a green filter GF and a blue filter BF to divide the green filter GF from the blue filter BF.

In the present embodiment, the green filters GF and the blue filters BF each have a lateral width represented by W1. The red filters RF each have a lateral width represented by W2. W2 is substantially ½ of W1.

As shown in FIG. 12A, a red resist RR (red photosensitive coloring composition, first resist layer) is formed on the transparent substrate 7. For example, the red resist RR is coated onto the entire surface of the transparent substrate 7 so as to have a dry coating thickness of 2.5 μm, followed by drying and film curing.

Then, as shown in FIG. 12B, the positive photosensitive resist layer 18 is formed on the red resist RR.

Figure 12C:
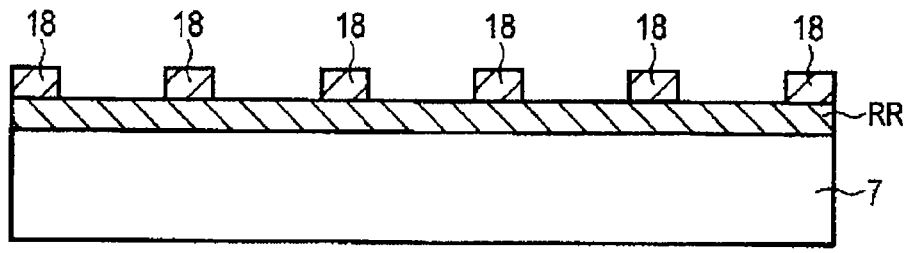
FIG. 12C is a cross-sectional view illustrating an example of an intermediate product formed in a process related to a method for manufacturing a color filter substrate according to a third embodiment.

Then, as shown in FIG. 12C, alignment is performed, for example, with reference to an end face of the substrate, to form the positive photosensitive resist layer 18 into linear patterns. The linear patterns are the same as the linear patterns of the red filters RF. The linear patterns and the alignment marks are formed, for example, by using a known photolithography method. In this case, the alignment marks 5 having a cross shape are formed in end portions of the substrate using, for example, the red resist RR.

Figure 12D:
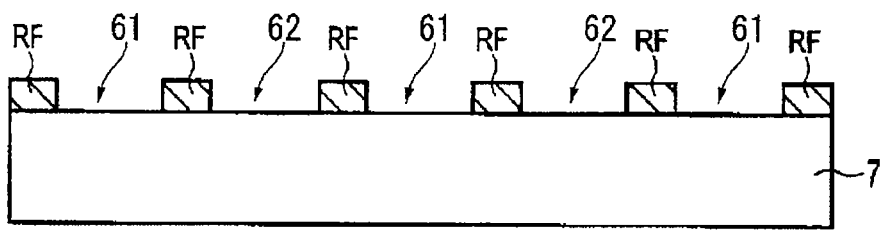
FIG. 12D is a cross-sectional view illustrating an example of an intermediate product formed in a process related to a method for manufacturing a color filter substrate according to a third embodiment.
Figure 12E:
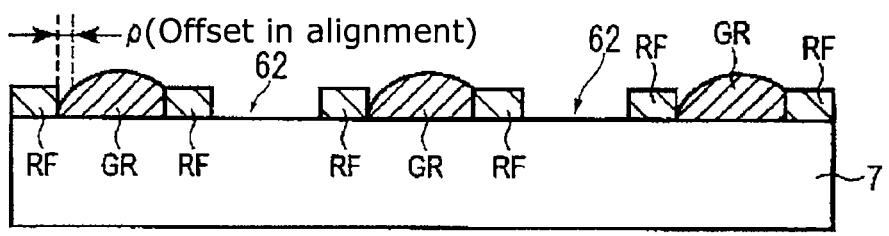
FIG. 12E is a cross-sectional view illustrating an example of an intermediate product formed in a process related to a method for manufacturing a color filter substrate according to a third embodiment.
Figure 12F:
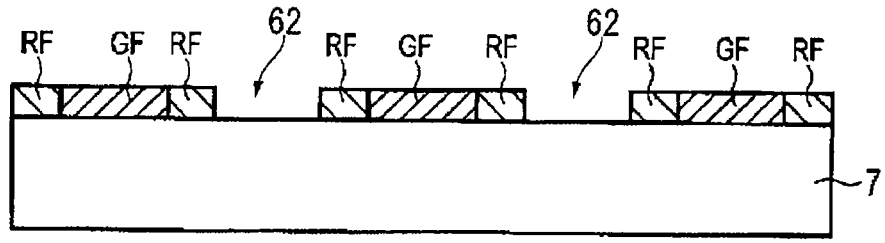
FIG. 12F is a cross-sectional view illustrating an example of an intermediate product formed in a process related to a method for manufacturing a color filter substrate according to a third embodiment.
Figure 12G:
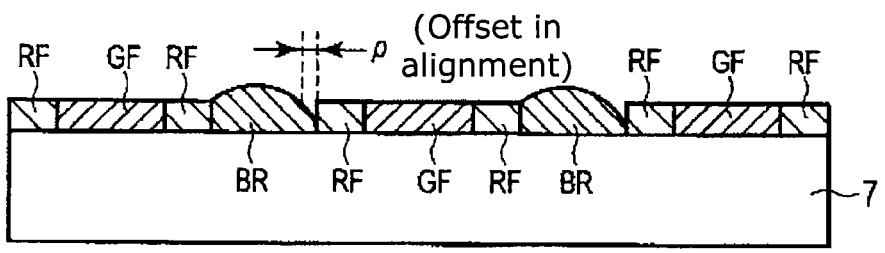
FIG. 12G is a cross-sectional view illustrating an example of an intermediate product formed in a process related to a method for manufacturing a color filter substrate according to a third embodiment.
Figure 12H:
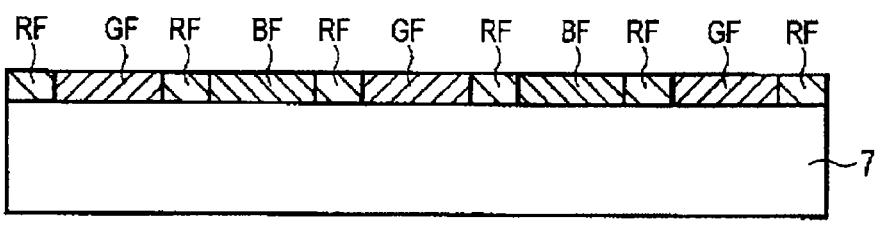
FIG. 12H is a cross-sectional view illustrating an example of an intermediate product formed in a process related to a method for manufacturing a color filter substrate according to a third embodiment.
Figure 12I:
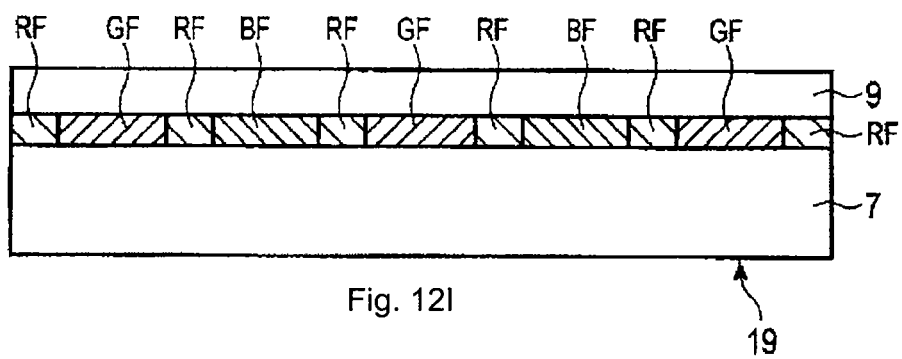
FIG. 12I is a cross-sectional view illustrating an example of an intermediate product formed in a process related to a method for manufacturing a color filter substrate according to a third embodiment.

Then, as shown in FIG. 12D, the red resist RR is dry-etched together with the linear patterns of the positive photosensitive resist layer 18. Thus, the red filters RF (first color filter) of linear patterns are formed.

The linear patterns of the positive photosensitive resist layer 18 are removed at the time of etching. However, the linear patterns of the photosensitive resist layer 18 may be partially left, or the linear patterns of the photosensitive resist layer 18 may be removed using a resist remover.

The endpoint of the etching can be determined by detecting the components, such as Si (silicon), of the transparent substrate 7 which is formed of glass. In order that the cross-sectional shape of each red filter RF is approximated to be vertical, it is preferable that the etching is anisotropic etching with which etching is performed in a vertical direction. The cross-sectional shape of each red filter RF can be controlled by the composition of a gas introduced to the etching apparatus, an etching rate, or a magnetic field condition.

FIGS. 12E to 12I are similar to FIGS. 4C to 4G, respectively. However, FIGS. 4C to 4G illustrate formation of the red filters GF (second color filter) and the blue filters BF (third color filter), which is different from FIGS. 12E to 12I in which the green filters GF (second color filter) and the blue filters BF (third color filter) are formed. Further, in the present embodiment, the green resist GR corresponds to the second resist layer.

In FIGS. 12E to 12I, the green and blue filters GF and BF are formed by means of a photolithography method, and the transparent resin layer 9 is stacked on the red, green and blue filters GF, GF and BF.

It should be noted that the red resist RR and the red filters RF contain a red pigment which is different from green pigments and blue pigments represented by phthalocyanine halide-based pigments. In the red pigment, less halogen and less metal (central metal of the pigment structure) are contained in the pigment structure, and thus the red pigment is suitable for dry etching. In other words, the red pigment is likely to suppress contamination caused by halogen or metal at the time of dry-etching. In general, the blue resist BR (blue coloring composition) used for forming the blue filters BF tends to flow at the time of heat-curing. Therefore, as described above, it is preferable that the blue filters BF are formed secondly or thereafter in the order of forming filters of a plurality of colors. Normally, the red and green filters RF and GF have higher transmittance than the blue filters BF. Therefore, at least either of the red and green filters RF and GF may have a line width that is ½ of the line width of the blue filters BF, and the filters having the ½ line width may be separately arranged. As blue color has a low human visibility, it is desirable not to divide the line width into ½.

Fourth Embodiment

The present embodiment describes a modification of the color filter substrate according to the first to third embodiments, a liquid crystal display device, and a method for manufacturing a color filter substrate according to the present embodiment.

Figure 13:
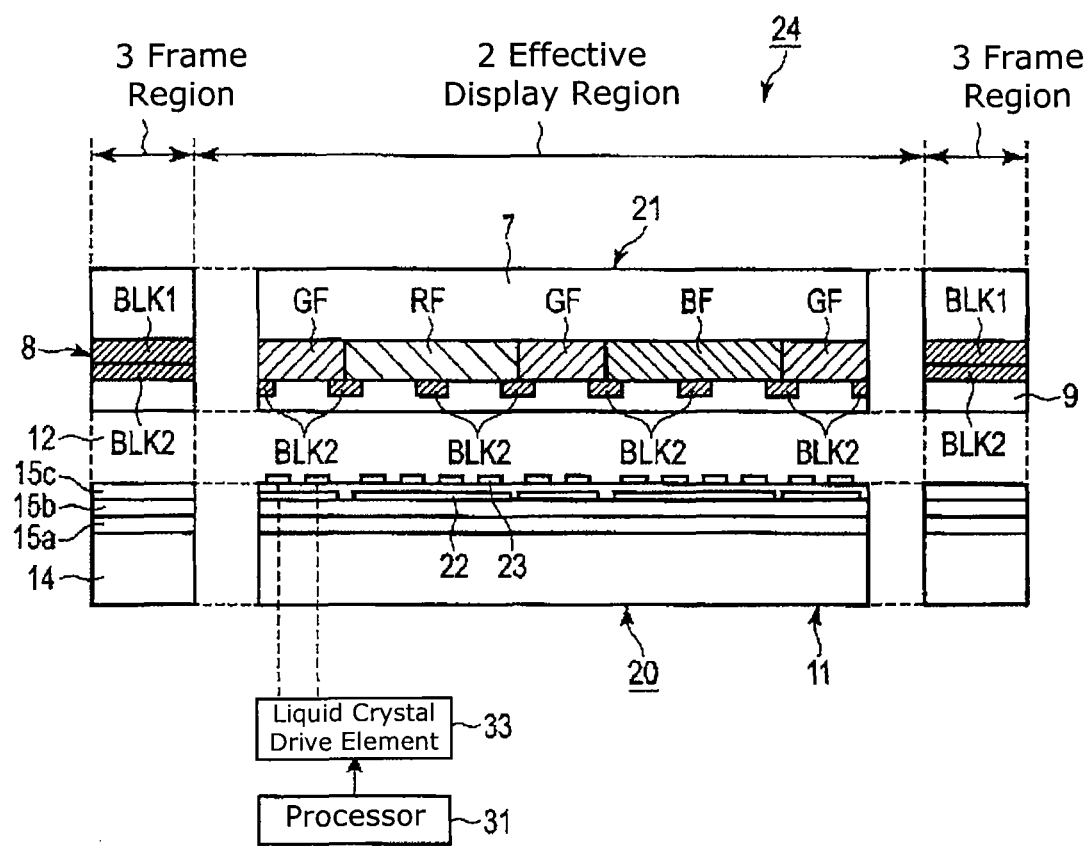
FIG. 13 is a cross-sectional view illustrating an example of a liquid crystal panel according to a fourth embodiment.

FIG. 13 is a cross-sectional view illustrating an example of a liquid crystal panel 20 according to the present embodiment. The liquid crystal panel 20 shown in FIG. 13 omits illustration of an oriented film, polarizing plate, an optical film, such as a polarizing film, and a retardation plate, and the like.

The liquid crystal panel 20 includes a color filter substrate 21, a counter substrate 11 and a liquid crystal layer 12. The color filter substrate 21 faces the counter substrate 11 via the liquid crystal layer 12.

The color filter substrate 21 is formed with a light-shielding layer BLK2 on a boundary between green and red filters GF and RF, a boundary between green and blue filters GF and BF, and on a pixel center line in a longitudinal direction of each red filter RF in a plan view, and on a pixel center line in a longitudinal direction of each blue filter BF in a plan view. Further, a transparent resin layer 9 is formed over the green, red and blue filters GF, RF and BF, as well as the light-shielding layer BLK2.

The array substrate 11 includes an insulating layer 15b on which plate-shaped common electrodes 22 are formed for respective pixels. An insulating layer 15c is formed over the insulating layer 15b on which the common electrodes 22 are formed. Further, pixel electrodes 23 are formed on the insulating layer 15c. A plurality of pixel electrodes 23 are formed on each of the pixels. The plurality of electrodes 23 provided to each pixel are arranged so as to be symmetric about a longitudinal pixel center line in a plan view. For example, the common electrodes 22 and the pixel electrodes 23 may be formed into comb-shaped, band-shaped, linear or striped patterns. The common electrodes 22 and the pixel electrodes 23 may contain electrically conductive metal oxide. As the electrically conductive metal oxide, for example, a transparent electrically conductive film such as ITO can be used.

The plurality of pixel electrodes 23 formed on each of the pixels are connected to liquid crystal drive elements 33. As mentioned above, the lateral width W2 of each green filter GF is substantially ½ of the lateral width W1 of each blue or red filter BF or RF. The number of liquid crystal drive elements 33 in each pixel depends on the lateral width of the filter. Specifically, in a pixel corresponding to a green filter GF (first color filter) of the lateral width W2 that is ½ of the lateral width W1, one liquid crystal drive element is connected to the pixel electrodes 23.

Further, in a pixel corresponding to a red filter RF (second color filter) of the lateral width W1 that is twice of the lateral width W2, two liquid crystal drive elements are connected to the pixel electrodes 23.

Similarly, in a pixel corresponding to a blue filter BF (third color filter) of the lateral width W1 that is twice of the lateral width W2, two liquid crystal drive elements are connected to the pixel electrodes 23.

In other words, a plurality of liquid crystal drive elements 33 are arrayed at regular pitch in the array substrate. When the color filter substrate is arranged being opposed to the array substrate, the red and blue filters RF and BF of the lateral width W1 that is twice of the lateral width W2 will each face two liquid crystal drive elements, while each green filter GF of the lateral width W2 will face one liquid crystal drive element.

The liquid crystal layer 12 includes liquid crystal molecules having negative dielectric anisotropy. The liquid crystal molecules each have a longitudinal axis (longitudinal direction) which is parallel to the substrate plane. However, the liquid crystal molecules may have positive dielectric anisotropy.

In the liquid crystal panel 20, the pixel electrodes 23 and the common electrodes 22 are formed via the insulating layer 15c.

A control unit 31 controls the liquid crystal drive elements 33 and switches the application state of a liquid crystal drive voltage across the pixel electrodes 23 and the common electrodes 22. Upon application of the liquid crystal drive voltage across the pixel electrodes 23 and the common electrodes 22, the liquid crystal molecules of the liquid crystal layer 12 are driven. In a state of being applied with the liquid crystal drive voltage, the liquid crystal molecules of the liquid crystal layer 12 are rotated in a horizontal direction.

In the color filter substrate 21 of the present embodiment, the red, green and blue filters RF, GF and BF are formed, for example, into rectangular or polygonal patterns, in a plan view, on the transparent substrate 7.

The color filter substrate 21 has an effective display region 2 in which the red, green and blue filters RF, GF and BF are formed, and has a frame region 3 in which light-shielding layers BLK1 and BLK2 are formed.

The light-shielding layer BLK2 has a coating film pattern that contains organic pigments as a main material (main body, main agent, or main component) of visible area light-shielding color materials. It should be noted that the main material of the light-shielding color material refers to a pigment having a mass exceeding 50%, in terms of mass ratio, relative to the mass of all the pigments of the light-shielding color materials. In the effective display region 2, the transparent resin layer 9 is formed covering the red, green and blue filters RF, GF and BF via the light-shielding layer BLK2.

For example, in the present embodiment, the light-shielding layer BLK2 in the effective display region and the light-shielding layer BLK2 in the frame region are formed after forming the red, green and blue filters RF, GF and BF.

The frame region 3 corresponds to an outer peripheral portion of the effective display region 2 (pixel matrix portion). The frame region 3 includes the light-shielding layer BLK1 that contains carbon as a main material (main body, main agent, or main component) of visible area light-shielding color materials. In the frame region 3, the light-shielding layers BLK1 and BLK2 are overlapped with each other to improve the light-shielding effect in the frame region 3.

In the present embodiment, the alignment marks 5 are formed using the same color material as that of the light-shielding layer BLK1, when forming the light-shielding layer BLK1. It should be noted that, when no light-shielding layer BLK1 is formed in the color filter substrate 21, the alignment marks 5 may be formed using the green resist GR for forming the green filters GF that are placed as a first color.

Figure 16:
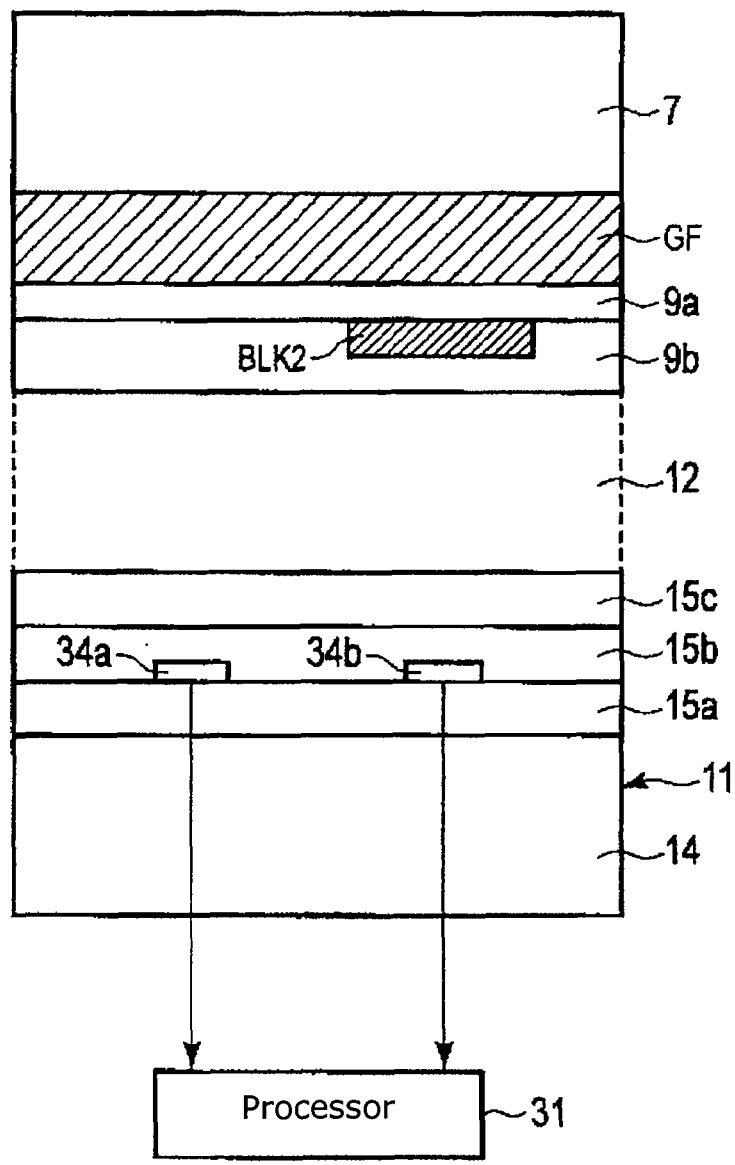
FIG. 16 is a cross-sectional view illustrating an example of a liquid crystal panel according to the fourth embodiment.

As a modification of the present embodiment, as shown in FIG. 16, for example, a transparent resin layer 9a may be formed on the color filter CF (the green filter GF in FIG. 16), followed by forming the light-shielding layer BLK2, as a black matrix, on the transparent resin layer 9a, and further forming alignment marks of the light-shielding layer BLK2 on the alignment marks 5. In this case, the transparent resin layer 9a may be formed with a large thickness, while a transparent resin layer 9b may be formed with a small thickness. In this case, the alignment marks formed with the light-shielding layer BLK2 can be permitted to be closer to the array substrate 11 in a thickness direction of the alignment marks, thereby improving the alignment precision as a liquid crystal cell. The alignment marks 5 formed by the light-shielding layer BLK1 are apart from the array substrate 11 in its thickness direction by a distance corresponding to the thickness of the color filter CF. The black matrix formed of the light-shielding layer BLK2 is located near the liquid crystal layer 12, and hence color mixing into adjacent pixels can be suppressed, the color mixing being unique to a horizontal electric field method or an IPS method.

The liquid crystal display device 24 may be of a horizontal electric field method or an IPS method. The pixel electrodes 23 may have comb-shaped patterns extending perpendicular to the paper surface of FIG. 13. The pixel electrodes 23 are formed on the insulating layer 15c, while the common electrodes 22 are formed under the insulating layer 15c. When the liquid crystal display device 24 is of an IPS method, the color filter substrate 21 normally does not include the counter electrodes which are transparent electrodes.

Figure 14:
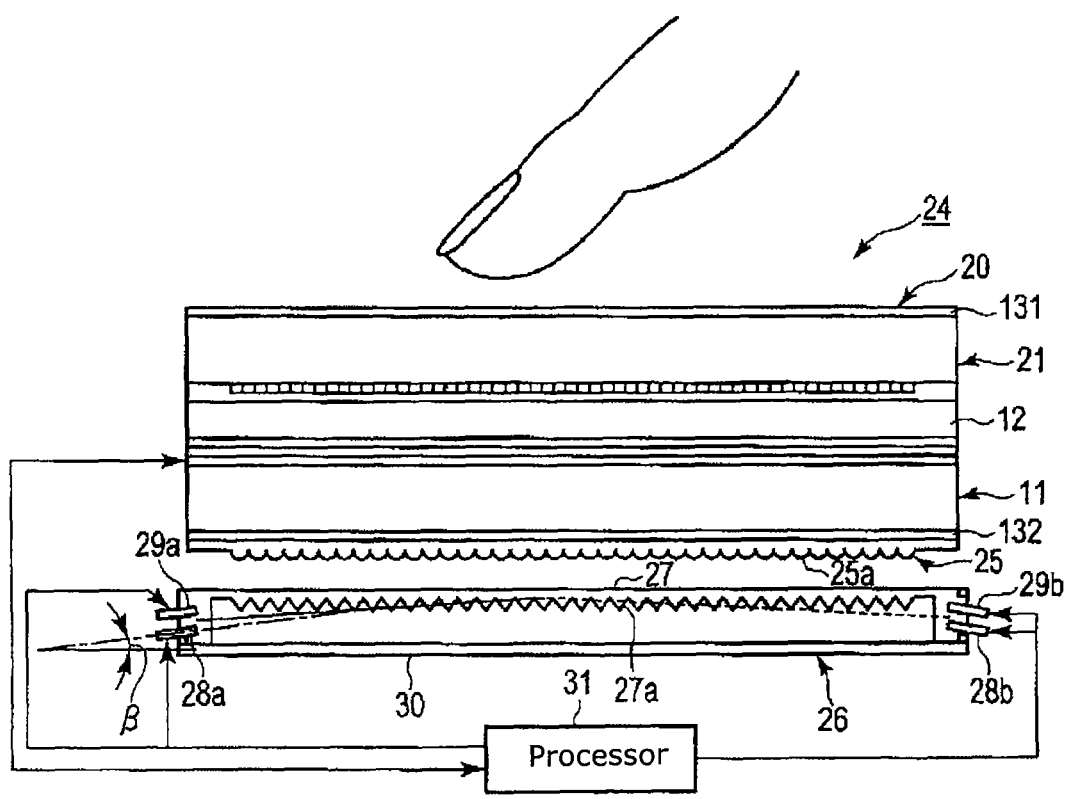
FIG. 14 is a cross-sectional view illustrating an example of a liquid crystal display device according to the fourth embodiment.

FIG. 14 is a cross-sectional view illustrating an example of the liquid crystal display device 24 according to the present embodiment. FIG. 14 is a cross-sectional view along a lateral direction of the liquid crystal display device 24.

The liquid crystal display device 24 includes the liquid crystal panel 20, polarizing plates 131 and 132, angle controllers 50a and 51a, a light control element 25 and a backlight unit 26. The present embodiment describes the liquid crystal display device 24 including the liquid crystal panel 20 which is provided, for example, with the light control element 25 and the backlight unit 26, while the liquid crystal panel 20, per se, may be called a liquid crystal display device.

The liquid crystal panel 20 has a front surface (second plane side of the transparent substrate 7) which is provided with the polarizing plate 131. The liquid crystal panel 20 has a back surface (second plane side of the transparent substrate 14) which is provided with the polarizing plate 132.

The polarizing plates 131 and 132 may be formed by bonding a plurality of retardation plates to each other. The polarizing plates 131 and 132 in a pair may have a cross-Nicol configuration. For example, the paired polarizing plates 131 and 132 have respective absorption axes parallel to each other. The liquid crystal display device 24 may include a solid-state light emitting element which is located between a first polarizing plate that is either of the polarizing plates 131 and 132 and the liquid crystal panel 20 so that first linear polarized light of the first polarizing plate is converted to second linear polarized light that is perpendicular to the first linear polarized light.

The light control element 25 includes an array of semi-circular column lenses 25a. The light control element 25 is located between the polarizing plate 132 and the backlight unit 26.

The backlight unit 26 is located on a back surface side of the liquid crystal panel 20 via the polarizing plate 132 and the light control element 25. The backlight unit 26 may include, for example, a diffuser plate, a light guide plate, a polarization distributor film, and a retroreflection polarizing element, which however are omitted from FIG. 14.

The backlight unit 26 includes the angle controllers 50a and 51a, a light control element 27, solid light emitting elements 28a, 28b, 29a and 29b, and a reflector plate 30. As shown in FIG. 30B, the angle controllers 50a and 51a are provided to the solid light emitting elements 28a and 29a, respectively. As will be specifically described below, the angle controllers 50a and 51a have a function of adjusting the angle of light emitted from the solid light emitting elements 28a and 29a.

The light control element 27 includes an array of triangular prisms 27a

The plurality of solid light emitting elements 28a and 28b emit visible light.

The plurality of solid light emitting elements 29a and 29b emit infrared or ultraviolet light.

The plurality of solid light emitting elements 28a and 29b may, for example, be white LEDs which have light emission wavelength range including three wavelengths of red, green and blue, and emit white light. The solid light emitting elements 28a and 28b may, for example, be pseudo-white LEDs each of which is a combination of a GaN-based blue LED and a YAG-based fluorescent material. In order to enhance the color rendering effect, the solid light emitting elements 28a and 28b may each include an LED, such as a red LED, having major peaks of one or more colors, for use together with the pseudo-white LEDs. The solid light emitting elements 28a and 28b that can be used include, for example, light sources in each of which a blue LED is stacked with red and green phosphors.

The plurality of solid light emitting elements 28a and 28b may each include LEDs that separately emit any of red, green and blue light. For example, the control unit 31 allows the red, green and blue LEDs to emit light in a time-division manner (field sequential manner), and synchronously controls the red, green and blue LEDs and the pixels of the liquid crystal display device 24. Thus, full-color display can be achieved.

The infrared or ultraviolet light that is invisible light emitted from the plurality of solid light emitting elements 29a and 29b is used as illumination light for a pointer, such as a finger, over the liquid crystal display screen. The liquid crystal display device 24 includes a plurality of matrix optical sensors (light-receiving elements) such as on the array substrate 11, and enables touch sensing by detecting reflected light of the illumination light reflected such as from a pointer. Thus, the liquid crystal display device 24 is able to detect the position and the movement of the pointer. Another example of the optical sensors that may be used includes an imaging device (camera), such as CMOS or CCD, which is mounted to a housing of a liquid crystal display device. In addition to touch sensing and imaging, such optical sensors may be used for biometric authentication or personal authentication.

The solid light emitting elements 29a and 29b may each be formed by coating a phosphor for infrared light conversion onto a blue or violet LED. The solid light emitting elements 29a and 29b may be semiconductor lasers that emit infrared light. The solid light emitting elements 29a and 29b may, for example, be infrared light LEDs such as of GaAsP, GaAlAs or AlGaInP. The solid light emitting elements 29a and 29b may, for example, be provided to an end portion, a side portion or a corner portion of the backlight unit 26 in a plan view. The solid light emitting elements 29a and 29b may be juxtaposed to the row of, or juxtaposed alternately with, the solid light emitting elements 28a and 28b, such as red, green and blue LEDs. In the backlight unit 26, the solid light emitting elements 28a and 28b, as well as the solid light emitting elements 29a and 29b, may be arranged in a line.

In touch sensing of the liquid crystal display device 24, near-infrared light is emitted from the solid light emitting elements 29a and 29b, the near-infrared light being in a light wavelength range, for example, of 700 nm to 1,100 nm, or from 800 nm to 1,000 nm. The near-infrared light is radiated from the backlight unit 26 by way of the front surface of the liquid crystal panel 20 to illuminate a pointer. The re-reflected light from the pointer is received by the optical sensors, and the light reception enables touch sensing. It is desirable that the timing of touch sensing and the timing of emitting the near-infrared light is synchronized by the control unit 31. For example, in the case of using near-infrared light having a light wavelength larger than 800 nm and hardly visually recognizable by the human eye, the near-infrared light may be constantly emitted. In addition, for color separation of blue, green and red, it is preferable to use near-infrared light emission with a light wavelength larger than 800 nm which is unlikely to influence the color separation.

Figure 15A:
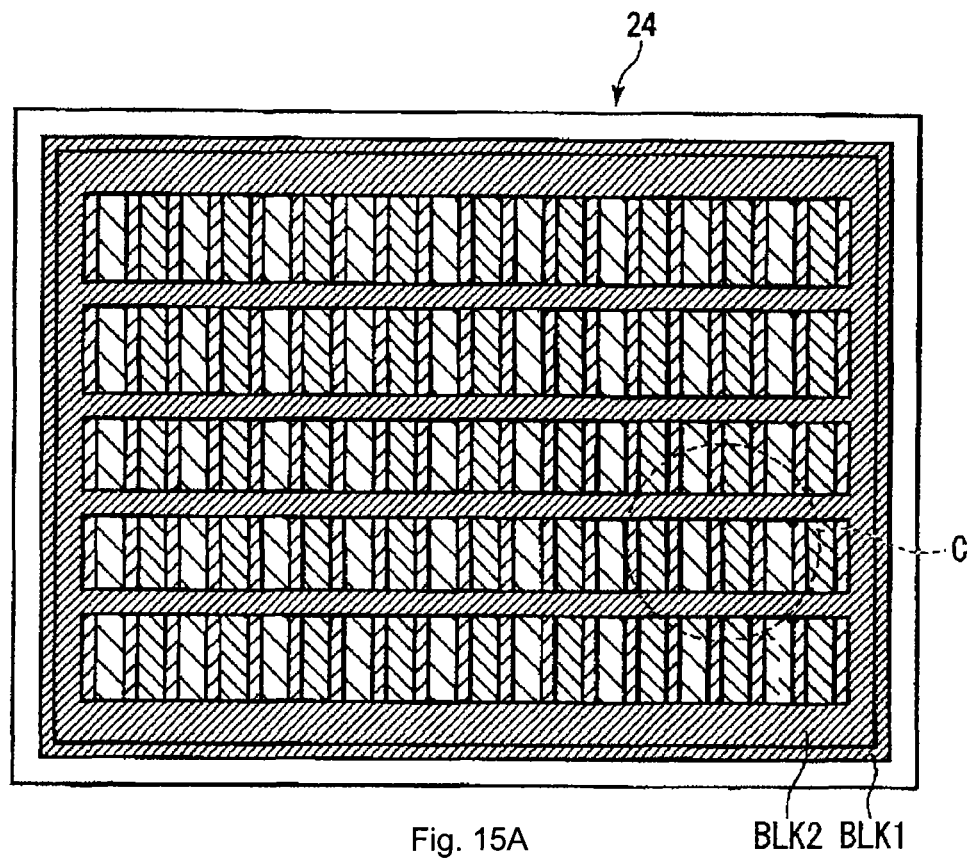
FIG. 15A is a plan view illustrating an example of a liquid crystal display device according to the fourth embodiment.
Figure 15B:
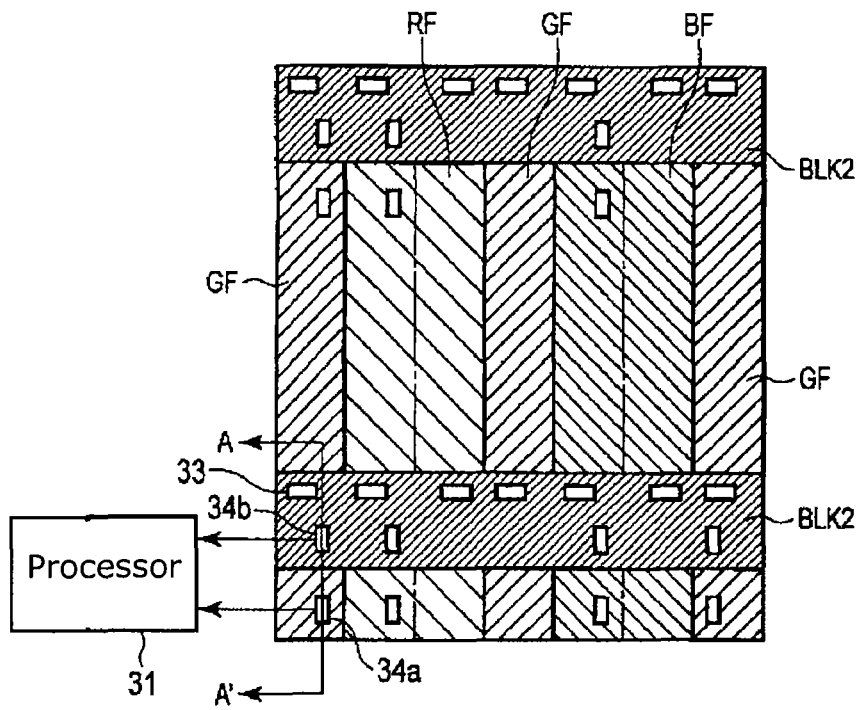
FIG. 15B is a plan view illustrating an example of a liquid crystal display device according to the fourth embodiment, that is, an enlarged view illustrating a part indicated by a reference sign C in FIG. 15A.

FIGS. 15A and 15B are plan views illustrating an example of the liquid crystal display device 24 according to the present embodiment. FIGS. 15A and 15B illustrate a state where the liquid crystal display device 24 is viewed from the second plane side of the transparent substrate 7 of the color filter substrate 21, i.e. from an observer side.

FIG. 16 is a cross-sectional view illustrating an example of the liquid crystal panel 20 provided to the liquid crystal display device 24. FIG. 16 is a cross section taken along A-A' of FIG. 15B. As shown in FIG. 16, the transparent resin layer 9a is formed on a green filter GF, the light-shielding layer BLK2 is partially formed on the transparent resin layer 9a, and the transparent resin layer 9b is formed on the transparent resin layer 9a and the light-shielding layer BLK2.

As described above, the light-shielding layer BLK2 includes organic pigments as a main material of the visible area light-shielding color materials.

In a plan view, or in a thickness direction, an optical sensor 34a (first optical sensor) overlaps with the green filter GF. Accordingly, the optical sensor 34a generates measurement data of the light that has been transmitted through the green filter GF.

In a plan view, or in a thickness direction, an optical sensor 34b (second optical sensor) overlaps with the green filter GF and the light-shielding layer BLK2. Accordingly, the optical sensor 34b generates measurement data of the light that has been transmitted through the green filter GF and the light-shielding layer BLK2.

The optical sensor 34b may be used as an optical sensor for touch sensing. In this case, the control unit 31 synchronously controls the light-emitting timing of the solid light emitting elements 29a and 29b and the light-receiving timing of the optical sensor 34b.

A liquid crystal drive element electrically connected to the pixel electrodes 23 is provided under the light-shielding layer BLK2 corresponding to a green pixel.

Figure 17:
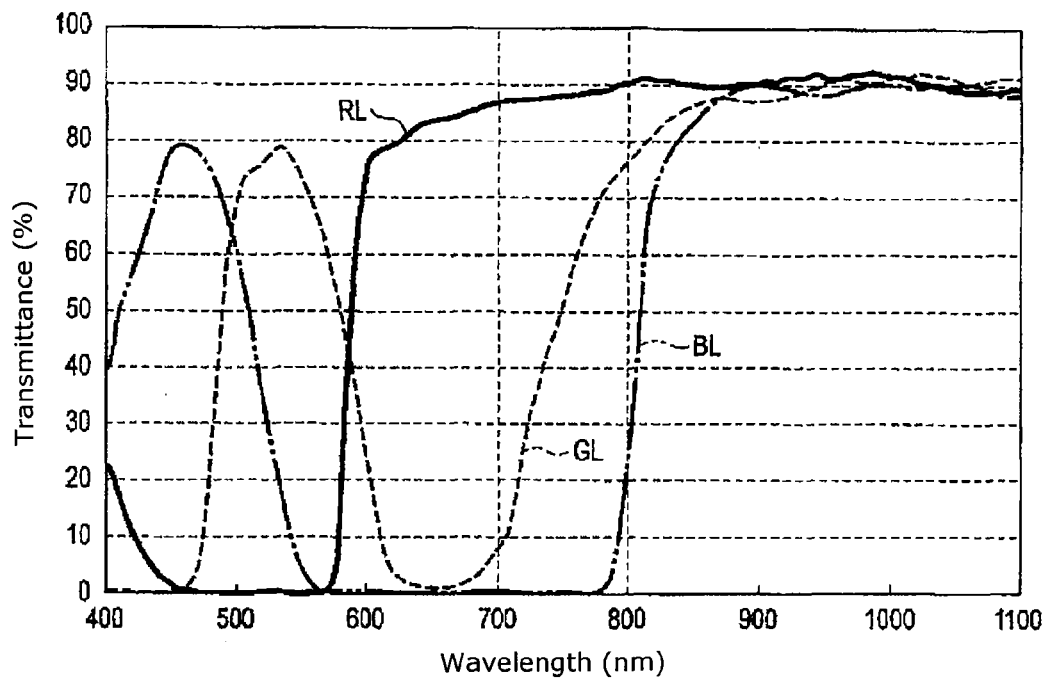
FIG. 17 is a graph illustrating an example of transmittance characteristics of a color filter according to the fourth embodiment.

FIG. 17 is a graph illustrating an example of transmittance characteristics of the color filter CF according to the present embodiment.

The color filter CF applied to the liquid crystal display device 24 includes the red filters RF, the green filters GF and the blue filters BF. Characteristics RL represent spectroscopic characteristics of the red filters RF. Characteristics GL represent spectroscopic characteristics of the green filters GF. Characteristics BL represent spectroscopic characteristics of the blue filters BF.

The red, green and blue filters RF, GF and BF have a transmittance corresponding to a long wavelength that is greatly different from light wavelength of about 700 nm.

Accordingly, when the liquid crystal display device 24 having the optical sensor 34a is used as a color copier or an imaging device, high-definition color separation between red, green and blue is difficult in a light wavelength of the near-infrared range, for example, of about 700 nm to 1,100 nm, unless the light-receiving components are removed.

A semiconductor such as of amorphous silicon or polysilicon, which is included, for example, in a thin-film transistor is exposed with a light wavelength range of about 400 nm to 1,100 nm.

Figure 18:
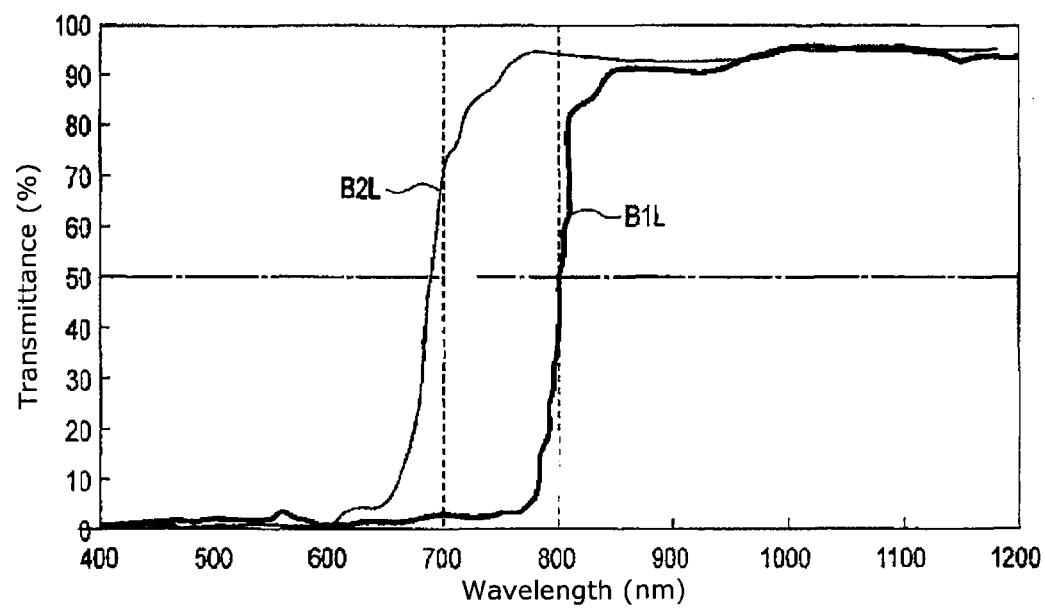
FIG. 18 is a graph illustrating an example of light-shielding characteristics B1L of a light-shielding layer BLK1 and light-shielding characteristics B2L of a light-shielding layer BLK2 according to the fourth embodiment.

FIG. 18 shows light-shielding characteristics of the light-shielding layer BLK2 of the present embodiment. FIG. 18 shows representative examples of light-shielding characteristics B1L and light-shielding characteristics B2L of the light-shielding layer BLK2.

The light-shielding layer BLK1 contains carbon as a main light-shielding color material. As indicated by BLKC in FIG. 33, the light-shielding layer BLK1 has light transmission suppression characteristics in a long wavelength range including a light wavelength of 400 nm to 1000 nm.

The light-shielding layer BLK2 exhibits transmittance that rises near a light wavelength of about 700 nm and becomes high in a long light wavelength range larger than a light wavelength of about 750 nm. The light-shielding layer BLK2 enables suppression of light transmission in a light wavelength range smaller than a light wavelength of about 660 nm.

In a long wavelength range larger than 660 nm, the light wavelength that allows the transmittance of the light-shielding layers BLK1 and BLK2 to be 50% (hereinafter referred to as half-value wavelength) is adjustable in a range of 670 nm to 800 nm by the selection or mixing of organic pigments.

Figure 19:
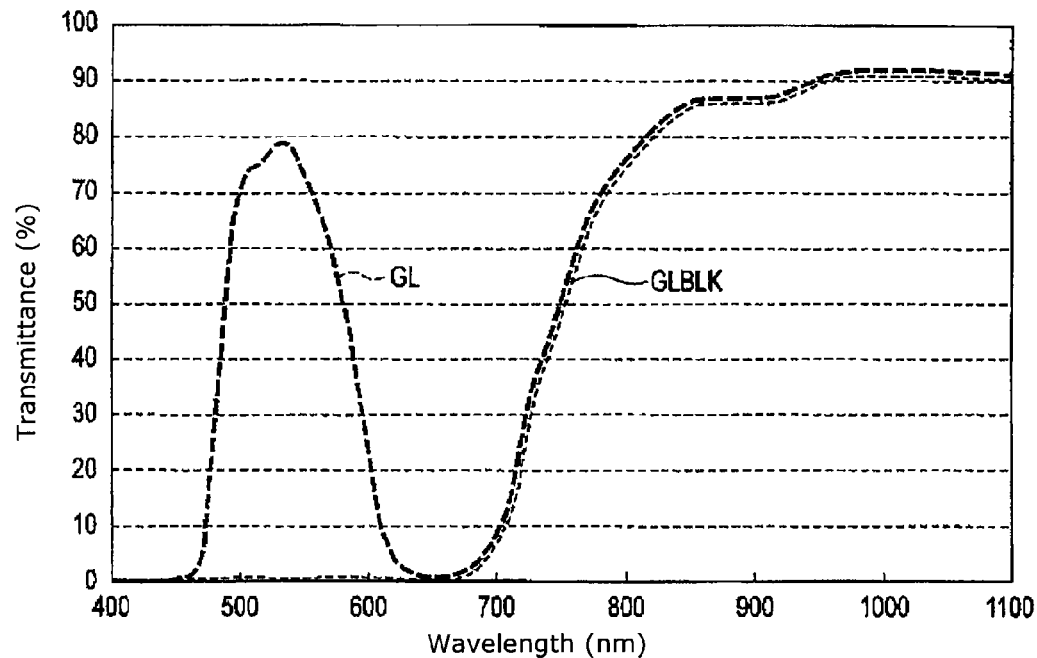
FIG. 19 is a graph illustrating an example of transmission characteristics of a green filter, and transmission characteristics of optically overlapped green filter and light-shielding layer.

FIG. 19 is a graph illustrating an example of transmittance characteristics GL of the green filters GF and transmittance characteristics GLBLK obtained by optically overlapping the green filters GF with the light-shielding layer BLK2.

When a single color layer of the red filter RF or of the blue filter BF or of the green filter GF included in the color filter CF is overlapped with the light-shielding layer BLK2 to detect light, the overlapped portion may be referred to as an optical overlap portion.

High precision detection data of green in a visible light range are obtained by subtracting light detection data detected by optically overlapping the green filters GF with the light-shielding layer BLK2 from the light detection data detected by way of the green filters GF.

Thus, subtraction of light detection data detected by optically overlapping the green filters GF with the light-shielding layer BLK2 from the light detection data detected by way of the green filters GF, enables extraction of only the detection data of green in the visible light range.

Figure 20:
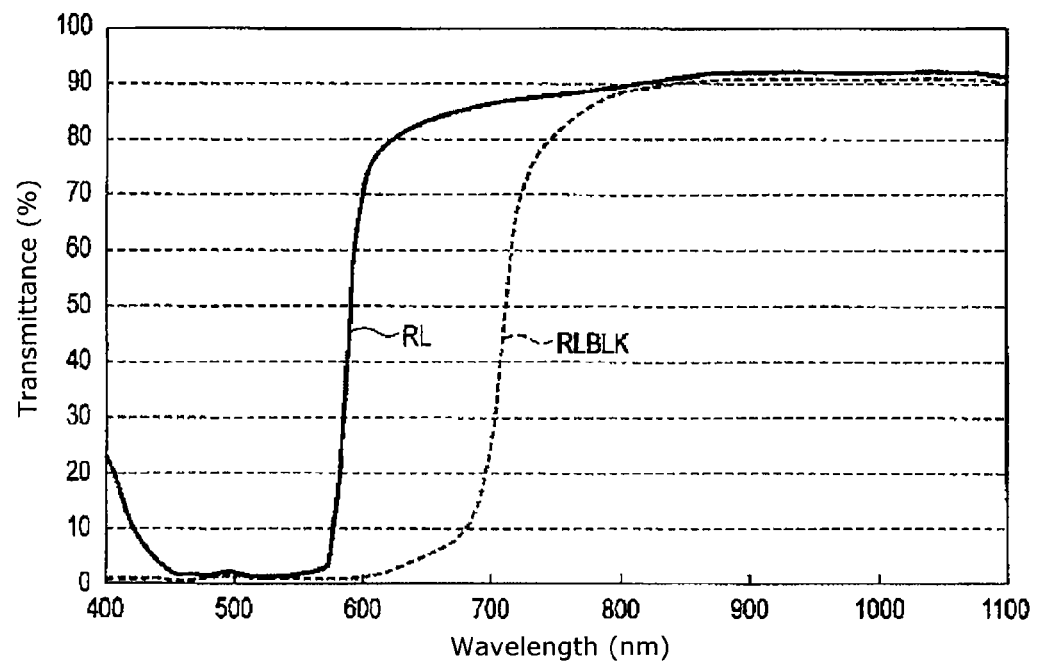
FIG. 20 is a graph illustrating an example of transmission characteristics of a red filter, and transmission characteristics of optically overlapped red filter and light-shielding layer.

FIG. 20 is a graph illustrating an example of transmittance characteristics RL of the red filters RF and transmittance characteristics or RLBLK obtained by optically overlapping the red filters RF with the light-shielding layer BLK2.

High precision detection data of red in a visible light range are obtained by subtracting light detection data detected by optically overlapping the red filters RF with the light-shielding layer BLK2 from the light detection data detected by way of the red filters RF.

Thus, subtraction of light detection data detected by optically overlapping the red filters RF with the light-shielding layer BLK2 from the light detection data detected by way of the red filters RF, enables extraction of only the detection data of red in the visible light range.

Figure 21:
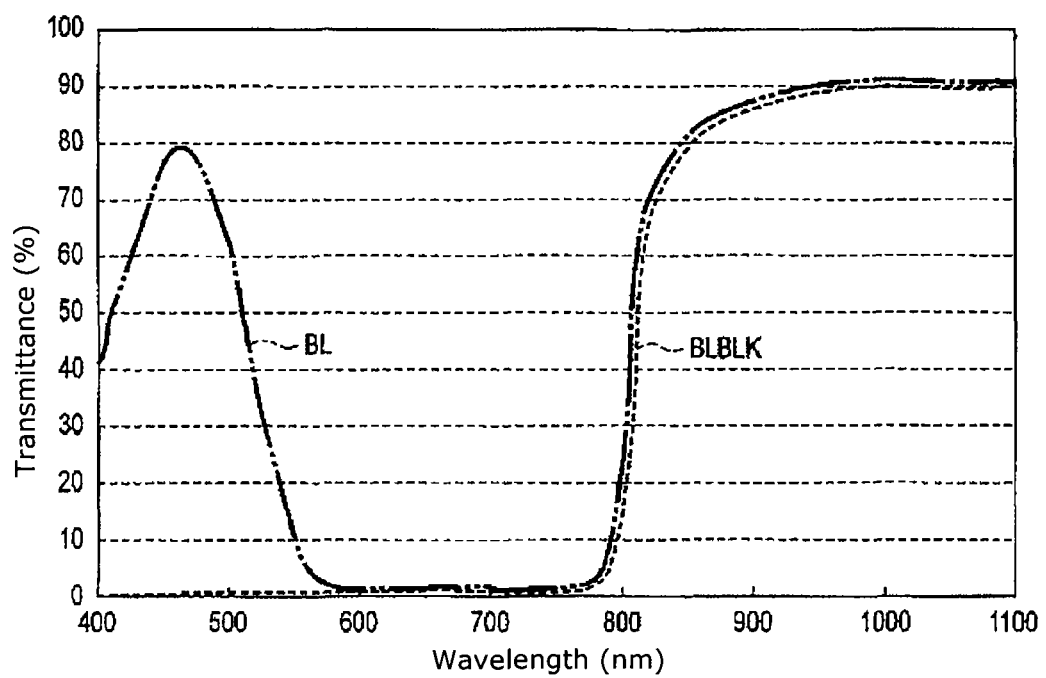
FIG. 21 is a graph illustrating an example of transmission characteristics of a blue filter, and transmission characteristics of optically overlapped blue filter and light-shielding layer.

FIG. 21 is a graph illustrating an example of transmittance characteristics BL of the blue filters BF and transmittance characteristics or BLBLK obtained by optically overlapping the blue filters BF with the light-shielding layer BLK2.

High precision detection data of blue in a visible light range are obtained by subtracting light detection data detected by optically overlapping the blue filters BF with the light-shielding layer BLK2 from the light detection data detected by way of the blue filters BF.

Thus, subtraction of light detection data detected by optically overlapping the blue filters BF with the light-shielding layer BLK2 from the light detection data detected by way of the blue filters BF, enables extraction of only the detection data of blue in the visible light range.

The subtraction processing described above are performed, for example, by the control unit 31. The optical sensor 1 generates light detection data by way of the green filters GF. The optical sensor 34b generates light detection data by way of the green filters GF and the light-shielding layer BLK2.

The detection data of the optical sensor 34a include a green exposed component and an exposed component of near-infrared range. However, the control unit 31 is able to extract the detection data of only the green component in a portion of the visible light range by subtracting the detection data of the optical sensor 34b from the detection data of the optical sensor 34a. It should be noted that, by replacing the green filters GF with the red or blue filters RF or BF, detection data of red or blue components, respectively, of the visible light range can be extracted.

When a photosensitive semiconductor is used as an optical sensor, it is desirable that the band gap is adjusted to give a photosensitive range of the optical sensor to an aimed wavelength range. In an SiGe semiconductor, the band gap can be continuously changed by the addition ratio of Ge, thereby enabling adjustment of the light-receiving wavelength of a light-receiving element configured by the SiGe semiconductor and impartment of sensitivity in an infrared range. An SiGe semiconductor permitted to possess a concentration gradient of Ge can also be realized. For example, use of a compound semiconductor such as of GaAs, InGaAs, PbS, PbSe, SiGe or SiGeC enables formation of an optical sensor suitable for detecting infrared light. In the case of using a transistor having a channel layer of a metal oxide, such as IGZO or ITZO, as an optical sensor (phototransistor), it is desirable that the channel layer is subjected to doping to impart sensitivity to the visible range or the infrared range.

As the optical sensors 34a and 34b used for separating light in a broad range, silicon photodiodes, for example are selected. A pin or pn structure may be applied to the silicon photodiodes. From a viewpoint of efficiency, it is preferable that, in a silicon-based photodiode, light is incident on a surface of a p-type semiconductor. However, light may be permitted to be incident on a surface of an n-type semiconductor, as necessary. A p-type semiconductor film may be formed by means of plasma CVD using a semiconductor material gas that contains boron (B) or the like. An n-type semiconductor film may be formed by means of plasma CVD using a semiconductor material gas that contains phosphorus (P) or the like. An i-type semiconductor film may be formed by means of plasma CVD using a semiconductor material not containing these impurities. Such a semiconductor film may be of amorphous silicon, polysilicon or semi amorphous.

The optical sensors 34a and 34b each configured by a silicon semiconductor can be switched by a thin-film transistor having a channel layer formed of a metal oxide. Alternatively, the optical sensors 34a and 34b each configured by a silicon semiconductor can be switched by a thin-film transistor formed of amorphous silicon or polysilicon. The property of the film of silicon may be continuously changed from amorphous silicon to polysilicon. For example, in the case where the thin-film transistor includes a channel layer that contains two or more metal oxides among gallium, indium, zinc, tin, hafnium and yttrium, the thin-film transistor has a high mobility with small leak current. Therefore, the thin-film transistor can perform switching at high speed and with low power consumption. When the optical sensors 34a and 34b are switched by a thin-film transistor including a channel layer that contains a metal oxide, the intensity distribution of light detected by the optical sensors 34a and 34b can be converted to electrical signals with good reproducibility and with small variation. It should be noted, that switching of the optical sensors 34a and 34b herein refers to selection of the optical sensor 34a, 34b by a thin-film transistor, or resetting of the optical sensor 34a, 34b by the thin-film transistor. In the present embodiment, output wiring lines of the optical sensors 34a and 34b may be connected to the source electrode or the drain electrode of the thin-film transistor to use the thin-film transistor as a device of an amplifier circuit. For example, switching of the thin-film transistor is controlled by the control unit 31.

The thin-film transistor or the optical sensors may each be a transistor having a top gate or bottom gate structure. In the case of using an oxide semiconductor transistor formed of a composite oxide such as those of gallium, indium and zinc, a bottom gate structure is favorably used in which the source electrode or the drain electrode is brought into electrical contact with a channel layer of the composite oxide whose surface is crystallized. A channel layer of a surface-crystallized composite oxide is electrically stable and has high electronic mobility. In a bottom gate structure, the source electrode or the drain electrode can be electrically connected to the crystallized channel layer. These transistors may have a single gate structure in which one channel layer region is formed, or a double gate structure in which two such regions are formed, or a triple gate structure in which three such regions are formed. These transistors may have a dual gate structure that includes two gate electrodes arranged above and below a channel layer region via an insulating film. In a transistor having a multi-gate structure, different voltages may be applied to the individual gate electrodes. For example, a plurality of transistors having a dual gate structure may be provided on the array substrate 11, with an electrical circuit, such as a driver driven by liquid crystal, being formed on the transparent substrate 14.

In a stereoscopic image display or in multi-pixel display of 4,000-pixel×2000-pixel or the like, liquid crystal is required to respond at a high speed of not more than 4.0 msec, favorably 2.0 msec to 0.5 msec. Particularly, in stereoscopic image display, many signals, such as image signals of the right eye and the left eye, signals of a projecting image, signals of a background image displayed in the back, and color signals of red, green and blue, are required to be processed within a minimum unit of liquid crystal drive time (one frame). When touch sensing or imaging is performed in one frame, signals to be processed are increased more. In these cases, thin-film transistors are favorable, which use a metal oxide, i.e. an oxide semiconductor, as a channel. Firstly, a transistor of an oxide semiconductor has high electronic mobility and is capable of high-speed switching such as of 2.0 msec to 0.5 msec, and thus is suitable for stereoscopic display and multi-pixel display. In addition, a transistor of an oxide semiconductor has a very high electrical withstand voltage, or has withstand voltage properties against a voltage of several volts to several tens of volts, or a higher voltage, of liquid crystal driving, and hardly causes leak current, and thus enables switching with low power consumption. For example, a liquid crystal drive element of a commercially available silicon semiconductor has a withstand voltage of about 7 volts, and thus a high voltage that enables high-speed driving of the liquid crystal cannot be applied thereto. Horizontally oriented liquid crystals called IPS based on conventional art responds at a speed of about 4 msec which is not sufficient for a lower limit of stereoscopic image display. Vertically oriented liquid crystal called VA based on conventional art responds at a speed of about 3 msec which is approximate to the lower limit of stereoscopic image display. However, a transistor of an oxide semiconductor enables driving with a high voltage of not less than 8 volts, or enables driving with low power consumption and a high-speed response of about 2.0 msec to 0.5 msec. Accordingly, that a thin-film transistor of an oxide semiconductor is favorably applied to stereoscopic image display or multi-pixel display performed by the liquid crystal display device of the present embodiment.

As metal wiring of the array substrate having a transistor such as of an oxide semiconductor, mention can be made of metal wiring having at least two layers which are provided with a surface layer of copper or copper alloy. Metal wiring that can be used, for example, is of a copper alloy obtained by adding to copper one or more elements selected from magnesium, titanium, molybdenum, indium, tin, zinc, aluminum, calcium, beryllium and the like. The elements added to copper are not limited to these. It is favorable that an amount of addition to copper is not more than 3 atom percent relative to the atom percent of copper.

It should be noted that the surface layer of metal wiring herein refers to a metal layer (first metal layer) located on a liquid crystal layer side (optical sensor side) when the array substrate is viewed as a cross section along a thickness direction. Relative to the copper or copper alloy of the surface layer, a metal layer (second metal layer) located below is located on a substrate side.

High melting point metal, such as titanium, molybdenum, tantalum and tungsten, or alloys of these can be favorably used for the second metal layer. A titanium alloy having an etching rate approximate to that of copper or a copper alloy of the first metal layer can be selected as the second metal layer. It is favorable that the film thickness of copper or a copper alloy and the film thickness of the second metal layer are ensured to range, for example, from 50 nm to 500 nm.

No limitation is imposed on a film-forming method used for the oxide semiconductor layer, the first metal layer having a surface layer of copper or a copper alloy, and the second metal layer. However, vacuum film formation based on sputtering is favorable from a viewpoint of production efficiency. Use of a sputtering film-forming device enables film formation for metal wiring, the film being composed of the first and second metal layers, with high throughput and with good efficiency for the transparent substrate having a large area. Pattern formation for both of copper or a copper alloy and the oxide semiconductor layer can be performed using a selective wet etching method. An expensive apparatus, such as a dry etching apparatus, is not required to be used. Copper or a copper alloy has quite a high compatibility, in the manufacturing process, with an oxide semiconductor, which is favorable from a viewpoint of reducing cost. Since copper or a copper alloy has good electrical conductivity, wiring resistance can be reduced, and power consumption in liquid crystal drive is reduced.

The transistor including a channel layer of an oxide semiconductor that can be used includes transistors having, for example, a bottom gate structure, top gate structure, double gate structure, and dual gate structure.

Figure 22:
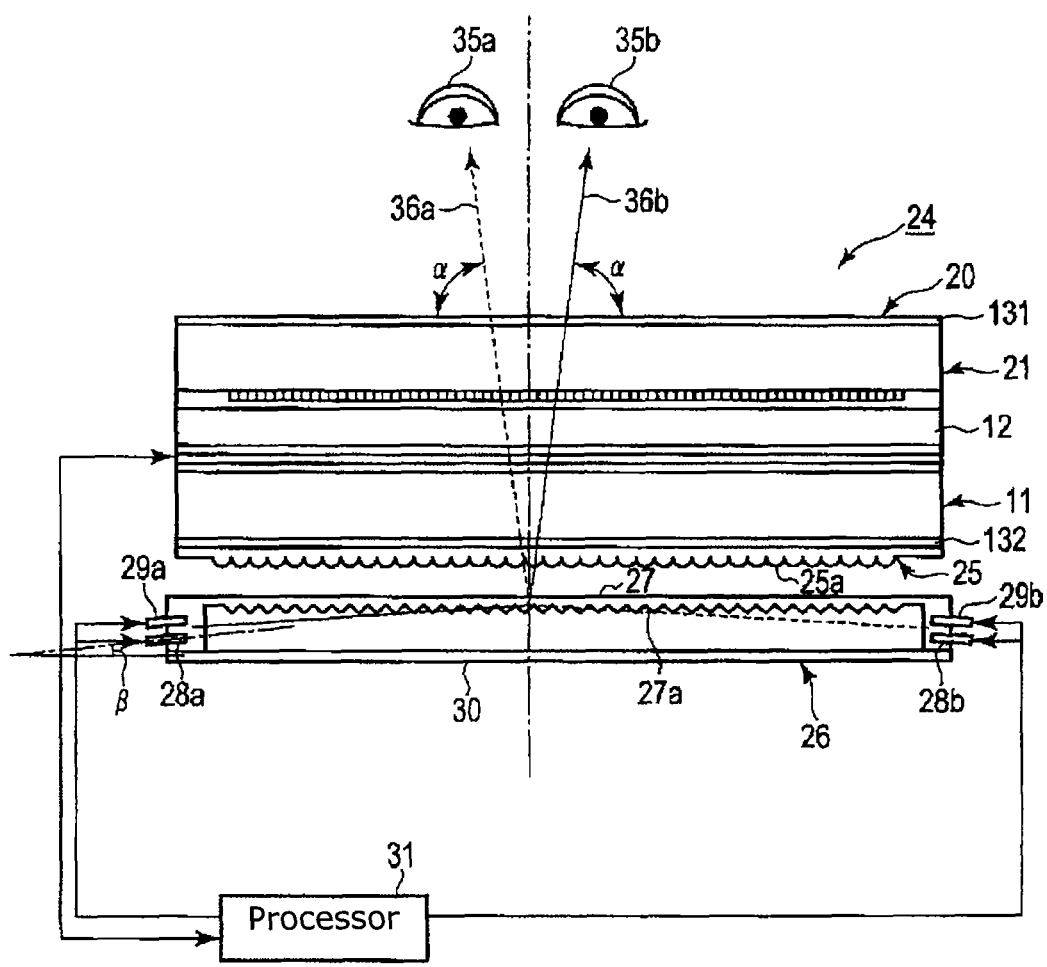
FIG. 22 is a cross-sectional view illustrating an example of a liquid crystal display device in a state of three-dimensional display according to the fourth embodiment.

FIG. 22 is a cross-sectional view illustrating an example of the liquid crystal display device 24 of the present embodiment in a state of three-dimensional display. FIG. 22 is a cross-sectional view in a lateral direction of the liquid crystal display device 24.

In the liquid crystal display device 24, the visible light emission by the solid light emitting elements 28*a* and 28*b*, which are arranged on both sides of the backlight unit 26, is separated into light emission for a right eye 35*a* and a left eye 35*b*. The control unit 31 controls or synchronizes the light emission timing of the solid light emitting elements 28*a* and 28*b* and the liquid crystal drive timing to thereby realize three-dimensional display.

In the present embodiment, the illumination light of visible or invisible light is reflected by the retinas of both eyes of an observer. The optical sensors detect this reflected light. The control unit 31 generates position information of the observer on the basis of the detection data of the optical sensors. The control unit 31 adjusts an angle β of emission light emitted from the solid light emitting elements 28*a* and 28*b* on the basis of the position information of the observer, and adjusts an angle α of emission lights 36*a* and 36*b* emitted from a display surface so as to match both eye positions of the observer. The solid light emitting element 28*a* includes the angle controller 50*a*. Upon drive of the angle controller 50*a*, the angle β of the emission light emitted from the solid light emitting element 28*a* is adjusted to resultantly adjust the angle α. Referring to FIG. 30B, the angle controller 50*a* is specifically described below.

The angle α of the emission lights 36*a* and 36*b* may be adjusted by a ½ apex angle E of the triangular prisms 27*a*. However, the ½ apex angle, which cannot be variably adjusted, is required to be preset according to usage. When the eyes of an adult observer are positioned being distanced by about 30 cm from the display surface, the angle α of the emission light emitted from the display surface is permitted to be within a range of about 6 to 8 degrees, for the improvement of the visibility of the three-dimensional image. In the case where the liquid crystal display device 24 is used for a plurality of observers, the light emission angle α may be increased. The control unit 31 generates position information and movement information of an observer or a pointer on the basis of the infrared light or the ultraviolet light detected by an imaging device (e.g., camera), such as CMOS or CCD. Such generation of position information and movement information of an observer or a pointer may be conducted by the plurality of matrix-arranged optical sensors of the array substrate 11, in place of CMOS or CCD.

The liquid crystal display device 24 includes the optical sensors on the array substrate 11. An optical sensor 32 receives incident light from outside, or receives reflected light of an object based on the light emitted from the backlight unit 26. The control unit 31 performs color separation or touch sensing on the basis of the detection data of the optical sensor 32. For example, the optical sensor detects light of a specific wavelength of an ultraviolet range, or emitted from the solid light emitting elements 29*a* and 29*b*, such as infrared range light LEDs. The liquid crystal display device 24 may be used, for example, as a copying apparatus in which the light from the backlight unit 26 is radiated onto printed matter placed on the liquid crystal display surface and the reflected light is received.

Figure 23:
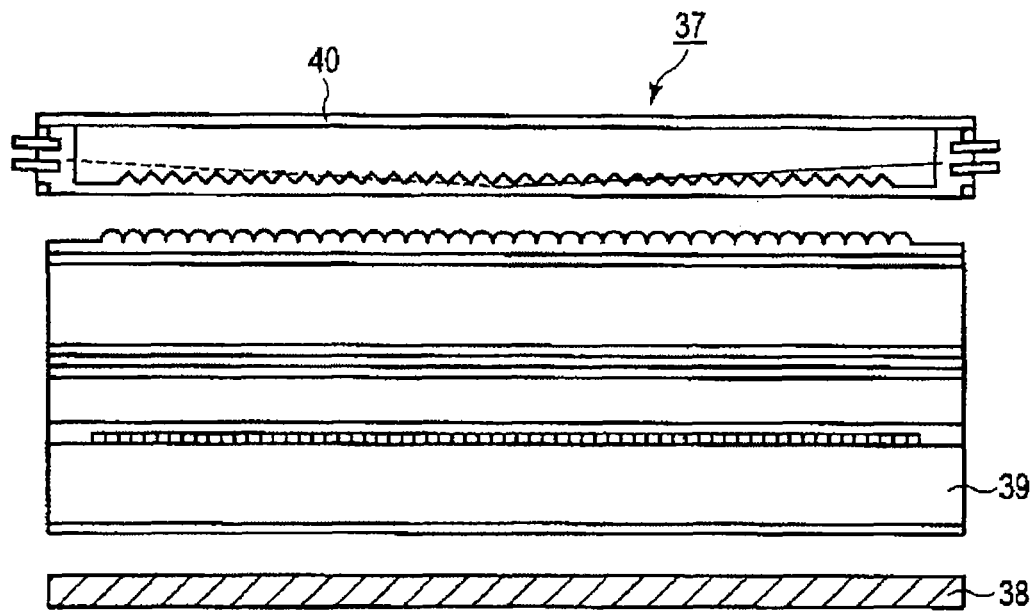
FIG. 23 is a cross-sectional view illustrating an example of a liquid crystal display device used for direct copying.

FIG. 23 is a cross-sectional view illustrating an example of a liquid crystal display device 37 used for direct copying.

In direct copying, a printed matter 38, a picture, or the like is opposed to a color filter substrate 39. In FIG. 23, the color filter substrate 39 is arranged on a lower side and a backlight unit 40 is arranged on an upper side. The liquid crystal display device 37 performs white display and radiates light toward the printed matter 38 to directly perform copying.

Hereinafter is described a method for manufacturing the color filter substrate 21 according to the present embodiment.

Firstly, a black resist 1 is formed on the transparent substrate 7. For example, the black resist 1 is coated onto the entire surface of the transparent substrate 7 so as to have a dry coating thickness of 1.5 μm. Then, the substrate to be processed is prebaked in a clean oven at 70° C. for 20 minutes, followed by cooling at room temperature. Then, ultraviolet exposure is performed relative to the substrate via a photomask by means of an ultrahigh pressure mercury lamp. In this case, the alignment marks 5 having a cross shape are formed by using, for example, the black resist 1 at a part of an outermost periphery of the substrate. After that, a spray development is produced with respect to the substrate, using sodium carbonate aqueous solution of 23° C., followed by cleaning with ion-exchanged water, and air-drying. After that, the substrate is subjected to heat treatment at 220° C. and film-curing to thereby form the light-shielding layer BLK1 on the transparent substrate 7.

A coating pattern of the light-shielding layer BLK1 that contains carbon as a main material of the light-shielding color materials is, for example, a pattern enclosing the effective display region 2 along four sides thereof. The alignment marks 5 are formed at end portions of the transparent substrate 7, together with the light-shielding layer BLK1.

Then, the red resist RR is formed on the substrate to be processed. For example, the red resist RR is coated so as to have a dry thickness of 2.5 μm. Then, the substrate is subjected to alignment using the alignment marks 5, followed by exposure by means of the exposure apparatus, and development by means of the developing apparatus to thereby form the striped red filters RF. The processing of development and film curing are the same as those for the light-shielding layer BLK1.

Then, the green resist GR is formed. For example, the green resist GR is coated so as to have a dry thickness of 2.5 µm. Then, the substrate is subjected to alignment using the alignment marks 5, followed by exposure by means of the exposure apparatus, and development by means of the developing apparatus to thereby form the striped green filters GF. The processing of development and film curing are the same as those for the light-shielding layer BLK1.

Then, the blue resist BR is formed. For example, the blue resist BR is coated so as to have a dry thickness of 2.5 µm. Then, the substrate is subjected to alignment using the alignment marks 5, followed by exposure by means of the exposure apparatus, and development by means of the developing apparatus to thereby form the striped blue filters BF. The processing of development and film curing are the same as those for the light-shielding layer BLK1.

After forming the red, green and blue filters RF, GF and BF through the processing described above, a black resist 2 is formed on the substrate to be processed. For example, the black resist 2 is coated onto the entire surface of the substrate to be processed so as to have a dry coating thickness of 1.0 µm. Then, the substrate to be processed is prebaked in a clean oven at 70° C. for 20 minutes, followed by cooling at room temperature.

Figure 33:
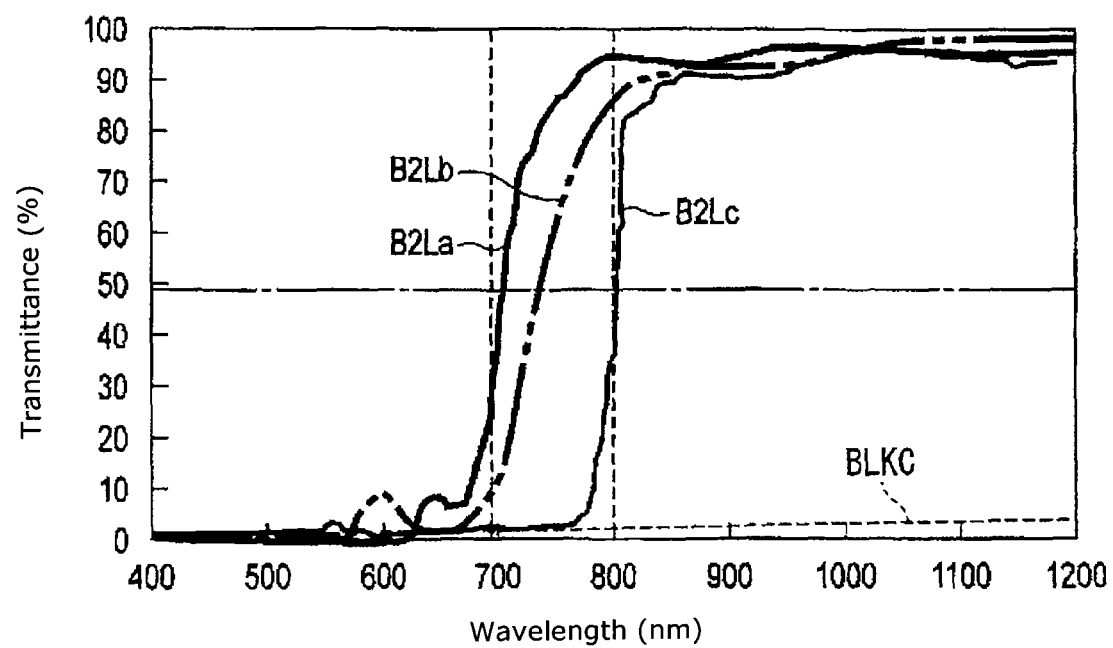
FIG. 33 is a graph illustrating an example of transmittance characteristics of a light-shielding layer with an adjusted half-value wavelength.

Then, the substrate is set to exposure apparatus. In this setting, infrared light (e.g., infrared light of 850 nm) that is not transmitted through the light-shielding layer BLK1 (black resist 1) but is transmitted through the light-shielding layer BLK2 (black resist 2) is radiated to a back surface (transparent substrate 7 side) of the substrate. Further, the infrared light is detected on a front surface (black resist 2 side) of the substrate by using the optical sensors, and the alignment marks 5 formed together with the light-shielding layer BLK1 are detected. As shown in FIG. 33, transmission characteristics are different between light-shielding characteristics BLKC of the light-shielding layer BLK1 and the light-shielding layer BLK2. By detecting infrared light that is not transmitted through the light-shielding layer BLK1 (black resist 1, light-shielding characteristics BLKC in FIG. 33) but is transmitted through the light-shielding layer BLK2 (black resist 2), the alignment marks 5 can be detected and thus alignment can be accurately performed.

It is favorable that the infrared light used for detecting the alignment marks 5 has a long wavelength that is larger than 800 nm. For example, an LED element that emits infrared light of not less than about 800 nm can be used as a light source of illumination. For example, an imaging device (camera), such as CCD or CMOS having sensitivity in an infrared range of not less than about 800 nm can be applied to the optical sensor.

In the present embodiment, the color filter CF has a thickness of 2.5 µm, and the frame region 2 has a thickness corresponding to an overlap of the light-shielding layer BLK1 having a thickness of 1.5 µm and the light-shielding layer BLK2 having a thickness of 1.0 µm, totaling 2.5 µm, so that the both will have the same thickness. It should be noted that the same thickness herein refers to that a difference of thickness is not more than ±0.2 µm which is a thickness range controllable in a normal photolithography processing. Allowing the effective display region 2 and the frame region 3 to have substantially the same thickness, light leakage from the frame region 3 is prevented and thus the quality of display is improved.

Following alignment using the alignment marks 5, ultraviolet exposure is performed via a photomask using an ultrahigh pressure mercury lamp.

After that, a spray phenomenon is produced with respect to the substrate, using sodium carbonate aqueous solution of 23° C., followed by cleaning with ion-exchanged water, and air-drying. After that, the substrate to be processed is post-baked in a clean oven at 230° C. for 30 minutes, followed by film curing, thereby forming the light-shielding layer BLK2. The transparent resin layer 9 is coated onto the light-shielding layer BLK2, followed by film curing, thereby manufacturing the color filter substrate 21.

It should be noted that the color filter substrate 21 described in the present embodiment has a configuration not including the counter electrodes 10. However, in the case of a liquid crystal display device in which the liquid crystal is driven by a vertical electric field method (e.g., VA method or ECB method), the counter electrodes 10 as a transparent electrically conductive film are formed on the transparent resin layer 9.

Fifth Embodiment

The present embodiment describes a modification of the liquid crystal panel provided to the liquid crystal display device according to the first to fourth embodiments.

Figure 24:
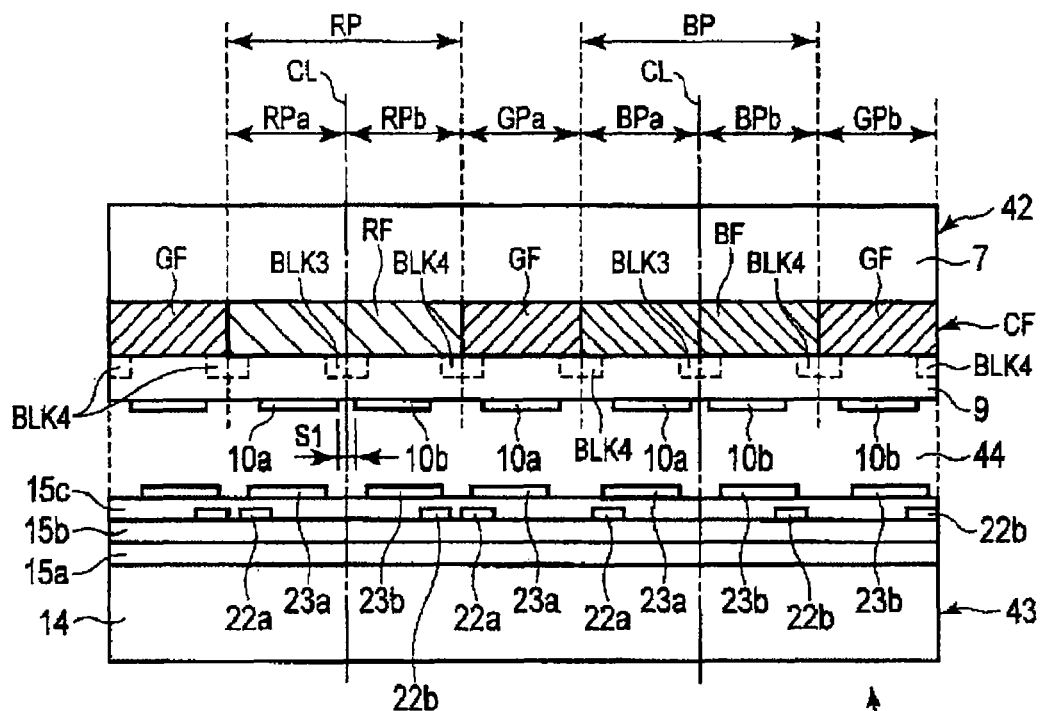
FIG. 24 is a cross-sectional view illustrating an example of a liquid crystal panel according to a fifth embodiment.

FIG. 24 is a cross-sectional view illustrating an example of a liquid crystal panel 41. FIG. 24 is a cross-sectional view along a lateral direction of the liquid crystal panel 41.

The liquid crystal panel 41 includes a color filter substrate 42, an array substrate 43 and a liquid crystal layer 44.

The color filter substrate 42 and the array substrate 43 are opposed to each other via the liquid crystal layer 44.

The liquid crystal layer 44 is provided with liquid crystal molecules having negative dielectric anisotropy and in initial vertical orientation. The liquid crystal molecules provided to the liquid crystal layer 44 are driven according to an oblique electric field generated between the color filter substrate 42 and the array substrate 43.

The color filter substrate 42 includes the transparent substrate 7 which is provided thereon with the color filter layer 8, the transparent resin layer 9, counter electrodes 10a and 10b, and an oriented film that is not shown. The color filter layer 8 includes the color filter CF of the effective display region 2, and the light-shielding layers BLK1 and BLK2 of the frame region 3. The color filter CF includes the red filters RF, the green filters GF and the blue filters BF. In FIG. 24, the light-shielding layers BLK1 and BLK2 in the frame region 3 are not shown.

The array substrate 43 includes the transparent substrate 14 which is provided thereon with the insulating layer 15a, insulating layer 15b, common electrodes 22a and 22b, insulating layer 15c, pixel electrodes 23a and 23b, and an oriented film that is not shown.

Green pixels GPa and GPb are alternately arranged in a lateral direction between red pixels RP and blue pixels BP. In FIG. 24, the green pixel GPa is arranged between a red pixel RP and a blue pixel BP, while a blue pixel BP is arranged between the green pixels GPa and GPb.

Each red pixel is divided by a pixel center line CL into a left-side red pixel RPa and a right-side red pixel RPb. Each blue pixel is divided by a pixel center line CL into a left-side blue pixel BPa and a right-side blue pixel BPb.

The green pixels GPa and GPb in combination perform the same operation as each red pixel RP and blue pixel BP.

In other words, the green pixel GPa corresponds to the left-side red pixel RPa and the left-side blue pixel BPa. The green pixel GPb corresponds to the right-side red pixel RPb and the right-side blue pixel BPb. In the present embodiment, a center line of the green pixels GPa and GPb is also the pixel center line CL.

In the present embodiment, the green pixels GPa, the left-side red pixels RPa, and the left-side blue pixels BPa are allocated with pixel electrodes 23a, common electrodes 22a and counter electrodes 10a. The green pixels GPb, the right-side red pixels RPb, and the right-side blue pixels BPb are allocated with pixel electrodes 23b, common electrodes 22b and counter electrodes 10b.

The oriented film, not shown, may provide vertical orientation with the axes of the liquid crystal molecules being 90°, or may have a pre-tilt angle θ which is symmetrical with respect to the pixel center line CL. For example, the pre-tilt angle θ may be a tilt angle of the liquid crystal molecules relative to the normal line of the substrate of the liquid crystal panel 41. The color filter substrate 42 and the array substrate 43 which are opposed to the liquid crystal layer 44 each have a surface provided with a photosensitive oriented film. The liquid crystal panel 41 has a configuration in which the color filter substrate 42 and the array substrate 43 are stuck to each other via the liquid crystal layer 7. The pre-tilt angle is set, for example, by applying voltage between the pixel electrodes 23a and 23b and, the common electrodes 22a and 22b and the counter electrodes 10a and 10b, and performing exposure with radiation, such as ultraviolet light. The pre-tilt angle may be set by a physical method, such as rubbing.

The counter electrodes 10a and 10b, the pixel electrodes 23a and 23b, and the common electrodes 22a and 22b are formed of an electrically conductive metal oxide, such as ITO. The counter electrodes 10a and 10b, as well as the common electrodes 22a and 22b may, for example, have a common potential (ground).

In a plan view, each pixel may have a rectangular shape which is long in a longitudinal direction, or a polygonal shape, such as a V shape.

The green pixels GPa and GPb each have an opening width that is ½ of the red pixel RP and the blue pixel BP, and are each located at a position isolating between the red pixel RP and the blue pixel BP. In other words, the green pixels GPa and GPb, each having a ½ pixel width, when combined, substantially correspond to one pixel. The red pixel RP includes the red pixels RPa and RPb each having a ½/pixel width. The blue pixel BP includes the blue pixels BPa and BPb each having a ½ pixel width.

In the present embodiment, in a lateral positional relationship in the cross section shown in FIG. 24, the counter electrodes 10a and 10b are offset from the pixel electrodes 23a and 23b, respectively, in a direction toward the pixel center line CL, so as to be symmetric about the pixel center line CL. Such a laterally offset positional relationship generates an oblique electric field between the pixel electrodes 23a and 23b and, the counter electrodes 10a and 10b. While the vertically oriented liquid crystal molecules are line symmetric about the pixel center line CL, the oblique electric field is able to tilt the liquid crystal molecules toward both ends of the pixel, which are opposite to the pixel center line CL. By setting the pre-tilt angle θ, a voltage Vth with which the liquid crystal starts tilting can be lowered. However, when the liquid crystal molecules are vertically oriented with their axes being 90° relative to a substrate plane, use of the oblique electric field can symmetrically tilt the liquid crystal molecules toward both ends of the pixel from the pixel center line CL.

The counter electrodes 10a and 10b to be formed on the color filter substrate 42 may be a film formed on the entire surface of the transparent resin layer 9, without being patterned. A slit S1 (portion from which the electrically conductive metal oxide is removed) does not have to be necessarily formed between the counter electrodes 10a and 10b shown in FIG. 24.

When the slit S1 is not formed, a linear light-shielding layer BLK3 may be formed in a pixel center portion with, for example, the same material as that of the light-shielding layer BLK2, so that a slight unevenness caused in the pixel center portion is hardly visible. The light-shielding layer BLK3 is formed between each of the red and blue filters RF and BF and the transparent resin layer 9. In high-definition pixels exceeding 200 ppi, the light-shielding layer BLK3 may be omitted form the pixel center portions to provide bright display.

It is favorable that, relative to entire mass of the organic pigments, the light-shielding layer BLK3 contains, in terms of mass ratio, a violet pigment of 50 to 75%, a yellow pigment of 25 to 50%, or a red pigment of not more than 30%.

Also, it is favorable that, relative to the entire mass of the organic pigments, the light-shielding layer BLK3 contains, in terms of mass ratio, a violet pigment of 30 to 75%, a yellow pigment of 25 to 50%, or a red pigment of not more than 30%. Further, it is favorable that a green pigment or a blue pigment is added to the light-shielding layer BLK3 by a mass of not more than 10%.

A light-shielding layer BLK4 used as a black matrix may be formed in the effective display region 2. For example, the light-shielding layer BLK4 may be formed in boundary portions between the pixels, with the same material as that of the light-shielding layer BLK2. The light-shielding layer BLK 4 is formed between the boundary of the green and red filters GF and RF and the transparent resin layer 9, and between the boundary of the green and blue filters GF and BF and the transparent resin filter 9. In high-definition pixels exceeding 250 ppi, the light-shielding layer BLK4 can be omitted to provide a bright display.

The light-shielding layers BLK3 and BLK4 may be formed with the same material as that of the light-shielding layer BLK1. However, in high-definition pixels exceeding 250 ppi, it is favorable that the light-shielding layers BLK3 and BLK4 are formed with the same material as that of the light-shielding layer BLK2 to prevent formation of the convex portions 16 and disturbance of the liquid crystal orientation. Light-shielding layers that are formed using organic pigments as a light-shielding color material have a dielectric constant lower than carbon and, when formed at positions near the liquid crystal layer, hardly have an adverse effect on the liquid crystal display. Light-shielding layers that are formed using a material that contains carbon as a light-shielding color material have a higher dielectric constant than organic pigments. Accordingly, it is desirable that such light-shielding layers are formed, for example, onto a transparent substrate that is a color filter substrate distanced from a liquid crystal layer, to prevent adverse effects on the liquid crystal display.

High-definition pixels exceeding 250 ppi are applied with vertically oriented liquid crystals which are excellent in black display to thereby improve contrast in the liquid crystal display. Further, the metal wiring provided to the array substrate 43 may be used for improving contrast in the liquid crystal display.

In the array substrate 43 of the present embodiment, in a lateral positional relationship in the cross section shown in FIG. 24, the common electrodes 22a and 22b have extruded portions in a direction toward respective pixel ends relative to the pixel center line CL, the extruded portions being line symmetric about the pixel center line CL and being offset from the respective pixel electrodes 23a and 23b. When liquid crystal drive voltage is applied, an effectively strong electric field is generated between the extruded portions of the common electrodes 22a and 22b and, the respective pixel electrodes 23a and 23b. The generated electric field allows the liquid crystal molecules near the extruded portions to be inclined at high speed.

The green pixels GPa and GPb, when combined, function similar to other red and blue pixels RP and BP.

Figure 25:
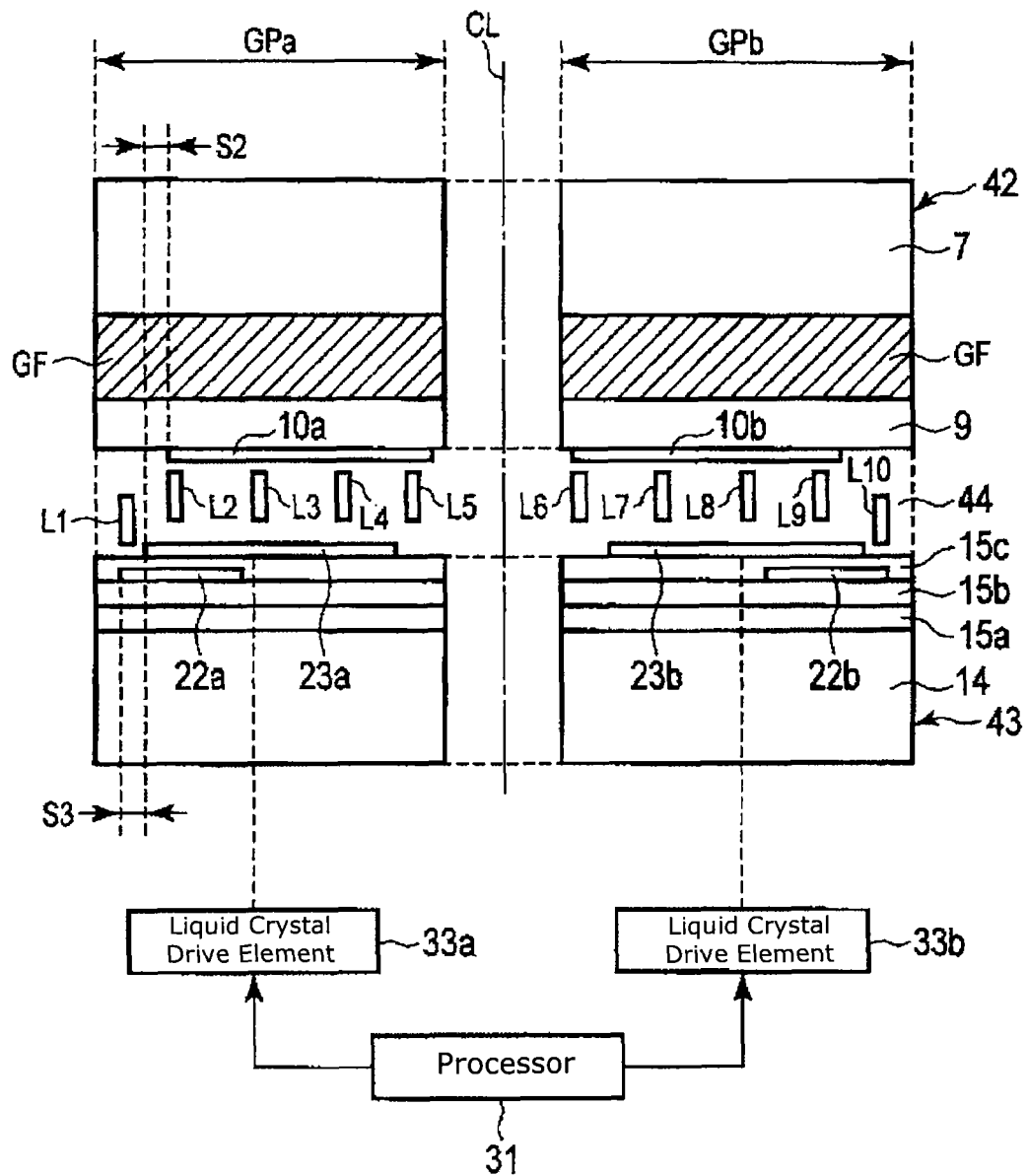
FIG. 25 is a cross-sectional view illustrating an example of a green pixel GPa and a green pixel GPb.

FIG. 25 is a cross-sectional view illustrating an example of the green pixels GPa and GPb. The green pixels GPa and GPb shown in FIG. 25 correspond, for example, to the green pixels GPa and GPb adjacent to both ends of the blue pixel BP shown in FIG. 24.

A liquid crystal drive element 33a corresponds to the green pixel GPa. A liquid crystal drive element 33a is electrically connected to the pixel electrode 23a.

A liquid crystal drive element 33b corresponds to the green pixel GPb. A liquid crystal drive element 33b is electrically connected to the pixel electrode 23b.

The liquid crystal drive elements 33a and 33b are thin-film transistors each including a channel layer formed, for example, of an oxide semiconductor. Two or more metal oxides selected from gallium, indium, zinc, tin, hafnium, and yttrium can be applied to the channel layer formed of an oxide semiconductor.

The control unit 31 controls switching between the liquid crystal drive elements 33a and 33b.

In a lateral direction, the position of the pixel electrode 23a is determined such that an offset S2 is formed between an end of the pixel electrode 23a and an end of the counter electrode 10a, and that the pixel electrode 23a is protruded from the counter electrode 10a. In a pixel end in a lateral direction, the pixel electrode 23b has an offset relative to the counter electrode 10b.

In a lateral direction, the position of the common electrode 22a is determined such that an end of the common electrode 22a is offset from an end of the pixel electrode 23a, and that an extruded portion S3 is formed, being extruded from an end of the pixel electrode 23a toward an end of the common electrode 22a. In a lateral direction, the common electrode 22b is positioned being extruded from an end of the pixel electrode 23b.

The counter electrode 10a, the pixel electrode 23a and the common electrode 22a of the green pixel GPa are line-symmetrically arranged relative to the counter electrode 10b, the pixel electrode 23b and the common electrode 22b of the green pixel GPb.

The common electrodes 22a and 22b, as well as the counter electrodes 10a and 10b may have a common or ground potential.

Figure 26:
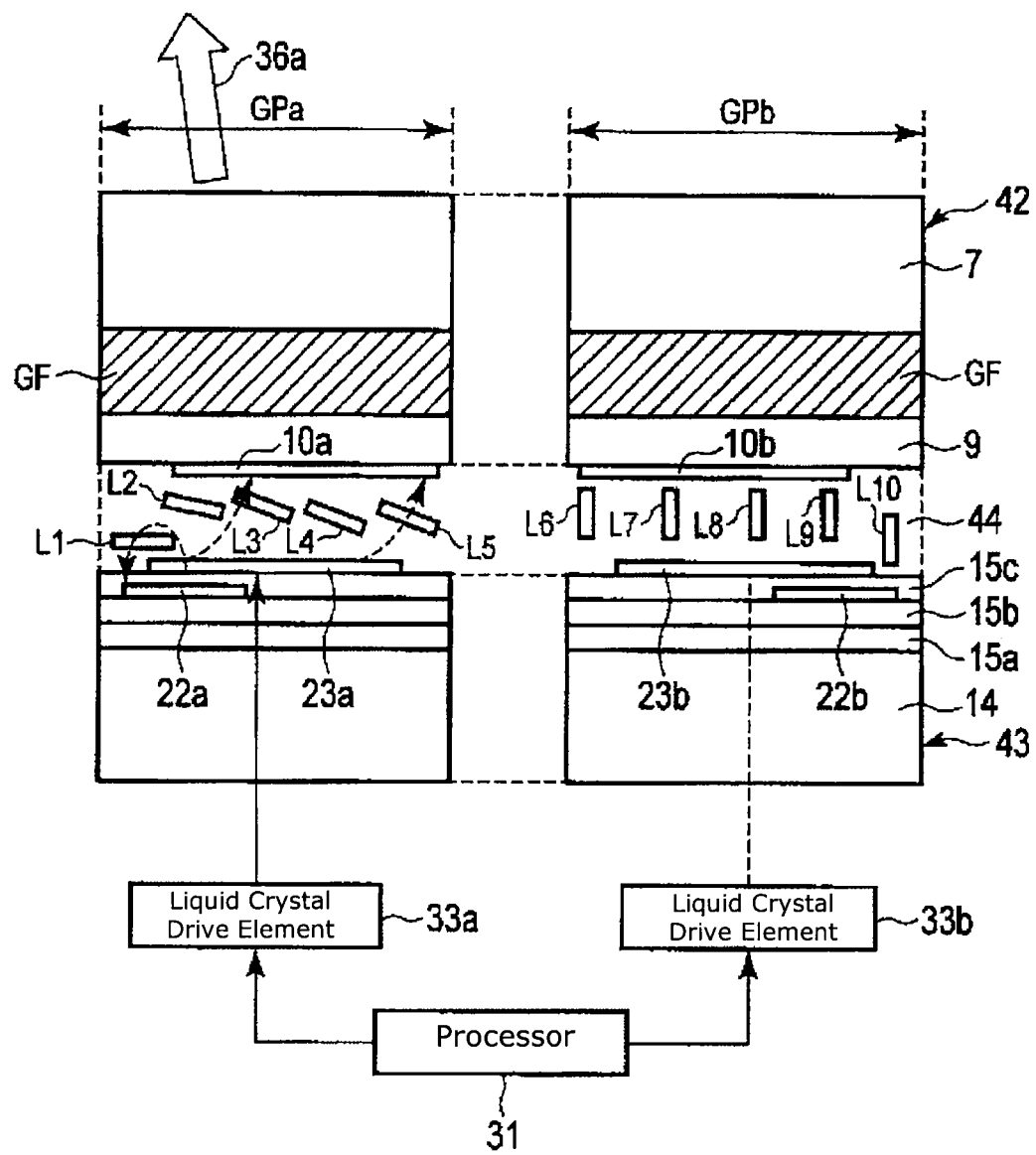
FIG. 26 is a cross-sectional view illustrating an example of the green pixel GPa in a state of being applied with a liquid crystal drive voltage.

FIG. 26 is a cross-sectional view illustrating an example of the green pixel GPa in a state of being applied with a liquid crystal drive voltage.

Upon application of a liquid crystal drive voltage to the green pixel GPa, liquid crystal molecules L1 to L5 are inclined, light is emitted from the backlight unit 26, and, for example, emission light 36a is incident on the right eye 35a of an observer. The emission light 36a has an angle that is set by the light control element 27, such as a prism sheet or a lenticular lens, provided to the backlight unit 26. Because of the extruded portion S3, the liquid crystal molecule L1 is rapidly and greatly inclined by a strong electric field from an edge of the pixel electrode 23a toward the common electrode 22a. Thus, the liquid crystal is permitted to have high-speed responsiveness. The counter electrode 10a and the pixel electrode 23a have the offset S2 and the oblique electric field is generated. The liquid crystal molecules L2 to L5 near the counter electrode 10a are rapidly and unidirectionally inclined (e.g., in a direction from the pixel center line CL toward a pixel end) by the oblique electric field between the counter electrode 10a and the pixel electrode 23a.

Figure 27:
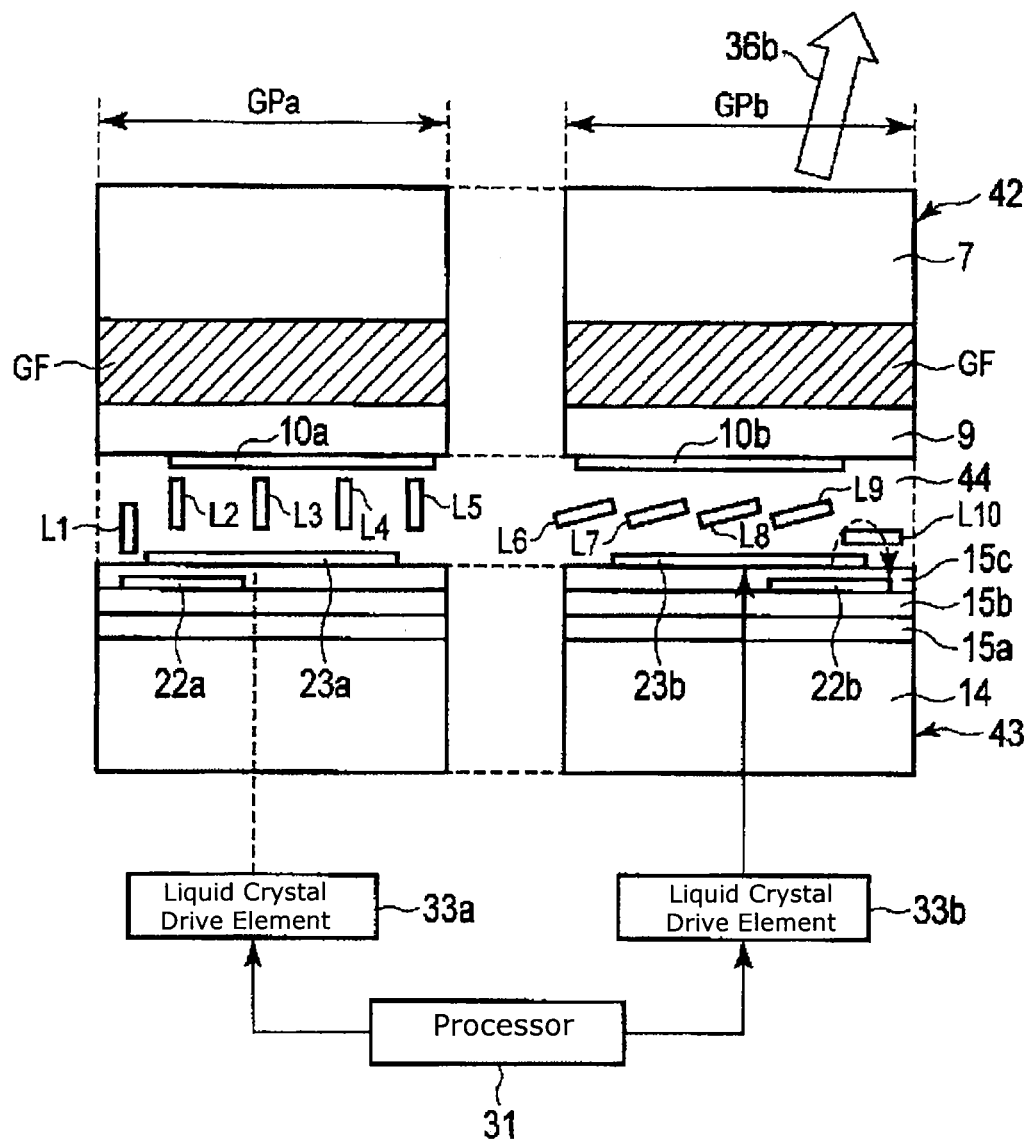
FIG. 27 is a cross-sectional view illustrating an example of the green pixel GPb in a state of being applied with a liquid crystal drive voltage.

FIG. 27 is a cross-sectional view illustrating an example of the green pixel GPb in a state of being applied with a liquid crystal drive voltage.

Upon application of a liquid crystal drive voltage to the green pixel GPb, liquid crystal molecules L6 to L10 are inclined, light is emitted from the backlight unit 26, and, for example, emission light 36b is incident on the left eye 35b of the observer.

The driving operation of the liquid crystal molecules L6 to L10 is similar to the case of FIG. 26, but the liquid crystal molecules L6 to L10 are inclined so as to be line symmetric about the pixel center axis CL.

Thus, the liquid crystal molecules L1 to L5 and the liquid crystal molecules L6 to L10 are symmetrically inclined relative to the pixel center line CL to thereby broaden the viewing angle.

As shown in FIGS. 26 and 27, the liquid crystal driving and the timing of emitting emission light from the backlight unit 26 are controlled or synchronized to project different images to the right eye 35a and the left eye 35b.

Further, in the present embodiment, red, green and blue signals based such as on a background image and a pop-up image are provided to the red pixels RP, the green pixels GPa and GPb, and the green pixels BP, respectively, and driving is performed in a time-division manner to thereby enable three-dimensional display in color.

Figure 28:
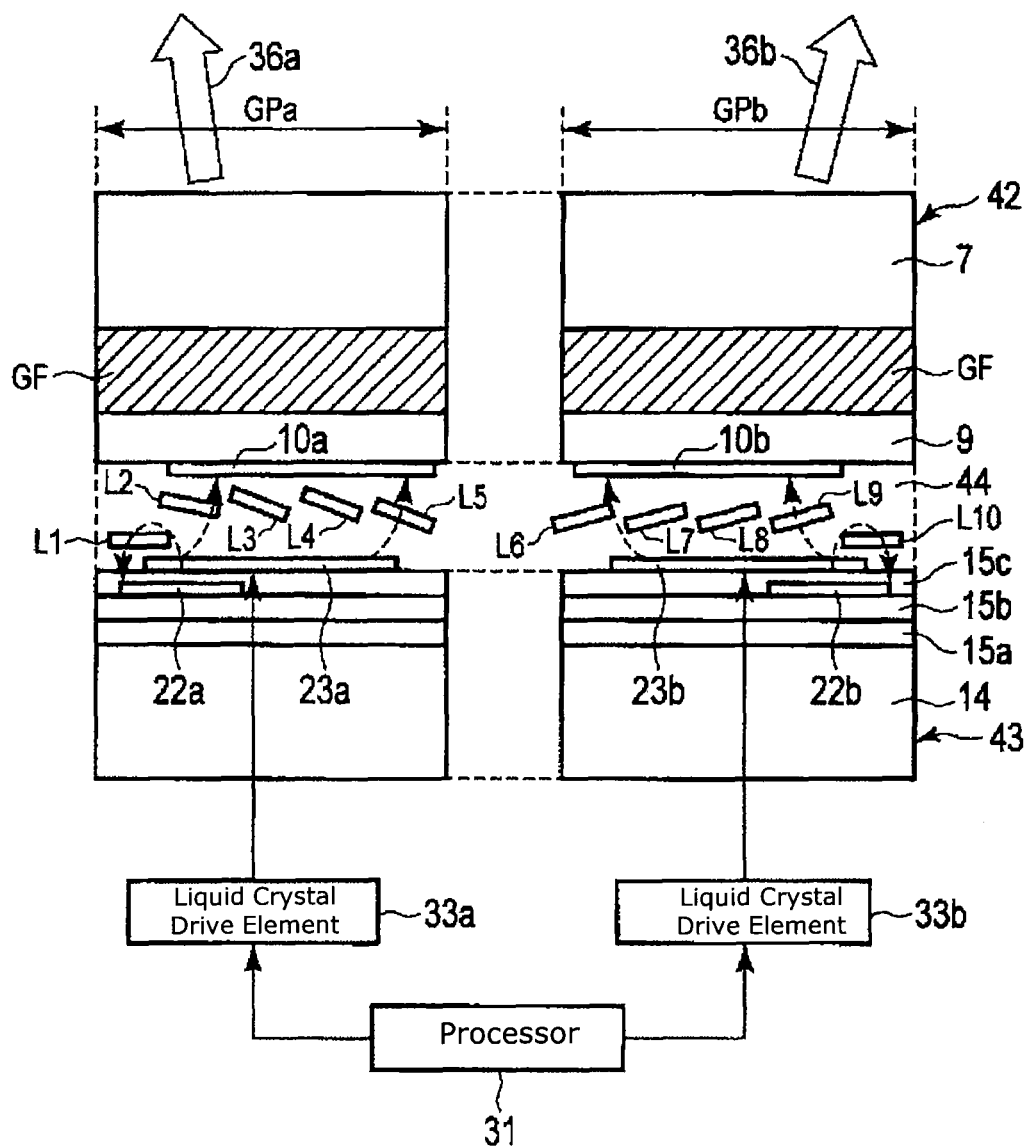
FIG. 28 is a cross-sectional view illustrating an example of the green pixels GPa and GPb in a state of being applied with a liquid crystal drive voltage.

FIG. 28 is a cross-sectional view illustrating an example of the green pixels GPa and GPb in a state of being applied with a liquid crystal drive voltage.

The same image signals are sent to the green pixels GPa and GPb to enable bright two-dimensional display.

In this way, the liquid crystal display device of the present embodiment is able to easily switch between three-dimensional display and two-dimensional display.

The method of controlling image display by combining the green pixels GPa and GPb as in FIGS. 26 to 28 can also be applied to the control of the red pixel RP and the control of the blue pixels BP. Specifically, the control of the green pixel GPa is applicable to the control of the left-side red pixel RPa and the control of the left-side blue pixel BPa. The control of the green pixel GPb is applicable to the control of the right-side red pixel RPb and the control of the right-side blue pixel BPb.

Figure 29:
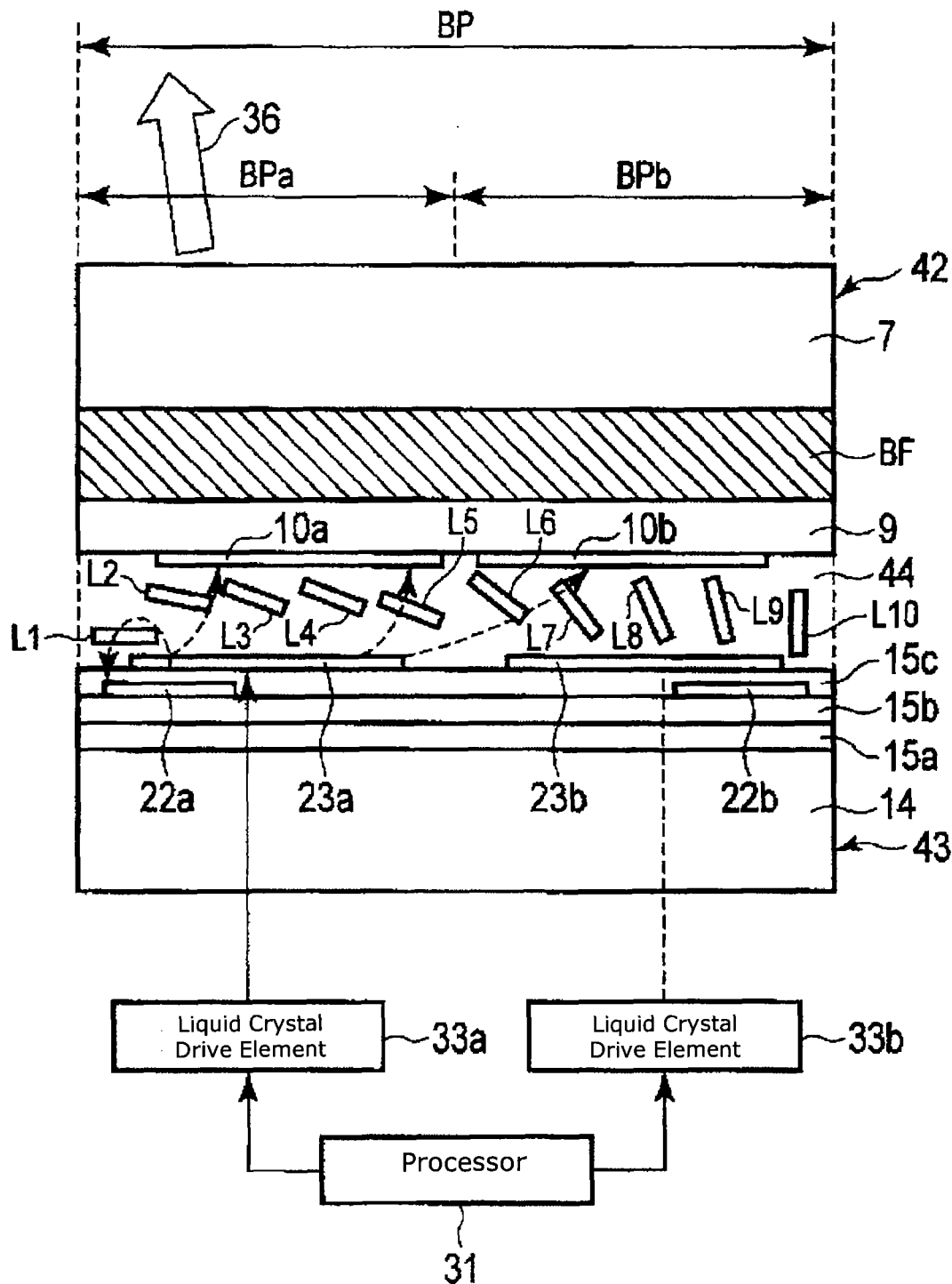
FIG. 29 is a cross-sectional view illustrating an example of a blue pixel BP.

FIG. 29 is a cross-sectional view illustrating an example of the blue pixel BP. In FIG. 29, a liquid crystal drive voltage is applied to the left-side blue pixel BPa.

When a liquid crystal drive voltage is applied to the pixel electrodes 23a of the left-side blue pixel BPa, the counter electrodes 10a and 10b of the blue pixel BP have the same common potential. Therefore, the electric field generated from the pixel electrode 33a of the left-side blue pixel BPa may cause the liquid crystal molecules L6 to L9 of the right-side blue pixel BPb to slightly tilt to reinforce the emission light 36 emitted from the blue pixel BP. The blue pixel BP has a low human visibility. Further, the pigment used for the blue pixel BP has a transmittance a little lower than that of the pigments used for the red and green pixels RP and GP. For this reason, it is favorable that the emission light 36 of the blue pixel BP is reinforced.

It should be noted that, since the red and green pixels have a higher transmittance than the blue pixel BP, at least one of the red and green pixels may be divided so as to have ½ width of the green pixel.

The present embodiment has described the case where the liquid crystal molecules L1 to L10 have negative dielectric anisotropy. However, the liquid crystal molecules may have positive dielectric anisotropy. When the liquid crystal molecules L1 to L10 have positive dielectric anisotropy, the liquid crystal molecules L1 to L10 have an initial horizontal orientation. Upon application of a liquid crystal drive voltage, major axes of the liquid crystal molecules L1 to L10 having the initial horizontal orientation rise in a direction vertical to the substrate plane from a direction parallel thereto.

In the foregoing embodiments, it is favorable that the liquid crystal material used contains, for example, fluorine atoms in the molecule structure (hereinafter referred to as fluorine-based liquid crystal). The fluorine-based liquid crystal has low viscosity and low dielectric constant and is less likely to capture ionic impurities. Use of the fluorine-based liquid crystal as a liquid crystal material can reduce performance deterioration, such as lowering of voltage retention due to impurities, and thus can suppress display unevenness and image sticking. For example, nematic liquid crystal having a birefringence of about 0.1 around room temperature can be used as the liquid crystal molecules L1 to L10 having negative dielectric anisotropy. As the liquid crystal molecules L1 to L10 having positive dielectric anisotropy, various liquid crystal materials can be applied. Liquid crystal molecules having large dielectric anisotropy may be used for a liquid crystal display device that is required to have high responsiveness rather than a need for suppressing power consumption. The thickness of the liquid crystal layer 12, 44 is not particularly limited. The effectively applicable And of the liquid crystal layer 12, 44 of the present embodiment ranges, for example, from about 300 nm to 500 nm. When the forming processing for imparting the oriented film with a pre-tilt angle is performed being combined with exposure such as with ultraviolet rays, a large amount of exposure is required for imparting the oriented film with a horizontal orientation, however, on the contrary, the amount of exposure may be small in imparting the oriented film with a vertical orientation. Therefore, in order to efficiently perform the orientation processing, it is preferable that the liquid crystal molecules L1 to L10 used have a vertical orientation.

In the present embodiment, the liquid crystal molecules L1 to L10 can be driven with an oblique electric field, without forming a pre-tilt angle, such as of 89°, from the substrate plane. However, it is preferable to form a pre-tilt angle in an oriented film by using a method of forming the oriented film of a photosensitive material and of performing ultraviolet exposure after sealing of the liquid crystal, while applying a voltage to the liquid crystal molecules L1 to L10. With the impartment of a pre-tilt angle that is line-symmetric about the pixel center line CL, the liquid crystal drive can be more sped up. The liquid crystal molecules with an initial vertical orientation, in which the restraining force from the oriented film is weak compared to the liquid crystal molecules with an initial horizontal orientation, are able to achieve higher speed liquid crystal drive.

Sixth Embodiment

The present embodiment describes modifications of the backlight unit and the light control element provided to the liquid crystal display device according to the first to fifth embodiments described above.

Figure 30A:
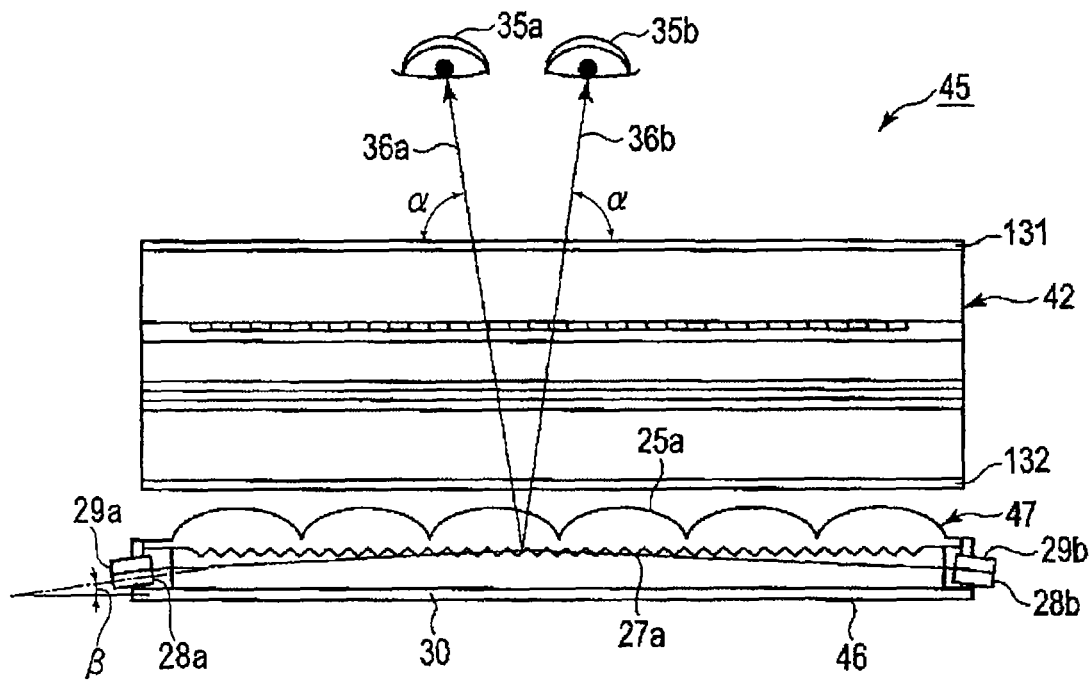
FIG. 30A is a cross-sectional view illustrating an example of a liquid crystal display device according to a sixth embodiment.
Figure 30B:
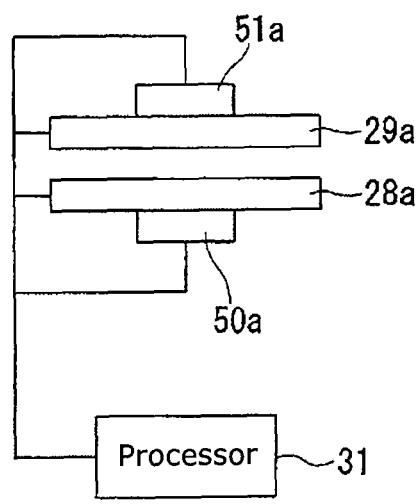
FIG. 30B is a cross-sectional view illustrating an example of a liquid crystal display device according to the sixth embodiment, that is, an enlarged view illustrating a structure of an angle controller illustrated in FIG. 30A.

FIG. 30A is a cross-sectional view illustrating an example of a liquid crystal display device 45 according to the present embodiment. FIG. 30A is a cross-sectional view in a lateral direction of the liquid crystal display device 45. FIG. 30B is an enlarged cross-sectional view illustrating structures of the angle controllers 50a and 51a.

The light emitted from a backlight unit 46 has an angle β which is adjusted, for example, in conformity with a distance from the eyes of an observer to a display surface. The angle β is controlled, for example, by the angle controllers 50a and 51a which are each configured by a drive device, such as a piezo-electric element, having good controllability. The angle controllers 50a and 51a have a fine adjustment mechanism that controls an inclination of the solid light emitting elements 28a, 29a relative to a planar direction of the backlight unit 46. As described referring to FIG. 22, the angle controllers 50a and 51 are connected to the control unit 31 which controls the operation of the angle controllers 50a and 51a. With the angle controllers 50a and 51a being driven, the angle β of the light is finely adjusted, and the angle α of the emission light emitted from the display surface (angle between the display surface and the emission light) is adjusted, thereby exerting a stereoscopic display effect optimal to the eye positions of an observer.

Further, as shown in FIG. 30A, the backlight unit 46 is also provided with the solid light emitting elements 28b and 29b on an end portion thereof which is opposite to the end portion provided with the solid light emitting elements 28a and 29a. The solid light emitting elements 28b and 29b have a structure similar to that of the solid light emitting elements 28a and 29a. The solid light emitting elements 28b and 29b adjust the angle β of the light emitted from an opposite side of the solid light emitting elements 28a and 29a.

FIG. 30B shows a structure in which both of the solid light emitting elements 28a and 29a are provided with the respective angle controllers. However, the solid light emitting element 29a does not necessarily have to be provided with an angle controller, but the solid light emitting element 28a that emits visible light may be provided with an angle controller.

The liquid crystal display device 45 includes a liquid crystal panel 42 and the backlight unit 46. It should be noted that, instead of the liquid crystal panel 42, the liquid crystal display device 45 may include, for example, another liquid crystal panel, such as the liquid crystal panel 6, 20 or 41. The liquid crystal panel 42 has a front surface side provided with a polarizing plate 131, and has a back surface side provided with a polarizing plate 132.

The backlight unit 46 is provided to the back surface side of the liquid crystal panel 42. The backlight unit 46 includes a light control element 47, the solid light emitting elements 28a, 28b, 29a and 29b, and a reflective plate 30. The backlight unit 46 may include, for example, a diffuser plate, a light guide plate, a polarization distributor film, and a retroreflection polarizing element, which, however, are omitted from FIG. 30A.

The light control element 47, which is formed such as of an acrylic resin, is an integrally molded object configured by an array of semicircular column lenses 25a and an array of triangular prisms 27a, which is located opposite to the array of the semicircular column lenses 25a.

In the light control element 47, the plurality of triangular prisms 27a have axes which are, in a plan view, tilted by an angle ϕ relative to the axes of the plurality of semicircular column lenses 26a.

Figure 31:
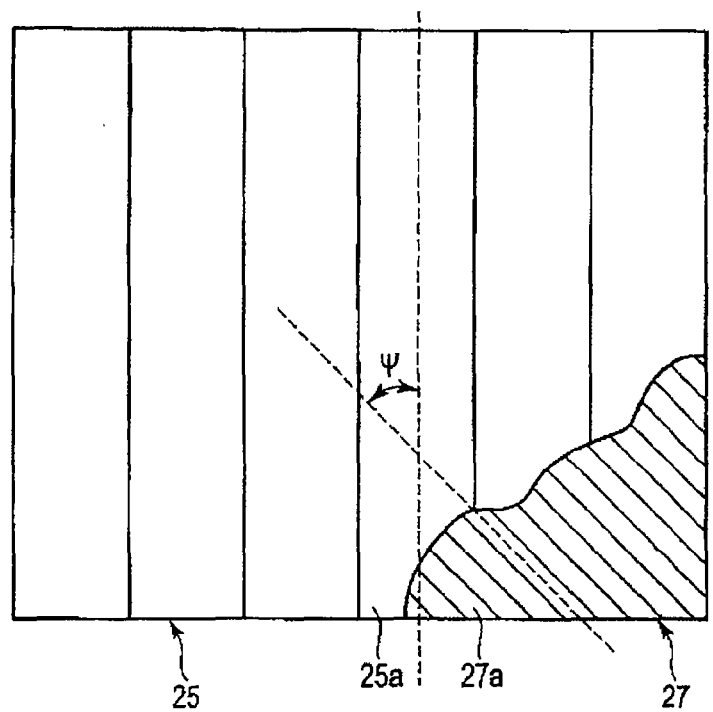
FIG. 31 is a plan view illustrating an example of a configuration of a light control element according to the sixth embodiment.

FIG. 31 is a plan view illustrating an example of a configuration of the light control element 47. FIG. 31 partially includes a cross-sectional view.

The plurality of semicircular column lenses 25a have longitudinal axes which are parallel to each other. The plurality of semicircular column lenses 25a have axes which are, in a plan view, perpendicular to a lateral direction and parallel to a longitudinal direction.

The plurality of triangular prisms 27a have longitudinal axes which are parallel to each other. The plurality of triangular prisms 27a have axes which are, in a plan view, tilted by the angle ϕ relative to the axes of the plurality of semicircular column lenses 25a. The angle ϕ may fall, for example, in a range of 3° to 42°. The angle ϕ may be larger than this range. The angle ϕ is an angle that does not interfere with the polarizing plates 131 and 132 or the optical axis of the liquid crystal orientation.

The light control element 47 has one surface on which the array of the semicircular column lenses 25a is formed, and the other surface on which the array of the triangular prisms 27a is formed. Both of the arrays are integrally formed with the light control element 47.

The plurality of triangular prisms 27a may have a pitch that is in a 1:1 relationship with the pitch of the plurality of semicircular column lenses 25a. The plurality of triangular prisms 27a may have a pitch finer than the pitch of the plurality of semicircular column lenses 25a.

In the present embodiment, the semicircular column lenses 25a each have a lateral width which can be an integral multiple of a lateral width that is a total of the widths of two sets of the green pixels GPa and GPb, the red pixel RP, and the blue pixel BP (four ½ width green pixels, one red pixel and one blue pixel). This enables liquid crystal display based on a multilocular method (multiple observers). When the pitch of the semicircular column lenses 25a is the same as that of the triangular prisms 27a, three-dimensional display based on a binocular method (single observer) is enabled.

It should be noted that each pixel, in a plan view, may be long in a longitudinal direction, or long in a lateral direction.

The semicircular column lenses 25a may have axes in a longitudinal direction which, in a plan view, are perpendicular to a longitudinal direction and parallel to a lateral direction.

Seventh Embodiment

The present embodiment exemplifies materials such as of the transparent resin and pigments used for the color filter substrates 1, 17, 21, 39 and 42 of the first to sixth embodiments described above.

<Transparent Resins>

The photosensitive coloring compositions used for forming the light-shielding layers BLK1 to BLK4, the red filters RF, the green filters GF and the blue filters BF contain a polyfunctional monomer, a photosensitive resin or a non-photosensitive resin, a polymerization initiator, and a solvent, in addition to a pigment dispersant (hereinafter referred to as paste). For example, the photosensitive organic resins, such as the photosensitive resins and the non-photosensitive resins, having high transparency as used in the present embodiment are collectively called transparent resins.

Transparent resins that can be used include a thermoplastic resin, a thermosetting resin, or a photosensitive resin. Thermoplastic resin that can be used include, for example, a butyral resin, styrene-maleic copolymer, chlorinated polyethylene, chlorinated polypropylene, polyvinyl chloride, vinyl chloride-vinyl acetate copolymer, polyvinyl acetate, polyurethane-based resin, polyester resin, acrylic resin, alkyd resin, polystyrene resin, polyamide resin, rubber-based resin, cyclorubber-based resin, celluloses, polybutadiene, polypropylene, or polyimide resin. Thermosetting resins that can be used include, for example, an epoxy resin, benzoguanamine resin, rosin-modified maleic resin, rosin-modified fumarate resin, melamine resin, urea resin, or phenol resin. The thermosetting resin may be prepared by reaction of a melamine resin and a compound that contains an isocyanate group.

<Alkali-Soluble Resins>

In forming the light-shielding films, such as the light-shielding layers BLK1 to BLK4, the transparent resin layers 9, 9a and 9b, and the color filter CF of the present embodiment, it is favorable to use a photosensitive resin composition that enables pattern forming based on photolithography. These transparent resins desirably have alkali solubility. Alkali-soluble resins that can be used include resins that contain a carboxyl group or a hydroxyl group, or include other resins. Alkali-soluble resins that can be used include, for example, an epoxy acrylate-based resin, novolac-based resin, polyvinyl phenol-based resin, acrylic resin, carboxyl group-containing epoxy resin, or carboxyl group-containing urethane resin. Of these, an epoxy acrylate-based resin, novolac-based resin, or acrylic resin is favorably used as the alkali-soluble resin, in particular, an epoxy acrylate-based resin, or novolac-based resin is preferable.

<Acrylate Resins>

As representatives of the transparent resins according to the present embodiment, the following acrylic resins can be exemplified.

The acrylic resins that can be used include copolymers obtained by using monomers, including: (meth)acrylic acid; alkyl(meth)acrylate, such as methyl(meth)acrylate, ethyl (meth)acrylate, propyl(meth)acrylate, butyl(meth)acrylate, t-butyl(meth)acrylate, pentyl(meth)acrylate, or lauryl(meth) acrylate; hydroxyl group-containing (meth)acrylate, such as hydroxyethyl(meth)acrylate, or hydroxypropyl(meth)acrylate; ether group-containing (meth)acrylate, such as ethoxyethyl(meth)acrylate, or glycidyl(meth)acrylate; alicyclic (meth)acrylate, such as cyclohexyl(meth)acrylate, isobornyl (meth)acrylate, dicyclopentenyl(meth)acrylate, and the like.

It should be noted that these exemplified monomers may be used singly or in combination of two or more.

Further, the acrylate resins may be prepared by using copolymers that contain a compound, such as styrene, cyclohexyl maleimide, or phenyl maleimide, which can be copolymerized with these monomers. Further, for example, a resin having photosensitivity may be used as an acrylate resin, which is prepared by reaction of a copolymer obtained by copolymerizing with a carboxylic acid having an ethylene unsaturated group, such as (meth)acryl acid, and a compound that contains an epoxy group, such as glycidyl methacrylate, and unsaturated double bonds. For example, a carboxylic acid-containing compound, such as (meth)acrylic acid, may be added to a polymer of an epoxy group-containing (meth)acrylate, such as glycidyl methacrylate, or to a copolymer of this polymer and another (meth)acrylate, to prepare a resin having photosensitivity, for use as an acryl resin.

For example, to provide thermal fluidity, a method of increasing flexibility of a coating film formed of a photosensitive resin composition is used. For example, the method that can be used to provide thermal fluidity includes a method of adding a resin that is obtained by copolymerizing an olefin with a photosensitive resin composition, or a method of adding plasticizer into a photosensitive resin composition. Thermal fluidity may be improved by reducing the molecular weight of a monomer and a curative added into a photosensitive resin composition. The molecular weight of a monomer and a curative added into a photosensitive resin composition is, for example, about 1,000 to 8,000 by which thermal fluidity can be improved. A photosensitive resin composition may contain a photosensitive resin which is prepared by modifying a copolymer that is obtained from radical polymerization of an ethylene unsaturated monomer, thereby improving thermal fluidity. Addition of a surface active agent to a photosensitive resin composition can improve thermal fluidity.

<Organic Pigments>

Red pigments that can be used include, for example, C.I. Pigment Red 7, 9, 14, 41, 48:1, 48:2, 48:3, 48:4, 81:1, 81:2, 81:3, 97, 122, 123, 146, 149, 168, 177, 178, 179, 180, 184, 185, 187, 192, 200, 202, 208, 210, 215, 216, 217, 220, 223, 224, 226, 227, 228, 240, 242, 246, 254, 255, 264, 272, 279, and the like.

Yellow pigments that can be used include, for example, C.I. Pigment Yellow 1, 2, 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 144, 146, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like.

Blue pigments that can be used include, for example, C.I. Pigment Blue 15, 15:1, 15:2, 15:3, 15:4, 15:6, 16, 22, 60, 64, 80, and the like. Among these pigments, C.I. Pigment Blue 15:6 is favorable.

Violet pigments that can be used include, for example, C.I. Pigment Violet 1, 19, 23, 27, 29, 30, 32, 37, 40, 42, 50, and the like. Among these pigments, C.I. Pigment Violet 23 is favorable.

Green pigments that can be used include, for example, C.I. Pigment Green 1, 2, 4, 7, 8, 10, 13, 14, 15, 17, 18, 19, 26, 36, 45, 48, 50, 51, 54, 55, 58, and the like. Among these pigments, C.I. Pigment Green 58 is favorable, which is a zinc halide phthalocyanine green pigment. The green pigment that can be used may be an aluminum halide phthalocyanine pigment.

<Light-Shielding Color Materials>

The light-shielding color materials contained in the light-shielding layers BLK1 and BLK2 are materials having light absorption properties in a visible light wavelength range and having a light-shielding function. In the present embodiment, the light-shielding color materials that can be used include, for example, organic pigments, inorganic pigments, dyes, and the like. The inorganic pigments that can be used include, for example, carbon black, titanium oxide, and the like. The dyes that can be used include, for example, azo-based dyes, anthraquinone-based dyes, phthalocyanine-based dyes, quinone-imine-based dyes, quinoline-based dyes, nitro-based dyes, carbonyl-based dyes, methane-based dyes, and the like. As the organic pigments, the organic pigments mentioned above, for example, may be applied. It should be noted that light-shielding components may be used singly or in combination of two or more at an appropriate ratio.

For example, the visible light wavelength range is from a light wavelength of about 400 nm to 700 nm.

In the foregoing embodiments, two kinds of coating films are used, one being a coating film having light-shielding effect and containing carbon as a main color material, and the other being a coating film having light-shielding effect in a visible range and permeability to infrared light, and containing organic pigments as a main color material. In the foregoing embodiments, there is a difference in the wavelength of transmittance rise between the transmission characteristics of the two light-shielding coating films. Use is made of the difference in the transmittance in a visible range, between the two light-shielding coating films. The wavelength range specifically used is from about 670 nm which is approximate to an upper limit of a long-wavelength side of red, to about 800 nm at which the transmittance of the blue pigment rises. For example, the wavelength, with which the transmittance of the light-shielding layers BLK1 and BLK2 rises, falls in the range of from the light wavelength of about 670 nm at which the transmittance of the red filters RF is retained at a high level, to the light wavelength of about 800 nm which corresponds to the rising portion where the transmittance of the blue filters BF becomes high.

<Example of Black Resist 1 Applied to the Light-Shielding Layer BLK1>

The following is a description on an example of preparing a black paste (dispersing element) used for the light-shielding layer BLK1.

A mixture of the following composition is uniformly agitated and mixed, followed by agitation by a bead mill, thereby preparing a black paste. The composition is specifically indicated in terms of mass below.

| | |
|---|---|
| Carbon pigment | 20 mass |
| Dispersant | 8.3 mass |
| Copper phthalocyanine derivative | 1.0 mass |
| Propylene glycol monomethylether acetate | 71 mass |

Using the above black paste, a mixture of the following composition is uniformly agitated and mixed, followed by filtering using a 5 μm filter, thereby preparing a black resist 1 applied to the light-shielding BLK1. In the present embodiment, a resist refers to a photosensitive coloring composition that contains carbon or organic pigments.

| | |
|---|---|
| Black paste | 25.2 mass |
| Acrylic resin solution | 18 mass |
| Dipentaerythritol penta and hexa-acrylate | 5.2 mass |
| Photo-polymerization initiator | 1.2 mass |
| Sensitizer | 0.3 mass |
| Leveling agent | 0.1 mass |
| Cyclohexane | 25 mass |
| Propylene glycol monomethylether acetate | 25 mass |

In the present embodiment, as well as in the foregoing embodiments, a main color material (pigment) in the black resist 1 or a color resist refers to a color material that occupies not less than 50% of the entire mass ratio (%) of the color materials (pigments) contained in the resist. For example, in the black resist 1, carbon occupies 100% of the color materials and thus carbon is a main color material.

Further, in order to adjust the hue or the reflected color of the black resist 1 that contains carbon as a main color material, organic pigments, such as of red, yellow and blue colors, may be added to the black resist 1 so as to occupy not more than 10% relative to the entire mass ratio.

<Example of Black Resist 2 Used for the Light-Shielding Layer BLK2>

The following is an example of mixing organic pigments used for the light-shielding layer BLK2.

C.I. Pigment Red 254 (hereinafter abbreviated as R254)
C.I. Pigment Yellow 139 (hereinafter abbreviated as Y139)
C.I. Pigment Violet 23 (hereinafter abbreviated as V23)

Of these three pigments, the pigment R254 may be omitted. Further, besides the three pigments, a very small amount of a different type of pigment, such as the above organic pigments, may be added for color (transmission wavelength) adjustment by a small amount of not more than 20%.

Figure 32:
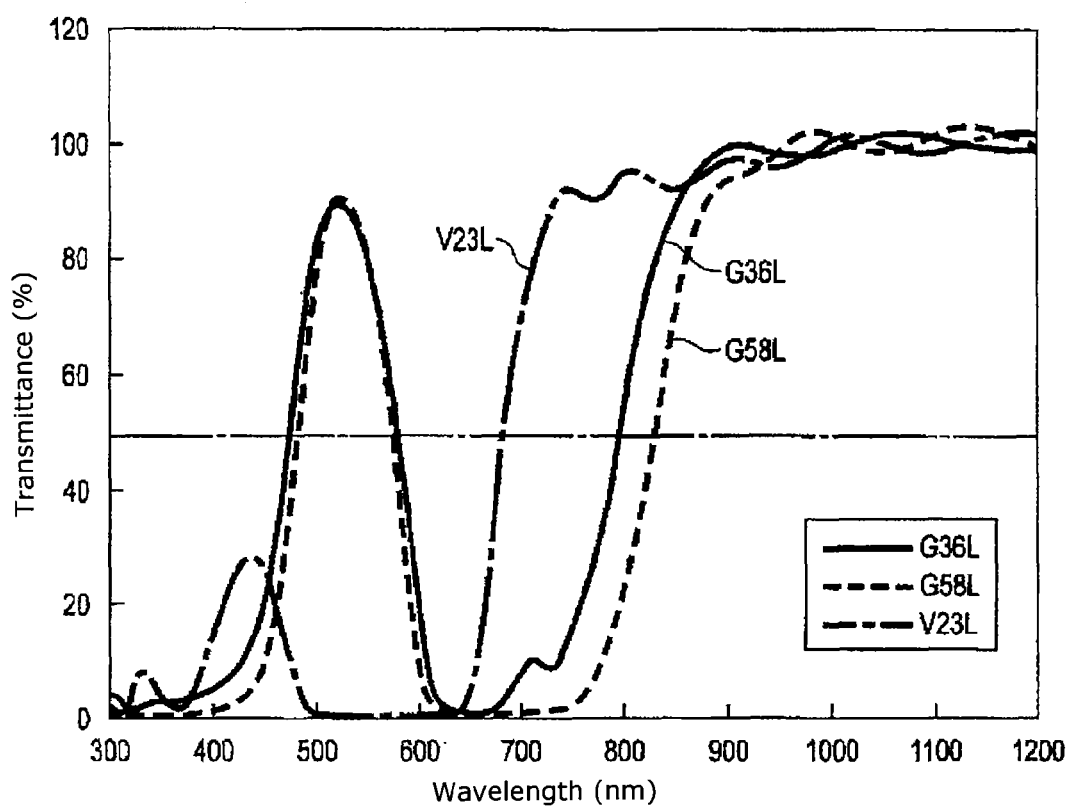
FIG. 32 is a graph illustrating an example of transmittance characteristics V23L of a coating film that contains a violet pigment V23, transmittance characteristics G36L of a coating film that contains C.I. Pigment Green 36 that is a typical green pigment, and transmittance characteristics G58L of a coating film that contains C.I. Pigment Green 58 that is a typical green pigment.

FIG. 32 is a graph illustrating an example of transmission characteristics V23L of a coating film that contains the violet pigment V23, transmission characteristics G36L of a coating film that contains a typical green pigment C.I. Pigment Green 36, and transmission characteristics G58L of a coating film that contains a typical green pigment C.I. Pigment Green 58.

For example, a small amount of green pigment, such as copper halide phthalocyanine, zinc halide phthalocyanine, or aluminum halide phthalocyanine, may be used to adjust the rise of spectroscopic characteristics in the vicinity of a light wavelength of 700 nm in the light-shielding layer BLK2 (adjust the shape of spectroscopic curve). Such adjustment in the rise of spectroscopic characteristics can permit the light-shielding layer BLK2 to have optimum transmission in the infrared range. Alternatively, a pigment, such as C.I. Pigment Blue 15:3, having a half-value wavelength of 760 nm in the infrared range may be added, by not more than 10%, to organic pigments used for the light-shielding layer BLK2 to shift the half-value wavelength of B2L to a long-wavelength side relative to 700 nm, as shown in FIG. 18. When a blue pigment, such as C.I. Pigment Blue 15:3, is added to organic pigments used for the light-shielding layer BLK2, the violet pigment V23 can be decreased by an amount equivalent to the addition. For example, the mass ratio of C.I. Pigment Violet 23 can be decreased to 30%.

It is desirable that the light-shielding layer BLK2 has a transmittance of not more than 5% in a visible range. Normally, a visible range corresponds to a light wavelength of about 400 nm to 700 nm. In order to set the half-value wavelength of the light-shielding layer BLK2 to the range of a light wavelength of about 670 nm to 750 nm, it is necessary that infrared transmittance characteristics rise from the vicinity of a light wavelength of about 660 nm, and the transmittance characteristics become high on a long-wavelength side. The light-shielding layer BLK2 may have a wavelength range of low transmittance ranging from a light wavelength of about 400 nm to 650 nm. It should be noted that, by increasing the amount of pigments contained in the light-shielding layer BLK2 or by increasing the thickness of the light-shielding layer BLK2, the transmittance of the light-shielding layer BLK2 can be quite easily reduced to not more than 5%, within a range of a light wavelength of about 400 nm to 650 nm. Similarly, the wavelength position of a half-value wavelength can be easily adjusted on the basis such as of an amount of pigment, a composition ratio of a violet pigment, green pigment, yellow pigment and red pigment, which are described later, and a thickness of the light-shielding layer BLK2. The green pigment applied to the light-shielding layer BLK2 can include various green pigments described later. To set the half-value wavelength of the light-shielding layer BLK2 to the range of the light wavelength of 670 nm to 750 nm, it is favorable to use a green pigment whose rise of infrared transmittance (e.g., half-value wavelength) is within a range of a light wavelength of 700 nm to 800 nm. The adjustment for setting the half-value wavelength to the range of the light wavelength of 670 nm to 750 nm is realized mainly based on a violet pigment and a green pigment. A blue pigment may be added for the adjustment of spectroscopic characteristics of the light-shielding layer BLK2.

The mass ratio (%) of R254 may, for example, fall within a range of 0 to 15%.

The mass ratio (%) of Y139 may, for example, fall within a range of 25 to 50%.

The mass ratio (%) of V23 may, for example, fall within a range of 50 to 75%.

When the light-shielding layer BLK2 has a standard thickness of, for example, about 2 μm, the violet pigment of V23 is added with the value ranging from 50 to 75%. Thus, the light-shielding layer BLK2 will have the half-value wavelength ranging from the light wavelength of 670 nm to 750 nm. Addition of a yellow pigment with the a value ranging from 25 to 50% and a further addition of a red pigment ranging from 0 to 15% can sufficiently reduce the transmittance in a light wavelength of 400 nm to 660 nm of the light-shielding layer BLK2. Removing an uplift from the transmittance of the light-shielding layer BLK2 in the range of the light wavelength of 400 nm to 660 nm (uplift of spectra from a 0% baseline), color separation can be performed with precision by subtracting the detection data of the optical sensor 34b from the detection data of the optical sensor 34a.

Prior to the formation of a color resist (coloring composition) on the basis of these pigments, the pigments are dispersed into a resin or a solution to thereby form a pigment paste (fluid dispersion). For example, to disperse a pigment Y139 element into a resin or a solution, the following materials are mixed with 7 mass of the pigment R139.

| | |
|---|---|
| Acrylic resin solution (solid content of 20%) | 40 mass |
| Dispersant | 0.5 mass |
| Cyclohexane | 23.0 mass |

It should be noted that other pigments, such as V23 and R254, may also be dispersed into the same resin or a solution to form a black pigment-dispersed paste.

The following exemplifies a composition ratio for forming a black resist on the basis of the pigment-dispersed paste described above.

| | |
|---|---|
| Y139 paste | 14.70 mass |
| V23 paste | 20.60 mass |
| Acrylic resin solution | 14.00 mass |
| Acrylic monomer | 4.15 mass |
| Initiator | 0.7 mass |
| Sensitizer | 0.4 mass |
| Cyclohexane | 27.00 mass |
| PGMAC | 10.89 mass |

Based on the above composition ratio, a black resist 2 is formed for use in the light-shielding layer BLK2.

The black resist 2 that is a main color material of the pigments used for the formation of the light-shielding layer BLK2 is the violet pigment V23 that occupies about 58% of the entire mass ratio. Many of organic pigments have a high transmittance in a long-wavelength range relative to a light wavelength of about 800 nm. The yellow pigment Y139 is organic pigments also having a high transmittance in the long-wavelength range relative to the light wavelength of 800 nm.

For example, the main color material of the black resist contained in the light-shielding layer BLK2 may be organic pigments by 100%. For example, the black resist 2 having organic pigments as a main color material may additionally contain carbon of not more than 40% relative to the entire mass to adjust light-shielding effect.

FIG. 33 is a graph illustrating an example of transmittance characteristics B2La, B2Lb and B2Lc of the light-shielding layer BLK2 whose half-value wavelength has been adjusted.

For example, the transmittance characteristics B2Lc of the light-shielding layer BLK2 are obtained when a blue pigment is contained.

<Example of Red Resist RR Used for Color Filter Substrate 1, 17, 21, 39 or 42>

The following is a description on an example of preparing a red paste (fluid dispersion).

A mixture of the following composition is uniformly agitated and mixed, followed by dispersion for 5 hours by a sand mill using glass beads each having a diameter of about 1 mm, which is further followed by filtering using a filter of about 5 μm, thereby preparing a red paste.

| | |
|---|---|
| Red pigment C.I. Pigment Red 254 | 8 mass |
| Red pigment C.I. Pigment Red 177 | 10 mass |
| Yellow pigment C.I. Pigment Yellow 150 | 2 mass |
| Dispersant | 2 mass |
| Acrylic varnish (solid content of 20 mass %) | 108 mass |

<Preparation of Red Resist RR>

After preparing the red paste, a mixture of the following composition is uniformly agitated and mixed, followed by filtering using a filter of about 5 μm, thereby preparing a red resist RR.

| | |
|---|---|
| Red paste | 42 mass |
| Acrylic resin solution | 18 mass |
| Dipentaerythritol penta and hexa-acrylate | 4.5 mass |
| Photo-polymerization initiator | 1.2 mass |
| Sensitizer | 2.0 mass |
| Cychlohexanone | 32.3 mass |

<Example of Green Resist GR Used for Color Filter Substrate 1, 17, 21, 39 or 42>
<Preparation of Green Paste>

A mixture of the following composition is uniformly agitated and mixed, followed by dispersion for 5 hours by a sand mill using glass beads each having a diameter of about 1 mm, which is further followed by filtering using a filter of about 5 μm, thereby preparing a green paste (fluid dispersion).

| | |
|---|---|
| Green pigment C.I. Pigment Green 58 | 10.4 mass |
| Yellow pigment C.I. Pigment Yellow 150 | 9.6 mass |
| Dispersant | 2 mass |
| Acrylic varnish (solid content of 20 mass %) | 66 mass |

<Preparation of Green Resist GR>

After preparing the green paste, a mixture of the following composition is uniformly agitated and mixed, followed by filtering using a filter of about 5 μm, thereby preparing a green resist GR.

| | |
|---|---|
| Green paste | 46 mass |
| Acrylic resin solution | 8 mass |
| Dipentaerythritol penta and hexa-acrylate | 4 mass |
| Photo-polymerization initiator | 1.2 mass |
| Photo-polymerization initiator | 3.5 mass |
| Sensitizer | 1.5 mass |
| Cychlohexanone | 5.8 mass |
| Propylene glycol monomethylether acetate | 30 mass |

For example, the green resist RG may be used with an addition of a fluorine-based surfactant by 0.08 mass.

<Example of Blue Resist BR Used for Color Filter Substrate 1, 17, 21, 39 or 42>
<Preparation of Fluid Dispersion of Blue Paste 1>

A mixture of the following composition is uniformly agitated and mixed, followed by dispersion for 5 hours by a sand mill using glass beads each having a diameter of about 1 mm, which is further followed by filtering using a filter of about 5 μm, thereby preparing a blue paste 1 (fluid dispersion of blue pigment).

| | |
|---|---|
| Blue pigment C.I. Pigment Blue 15:6 | 52 mass |
| Dispersant | 6 mass |
| Acrylic varnish (solid content of 20 mass %) | 200 mass |

<Preparation of Blue Paste 2>

A mixture of the following composition is dispersed for 5 hours by a mill, followed by filtering using a filter of about 5 μm, thereby preparing an intermediate blue paste (fluid dispersion).

| | |
|---|---|
| Blue pigment C.I. Pigment Blue 15:6 | 49.4 mass |
| Dispersant | 6 mass |
| Acrylic varnish (solid content of 20 mass %) | 200 mass |

The following violet dye powder is added to the intermediate blue paste, followed by agitation, thereby preparing a blue paste 2.

| | |
|---|---|
| Violet dye | 2.6 mass |

<Preparation of Blue Resist BR>

After preparing the blue paste, a mixture of the following composition is uniformly agitated and mixed, followed by filtering using a filter of about 5 μm, thereby preparing a blue resist BR.

| | |
|---|---|
| Blue paste | 16.5 mass |
| Acryl resin solution | 25.3 mass |
| Dipentaerythritol penta and hexa-acrylate | 1.8 mass |
| Photo-polymerization initiator | 1.2 mass |
| Sensitizer | 0.2 mass |
| Cychlohexanone | 25 mass |
| Propylene glycol monomethylether acetate | 30 mass |

<Preparation of Color Filter Substrate 1, 17, 21, 39 or 42>

Combining the three colors of the red resist RR, the green resist GR and the blue resist BR, the color filter substrate 1, 17, 21, 39 or 42, for example, is prepared.

The foregoing embodiments may be applied by being variously modified with a scope not changing the spirit of the present invention. The foregoing embodiments may be used by being freely combined.

The present invention has as its object to provide a color filter substrate that realizes high display precision and smoothness, a liquid crystal display device, and a method for manufacturing a color filter substrate.

A color filter substrate according to a first aspect of the present invention includes: a transparent substrate having an effective display region and a frame region enclosing the effective display region; and a first color filter, a second color filter and a third color filter formed of linear patterns on the transparent substrate such that individual colors are different from each other and adjacent to each other with no gap therebetween, wherein: the first color filter is arranged so as to isolate the second color filter from the third color filter; the first color filter has a line width which is substantially ½ of that of the second color filter and the third color filter; and the first color filter, the second color filter and the third color filter have no formation of projection in a thickness direction, which is attributed to an overlap of at least two color filters of different colors.

In the color filter substrate according to the first aspect of the present invention, it is favorable that the first color filter is a red filter or a green filter.

In the color filter substrate according to the first aspect of the present invention, it is favorable that the color filter substrate further comprises a light-shielding layer that is formed on the first color filter, the second color filter and the third color filter; and the light-shielding layer contains organic pigments as a main material of the light-shielding color materials and has visible range light-shielding effect and infrared transmission.

In the color filter substrate according to the first aspect of the present invention, it is favorable that a mass ratio of the organic pigments contained in the light-shielding layer is 50 to 75% in respect of a violet pigment, 25 to 50% in respect of a yellow pigment, or not more than 30% in respect of a red pigment, relative to an entire mass for the optical pigment.

In the color filter substrate according to the first aspect of the present invention, it is favorable that a mass ratio of the organic pigments contained in the light-shielding layer is 30 to 75% in respect of a violet pigment, 25 to 50% in respect of a yellow pigment, or not more than 30% in respect of a red pigment, relative to an entire mass for the optical pigments, and a green pigment or a blue pigment is added to the light-shielding layer by a mass of not more than 10%.

In the color filter substrate according to the first aspect of the present invention, it is favorable that the frame region is formed therein with a light-shielding layer that contains carbon as a main material of light-shielding color materials.

In the color filter substrate according to the first aspect of the present invention, it is favorable that the frame region is formed therein with a first light-shielding layer that contains carbon as a main material of light-shielding color materials and a second light-shielding layer that contains organic pigments as a main material of light-shielding color materials.

In the color filter substrate according to the first aspect of the present invention, it is favorable that the effective display region is formed therein with a color filter having a thickness which is substantially the same as the thickness of the light-shielding layer formed in the frame region.

In the color filter substrate according to the first aspect of the present invention, it is favorable that the linear patterns of the first color filter, the second color filter and the third color filter are a plurality of V shapes connected in a longitudinal direction in a plan view.

A liquid crystal display device according to a second aspect of the present invention includes: a color filter substrate according to the first aspect; an array substrate that is opposed to the color filter substrate via a liquid crystal layer; and a backlight unit provided at a position opposite to a position where the liquid crystal layer of the array substrate is arranged, wherein: the linear patterns of the first color filter, the second color filter and the third color filter are formed in the effective display region and the frame region; and liquid crystal molecules have long axes that are vertical to a substrate plane in a state where no liquid crystal drive voltage is applied.

A liquid crystal display device according to a third aspect of the present invention includes: a color filter substrate according to the first aspect; an array substrate that is opposed to the color filter substrate via a liquid crystal layer; and a backlight unit provided at a position opposite to a position where the liquid crystal layer of the array substrate is arranged, wherein: a first pixel corresponding to the first color filter includes one liquid crystal drive element; a second pixel corresponding to the second color filter includes two liquid crystal drive elements; and a third pixel corresponding to the third color filter includes two liquid crystal drive elements.

It is favorable that the liquid crystal display device according to the third aspect of the present invention further includes a control unit that controls or synchronizes light emission timing of the backlight unit and application timing of liquid crystal drive voltage, and performs three-dimensional display.

It is favorable that the liquid crystal display device according to the third aspect of the present invention further includes an angle controller that controls an angle of light emitted from the backlight unit, and a light control element that adjusts an emission angle of emission light emitted from a liquid crystal screen.

In the liquid crystal display device according to the third aspect of the present invention, it is favorable that the liquid crystal drive element is a thin-film transistor; and the thin-film transistor includes a channel layer that contains two or more metal oxides from among gallium, indium, zinc, tin, hafnium, yttrium and germanium oxides.

A liquid crystal display device according to a fourth aspect of the present invention includes: a color filter substrate according to the first aspect; an array substrate that is opposed to the color filter substrate via a liquid crystal layer; and a backlight unit provided at a position opposite to a position where the liquid crystal layer of the array substrate is arranged, wherein: the array substrate includes a first optical sensor and a second optical sensor; the first optical sensor detects light in a direction perpendicular to a substrate plane, the light being passed by way of any of the first color filter, the second color filter and the third color filter but not by way of the light-shielding layer; the second optical sensor detects light in a direction perpendicular to the substrate plane, the light being passed by way of the color filter and the light shielding layer; and the device further comprises a control unit that subtracts detection data of the second optical sensor from detection data of the first optical sensor.

In the liquid crystal display device according to the fourth aspect of the present invention, it is favorable that the backlight unit includes: a first solid light emitting element that emits visible light; and a second solid light emitting element that emits infrared light for touch sensing; and the control unit synchronously controls light emission timing of the second solid light emitting element and light reception timing of the second optical sensor.

In the liquid crystal display device according to the fourth aspect of the present invention, it is favorable that the infrared light has a wavelength within a range of 800 nm to 1,000 nm.

A method for manufacturing a color filter substrate according to a fifth aspect of the present invention includes: forming a first resist layer on a transparent substrate; patterning the first resist layer to form a first color filter, and a first filter opening and a second filter opening enclosed by the first color filter; forming a second resist layer on the transparent substrate so as to cover the first color filter, the first filter opening and the second filter opening; patterning the second resist layer to form the second resist layer in the first filter opening and expose the second filter opening; performing heat treatment to fluidize the second resist layer in the first filter opening, and curing the second resist layer to form a second color filter so as not to form a projection due to an overlap of filters and so as to be adjacent to the first color filter without forming any gap; forming a third resist layer on the transparent substrate to cover the first color filter, the second color filter and the second filter opening; patterning the third resist layer to form the third resist layer in the second filter opening; and performing heat treatment to fluidize the third resist layer in the second opening, and curing the third resist layer to form a third color filter so as not to form a projection due to an overlap of filters and so as to be adjacent to the first color filter and the second color filter without forming any gap.

It is favorable that the method for manufacturing a color filter substrate according to the fifth aspect of the present invention includes: forming alignment marks in a frame region of the transparent substrate using a material that contains carbon as a main material of light-shielding color materials; forming a second light shielding layer in the frame region; and after forming the second light-shielding layer, aligning a photomask used for the patterning with the transparent substrate, by radiating infrared light to the alignment marks and detecting positions of the alignment marks.

Modes of the present invention are able to provide a color filter substrate that realizes high display precision and smoothness, a liquid crystal display device, and a method for manufacturing a color filter substrate.

DESCRIPTION OF REFERENCE NUMERALS 1, 17, 21, 39, 42 . . . color filter substrate, 2 . . . effective display region, 3 . . . frame region, 5 . . . alignment mark, GF . . . green filter, RF . . . red filter, BF . . . blue filter, 6, 20, 41 . . . liquid crystal panel, 7, 14 . . . transparent substrate, 8 . . . color filter layer, CF . . . color filter, 9, 9a, 9b . . . transparent resin layer, 10, 10a, 10b . . . counter electrode, 11, 43 . . . array substrate, 12, 44 . . . liquid crystal layer, 131, 132 . . . polarizing plate, 15a to 15c . . . insulating layer, GR . . . green resist, RR . . . red resist, BR . . . blue resist, BM . . . black matrix, BLK1, BLK2 . . . light-shielding layer, 22, 22a, 22b . . . common electrode, 23, 23a, 23b . . . pixel electrode, 24, 37, 45 . . . liquid crystal display device, 25, 27, 47 . . . light control element, 26, 40, 46 . . . backlight unit, 28a, 28b, 29a, 29b . . . solid light emitting element, 31 . . . control unit, 34a, 34b . . . optical sensor, 33 . . . liquid crystal drive element.

Obviously, numerous modifications and variations of the present invention are possible in light of the above teachings. It is therefore to be understood that within the scope of the appended claims, the invention may be practiced otherwise than as specifically described herein.

What is claimed is:

1. A color filter substrate, comprising:
a transparent substrate having an effective display region and a frame region enclosing the effective display region;
a plurality of color filters including a first color filter, a second color filter and a third color filter having different colors, the color filters being formed in linear patterns on the transparent substrate such that adjacent two of the first, second, and third color filters are formed without a gap therebetween;
a light-shielding layer formed on the first color filter, the second color filter and the third color filter, the light-shielding layer including an organic pigment as a main material of a light-shielding color material and being capable of shielding a visible light and transmitting an infrared light;
a second light-shielding layer formed including carbon as the main material of the light-shielding color material; and
a third light-shielding layer formed including the organic pigment as the main material of the light-shielding color material,
wherein the second light-shielding layer including carbon and the third light shielding color layer including the organic pigment are formed in the frame region,
wherein the first color filter is positioned such that the second color filter is separated from the third color filter,
the first color filter has a line width which is substantially ½ of a line width of the second color filter and a line width of the third color filter, and
the first color filter, the second color filter and the third color filter have no projection formed by an overlap of at least two color filters of different colors.

2. The color filter substrate according to claim 1, wherein the first color filter is a red filter or a green filter.

3. The color filter substrate according to claim 1, wherein the light-shielding layer includes a violet pigment in an amount of 50 to 75 mass %, a yellow pigment in an amount of 25 to 50 mass %, and a red pigment in an amount of not more than 30 mass %, relative to an entire mass of the organic pigment.

4. The color filter substrate according to claim 1, wherein the light-shielding layer includes a violet pigment in an amount of 30 to 75 mass %, a yellow pigment in an amount of 25 to 50 mass %, a red pigment in an amount of not more than 30 mass %, and a green pigment or a blue pigment in an amount of not more than 10 mass %, relative to an entire mass of the organic pigment.

5. The color filter substrate according to claim 1, wherein a color filter formed in the frame region has a thickness which is substantially the same as the thickness of a combination of the second and third light-shielding layers.

6. The color filter substrate according to claim 1, wherein the linear patterns of the first color filter, the second color filter and the third color filter include a plurality of V shapes connected in a longitudinal direction in a plan view.

7. A liquid crystal display device, comprising:
the color filter substrate according to claim 1;
an array substrate positioned over the color filter substrate;

a liquid crystal layer including a liquid crystal molecule and formed between the color filter substrate and the array substrate; and a backlight unit positioned over the array substrate on an opposite side of the liquid crystal layer, wherein the linear patterns of the first color filter, the second color filter and the third color filter are formed in the effective display region and the frame region, and the liquid crystal layer is formed such that the liquid crystal molecule has a long axis vertical to a substrate plane when a liquid crystal drive voltage is not applied.

8. A liquid crystal display device, comprising:

the color filter substrate according to claim 1;

an array substrate positioned over the color filter substrate;

a liquid crystal layer including a liquid crystal molecule and formed between the color filter substrate and the array substrate; and a backlight unit positioned over the array substrate on an opposite side of the liquid crystal layer, wherein a first pixel corresponding to the first color filter includes one liquid crystal drive element, a second pixel corresponding to the second color filter includes two liquid crystal drive elements, and a third pixel corresponding to the third color filter includes two liquid crystal drive elements.

9. The liquid crystal display device according to claim 8, further comprising:

a control unit configured to synchronize light emission timing of the backlight unit and application timing of liquid crystal drive voltage for a three-dimensional display.

10. The liquid crystal display device according to claim 8, further comprising:

an angle controller configured to control an angle of light emitted from the backlight unit; and a light control element configured to adjust an emission angle of emission light emitted from a liquid crystal screen.

11. The liquid crystal display device according to claim 8, wherein the liquid crystal drive element is a thin-film transistor, and the thin-film transistor includes a channel layer that includes oxides of two or more metals selected from the group consisting of gallium, indium, zinc, tin, hafnium, yttrium and germanium.

12. A liquid crystal display device, comprising:

the color filter substrate according to claim 1;

an array substrate positioned over the color filter substrate;

a liquid crystal layer including a liquid crystal molecule and formed between the color filter substrate and the array substrate;

a backlight unit positioned over the array substrate on an opposite side of the liquid crystal layer; and a control unit, wherein the array substrate includes a first optical sensor and a second optical sensor, the first optical sensor is configured to detect light which is transmitted through one of the first color filter, the second color filter and the third color filter and not transmitted through the light-shielding layer in a direction perpendicular to a substrate plane, the second optical sensor configured to detect light which is transmitted through one of the color filters and through the light shielding layer in a direction perpendicular to the substrate plane, and the control unit is configured to subtract data detected by the second optical sensor from data detected by the first optical sensor.

13. The liquid crystal display device according to claim 12, wherein the backlight unit includes a first solid light emitting element configured to emit a visible light, and a second solid light emitting element configured to emit an infrared light, and the control unit is configured to synchronously control light emission timing of the second solid light emitting element and light reception timing of the second optical sensor.

14. The liquid crystal display device according to claim 13, wherein the infrared light has a wavelength in a range of from 800 nm to 1,000 nm.

* * * * *